(12) United States Patent
Duan et al.

(10) Patent No.: US 12,262,636 B2
(45) Date of Patent: Mar. 25, 2025

(54) ORGANIC ELECTROLUMINESCENT DEVICES AND PREPARATION METHODS THEREOF

(71) Applicants: Kunshan Go-Visionox Opto-Electronics Co., Ltd., Kunshan (CN); TSINGHUA UNIVERSITY, Beijing (CN)

(72) Inventors: Lian Duan, Kunshan (CN); Xiaozeng Song, Kunshan (CN); Dongdong Zhang, Kunshan (CN); Jinbei Wei, Kunshan (CN)

(73) Assignees: KUNSHAN GO-VISIONOX OPTO-ELECTRONICS CO., LTD., Kunshan (CN); TSINGHUA UNIVERSITY, Beijing (CN)

( * ) Notice: Subject to any disclaimer, the term of this patent is extended or adjusted under 35 U.S.C. 154(b) by 1053 days.

(21) Appl. No.: 16/680,518

(22) Filed: Nov. 12, 2019

(65) Prior Publication Data

US 2020/0083460 A1 Mar. 12, 2020

Related U.S. Application Data

(63) Continuation of application No. PCT/CN2018/089396, filed on May 31, 2018.

(30) Foreign Application Priority Data

Dec. 29, 2017 (CN) .......................... 201711479570.3

(51) Int. Cl.
*H10K 85/60* (2023.01)
*H10K 50/11* (2023.01)
(Continued)

(52) U.S. Cl.
CPC ....... *H10K 85/6572* (2023.02); *H10K 85/322* (2023.02); *H10K 85/40* (2023.02);
(Continued)

(58) Field of Classification Search
CPC ............. H01L 51/5012; H01L 51/0072; H01L 51/0054; H01L 51/0055; H01L 51/0056;
(Continued)

(56) References Cited

U.S. PATENT DOCUMENTS 5,759,444 A * 6/1998 Enokida ................. C09K 11/06
252/301.16
2007/0241669 A1* 10/2007 Liu ......................... C09K 11/06
313/504
(Continued)

FOREIGN PATENT DOCUMENTS

CN 104835916 A 8/2015
CN 105261706 A 1/2016
(Continued)

OTHER PUBLICATIONS

Pan J, machine translation of WO-2016086887-A1 (2016) pp. 1-24. (Year: 2016).*
(Continued)

*Primary Examiner* — Dylan C Kershner
(74) *Attorney, Agent, or Firm* — KILPATRICK TOWNSEND & STOCKTON LLP

(57) ABSTRACT

The present disclosure discloses an organic electroluminescent device and a preparation method thereof. The device includes a light-emitting layer, the light-emitting layer includes a host material, an auxiliary host material and a fluorescent dye; the host material is an exciplex prepared by mixing an electron donor material and an electron acceptor material, the auxiliary host material is a thermally activated delayed fluorescence material, a singlet energy level and a
(Continued)

triplet energy level of the exciplex are higher than the single energy level and triplet energy level of the auxiliary host material. The above organic electroluminescent device can promote the reverse intersystem crossing of the host material and the auxiliary host material from the triplet excitons to the singlet excitons, enhance the Foster energy transfer, reduce the triplet exciton quenching, therefore the efficiency roll-off of the device is small and the external quantum efficiency is high.

19 Claims, 5 Drawing Sheets

(51) Int. Cl.
H10K 50/15 (2023.01)
H10K 50/16 (2023.01)
H10K 50/81 (2023.01)
H10K 50/82 (2023.01)
H10K 85/30 (2023.01)
H10K 85/40 (2023.01)
H10K 101/10 (2023.01)

(52) U.S. Cl.
CPC ......... *H10K 85/622* (2023.02); *H10K 85/623* (2023.02); *H10K 85/624* (2023.02); *H10K 85/633* (2023.02); *H10K 85/653* (2023.02); *H10K 85/654* (2023.02); *H10K 50/11* (2023.02); *H10K 50/15* (2023.02); *H10K 50/16* (2023.02); *H10K 50/81* (2023.02); *H10K 50/82* (2023.02); *H10K 2101/10* (2023.02)

(58) Field of Classification Search
CPC ............... H01L 51/006; H01L 51/0065; H01L 51/0067; H01L 51/008; H01L 51/0094; H10K 50/121; H10K 85/40; H10K 85/6572; H10K 85/658; H10K 85/622; H10K 85/623; H10K 85/624; H10K 85/633; H10K 85/653; H10K 85/654

See application file for complete search history.

(56) References Cited

U.S. PATENT DOCUMENTS

| | | | |
|---|---|---|---|
| 2007/0278937 A1* | 12/2007 | Forrest | H10K 50/125 313/504 |
| 2008/0074034 A1* | 3/2008 | Jou | H10K 50/11 252/301.16 |
| 2009/0211640 A1* | 8/2009 | Lee | B82Y 10/00 313/504 |
| 2015/0141642 A1* | 5/2015 | Adachi | H10K 85/6572 548/440 |
| 2015/0214489 A1* | 7/2015 | Parham | C07D 403/10 252/301.16 |
| 2016/0164020 A1* | 6/2016 | Kim | C09K 11/06 257/40 |
| 2016/0185765 A1* | 6/2016 | Sakai | H10K 85/324 544/102 |
| 2017/0084844 A1 | 3/2017 | Parham et al. | |
| 2017/0194585 A1* | 7/2017 | Yan | H01L 51/5004 |
| 2017/0256733 A1* | 9/2017 | Tsukamoto | H10K 50/00 |
| 2017/0320855 A1 | 11/2017 | Wong et al. | |
| 2018/0061901 A1 | 3/2018 | Zhang | |
| 2019/0019971 A1 | 1/2019 | Xie et al. | |

FOREIGN PATENT DOCUMENTS

| | | | | |
|---|---|---|---|---|
| CN | 105895811 A | | 8/2016 | |
| CN | 106103648 A | | 11/2016 | |
| CN | 106206958 A | | 12/2016 | |
| CN | 106206997 A | | 12/2016 | |
| CN | 106920884 A | | 7/2017 | |
| CN | 106972111 A | | 7/2017 | |
| CN | 107492596 A | | 12/2017 | |
| JP | 08003547 A | * | 1/1996 | |
| JP | 2010215759 A | * | 9/2010 | |
| JP | 2016092320 A | | 5/2016 | |
| TW | 201600583 A | | 1/2016 | |
| WO | WO-2006117914 A1 | * | 11/2006 | B82Y 20/00 |
| WO | WO-2016086887 A1 | * | 6/2016 | H01L 51/52 |

OTHER PUBLICATIONS

Nakanotani et al., "High-efficiency organic light-emitting diodes with fluorescent emitters" Nature Communications, vol. 5, Article No. 4016 (2014) pp. 1-7. (Year: 2014).*
Ikemizu D et al., machine translation of JP-2010215759-A (2010) pp. 1-163. (Year: 2010).*
Ando H et al., machine translation of WO-2006117914-A1 (2006) pp. 1-34. (Year: 2006).*
Himeshima Y et al., machine translation of JP-08003547-A (1996) pp. 1-10. (Year: 1996).*
Tanaka et al., "Efficient green thermally activated delayed fluorescence (TADF) from a phenoxazine-triphenyltriazine (PXZ-TRZ) derivative" Chemical Communications, vol. 48 (2012) pp. 11392-11394. (Year: 2012).*
International Search Report mailed on Sep. 28, 2018 in the corresponding international application (application No. PCT/CN2018/089396).
Bo Zhao et al., "Highly efficient red OLEDs using DCJTB as the dopant and delayed fluorescent exciplex as the host", received on Jan. 16, 2019, 8 pages.
Wook Song et al., "High-power-efficiency hybrid white organic light-emitting diodes with a single emitting layer doped with blue delayed fluorescent and yellow phosphorescent emitters", received on Apr. 24, 2015, 6 pages.
TW First Office Action with search report issued on Jan. 14, 2019 in the corresponding TW application (application No. 107124196).
CN First Office Action issued on Oct. 25, 2019 in the corresponding CN application (application No. 201711479570.3).
Bo Zhao et al. Highly efficient red OLEDs using DCJTB as the dopant and delayed fluorescent exciplex as the host.
Wook Song et al. High-power-efficiency hybrid white organic light-emitting diodes with a single emitting layer doped with blue delayed fluorescent and yellow phosphorescent emitters.
Office Action of CN Patent Application No. 201711479570.3.

* cited by examiner

ORGANIC ELECTROLUMINESCENT DEVICES AND PREPARATION METHODS THEREOF

CROSS-REFERENCES TO RELATED APPLICATIONS

This application is a continuation application for International Application PCT/CN2018/089396, filed on May 31, 2018, which claims the priority benefit of Chinese Patent Application No. 201711479570.3, titled "ORGANIC ELECTROLUMINESCENT DEVICES AND PREPARATION METHODS THEREOF" and filed on Dec. 29, 2017. The entireties of both applications are incorporated by reference herein for all purposes.

TECHNICAL FIELD

The present disclosure relates to display technologies.

BACKGROUND

As a new type of flat panel display technology, organic light emitting diode (OLED) devices have a sandwich structure. That is, an organic light-emitting layer is sandwiched between the electrodes on both sides. The holes and the electrons are injected from the anode and the cathode, respectively, and transported in the organic light-emitting layer, then combine to form excitons after encounter. The excitons return to the ground state and emit light by radiative transition of the fluorescent or phosphorescent process. Due to its advantages such as wide viewing angle, ultra-thin, fast response, high luminous efficiency, and flexible display etc., OLED has great application prospects in the field of display and illumination, and has attracted more and more attention.

Under electrical excitation, excitons are generally composed of 25% singlet excitons and 75% triplet excitons. For fluorescent dyes, only 25% of singlet excitons can be utilized due to electron spin inhibition, the remaining 75% of the triplet excitons are lost due to the non-radiative transition, therefore the internal quantum efficiency of the organic electroluminescent device of the general fluorescent material does not exceed 25%. In 2012, Adachi et al. of Kyushu University in Japan reported on the highly efficient and metal-free Thermally Activated Delayed Fluorescence (TADF) materials and devices in Nature.

SUMMARY

Therefore, the technical problem to be solved by the present disclosure is to overcome the high driving voltage caused by the wide band gap of the host material and low exciton utilization efficiency caused by the Dexter energy transfer from the host material molecules to the luminescent dye molecules of the organic electroluminescent device in the prior art.

To this end, the present disclosure provides an organic electroluminescent device including a light-emitting layer, the material of the light-emitting layer includes a host material, an auxiliary host material and a fluorescent dye;

the host material is an exciplex prepared by mixing an electron donor material and an electron acceptor material, the auxiliary host material is a thermally activated delayed fluorescence material, and a triplet energy level of the exciplex is higher than a singlet energy level of the auxiliary host material.

Optionally, in the organic electroluminescent device, a triplet energy level of the auxiliary host material is higher than a singlet energy level of the fluorescent dye.

Optionally, in the organic electroluminescent device, a triplet energy level of the electron donor material and a triplet energy level of the electron acceptor material are respectively higher than a triplet energy level of the host material.

Optionally, in the organic electroluminescent device, a mass ratio of the electron donor material to the electron acceptor material is 1:9 to 9:1.

Optionally, in the organic electroluminescent device, a doping ratio of the auxiliary host material (the ratio of the mass of the auxiliary host material to the total mass of the light-emitting layer) is 5 wt % to 80 wt %, and a doping ratio of the fluorescent dye (the ratio of the mass of the fluorescent dye to the total mass of the light-emitting layer) is 0.1 wt % to 10 wt %.

Optionally, in the organic electroluminescent device, the energy level difference between a singlet energy level and a triplet energy level of the host material is less than 0.15 eV.

Optionally, in the organic electroluminescent device, the energy level difference between a singlet energy level and a triplet energy level of the auxiliary host material is less than 0.3 eV.

Optionally, in the organic electroluminescent device, the electron donor material is a compound containing at least one of a triphenylamine group, a diphenylamino group, and a carbazolyl group.

Optionally, in the organic electroluminescent device, the electron donor material is selected from at least one of the compounds having the structures shown below:

D-1
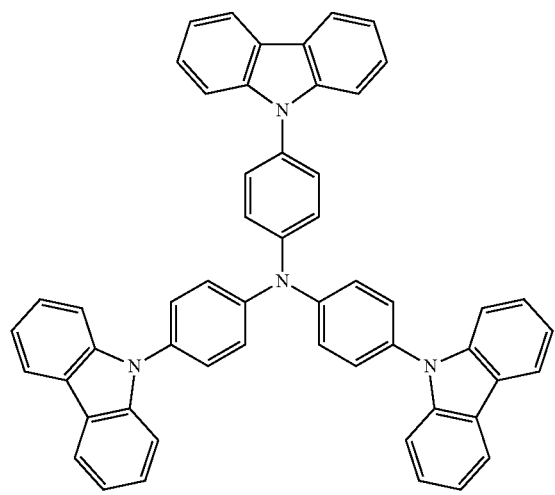
D-2
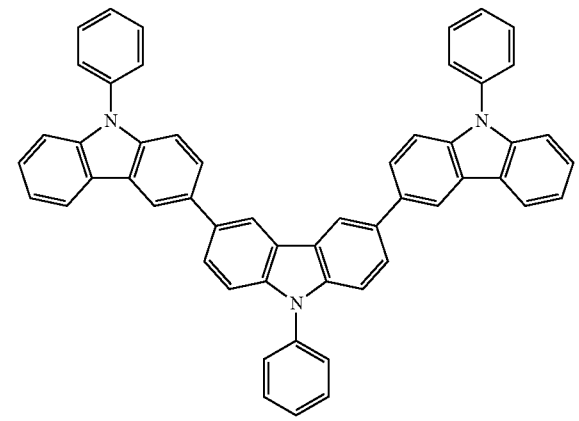
D-3
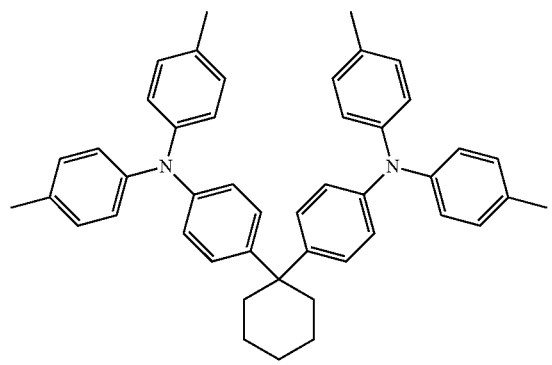
D-4
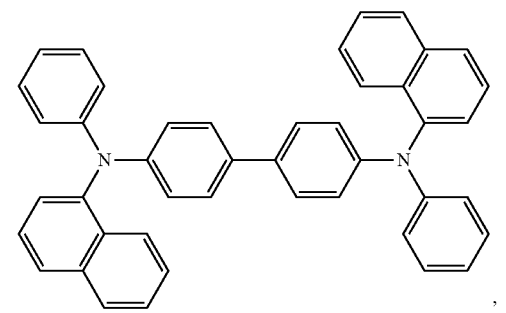
D-5
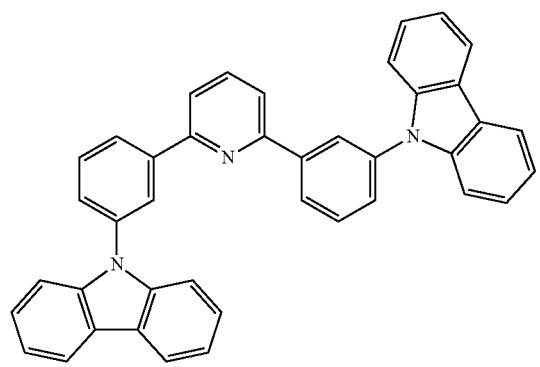
D-6
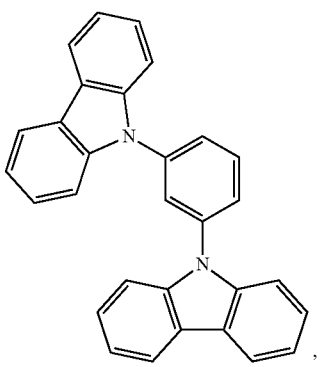
D-7
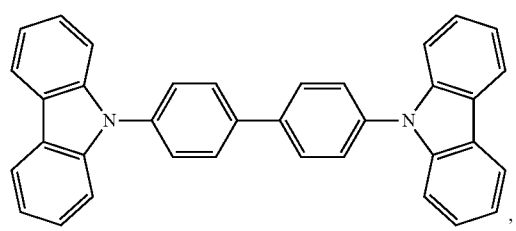
D-8
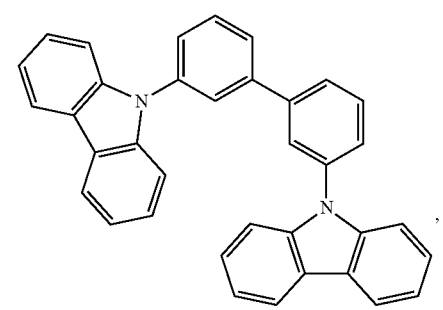

-continued
D-9
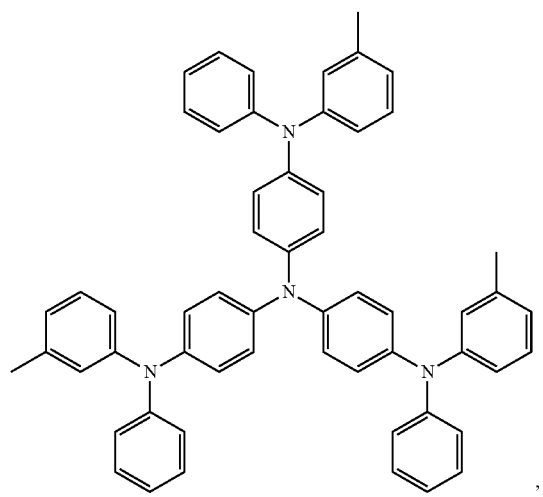,
D-10
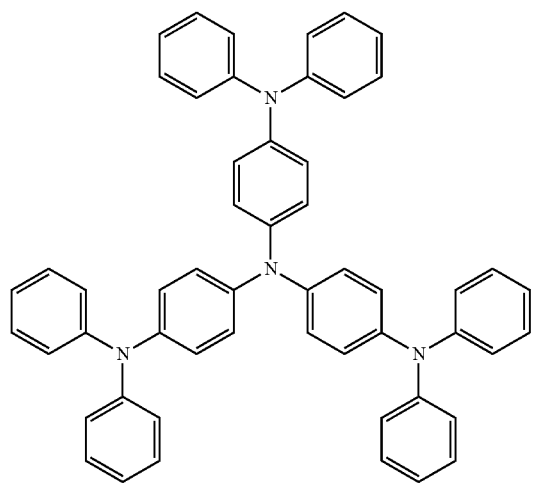,
D-11
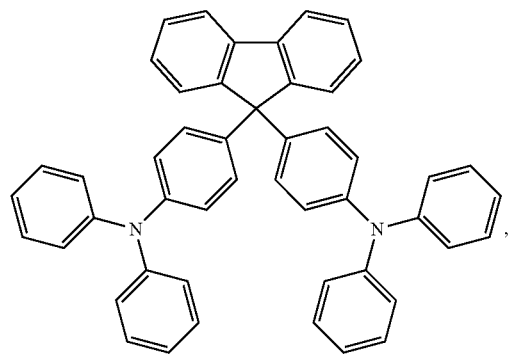,
D-12
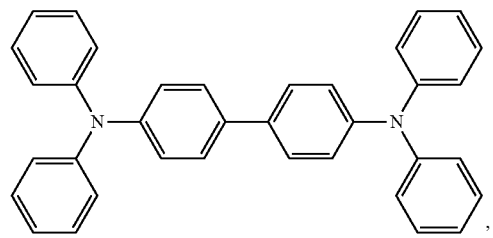,
D-13
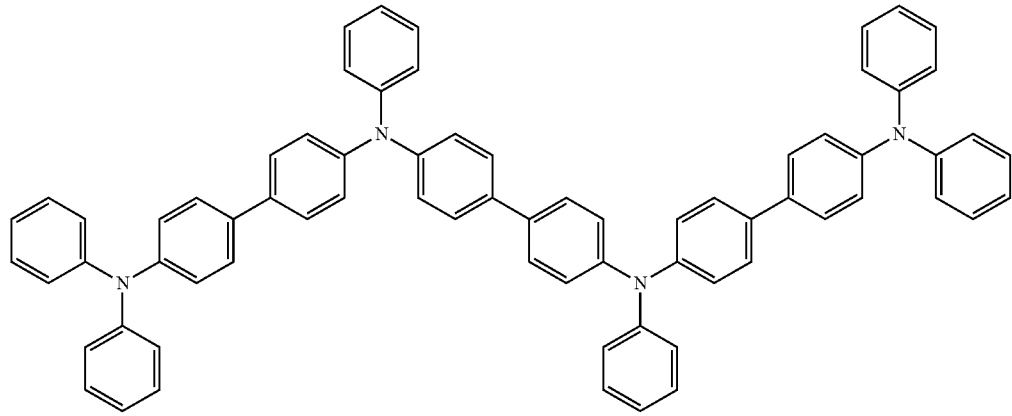,
D-14
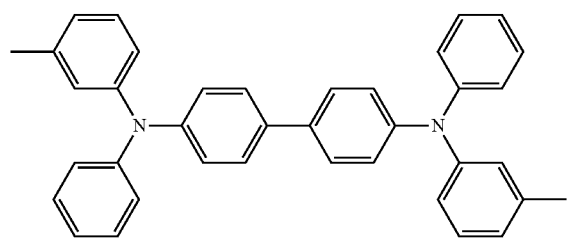,
D-15
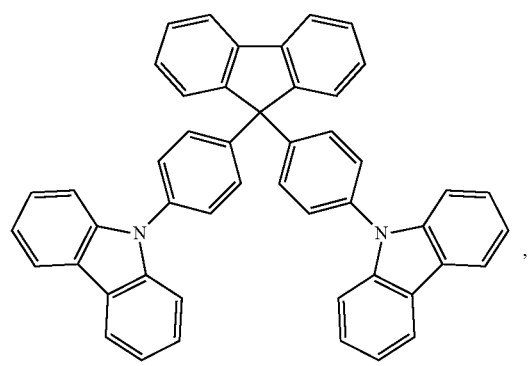, -continued
D-16
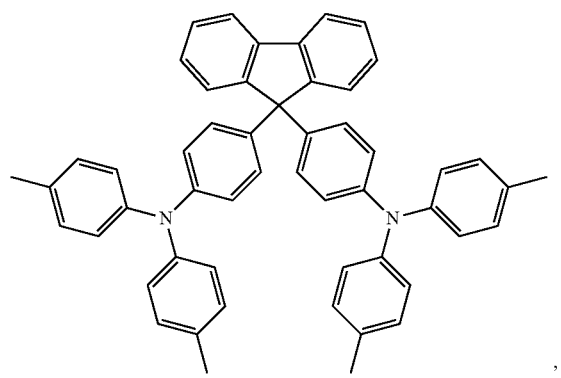
D-17
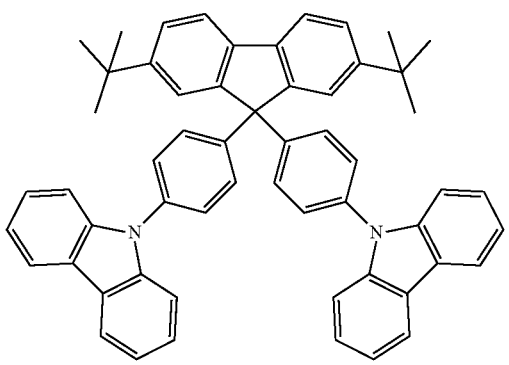
D-18
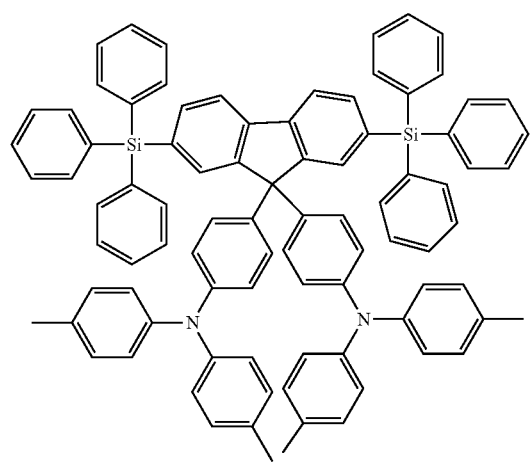
D-19
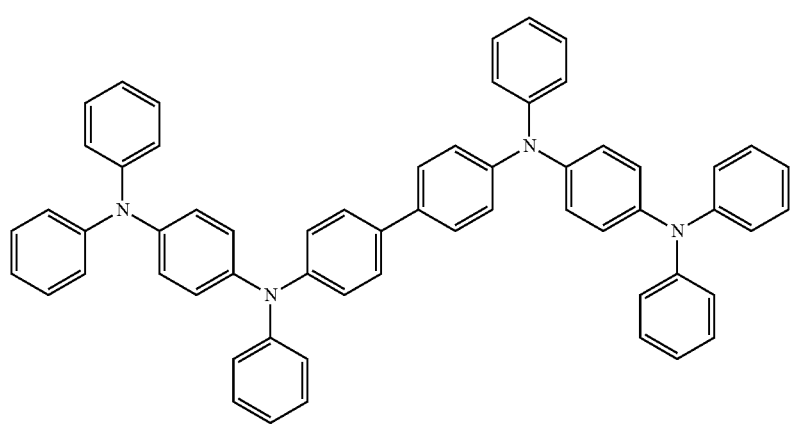

Optionally, in the organic electroluminescent device, the electron acceptor material is a compound containing at least one of a pyridyl group, a pyrimidine group, a triazine group, an imidazole group, and a phenanthroline group.

Optionally, in the organic electroluminescent device, the electron acceptor material is selected from at least one of the compounds having the structures shown below:

A-1
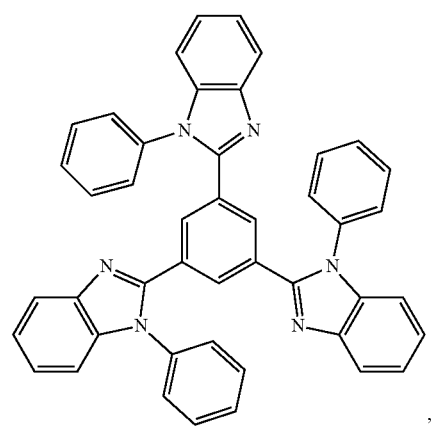

A-2
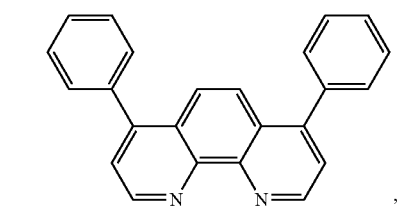

A-3
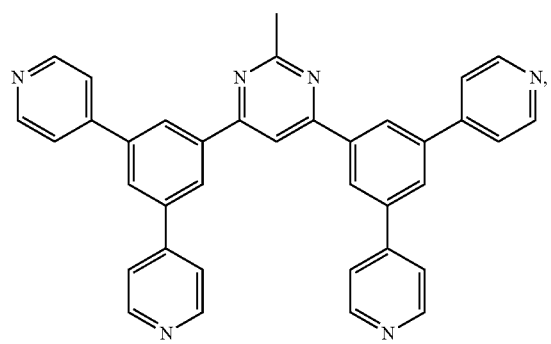

A-4
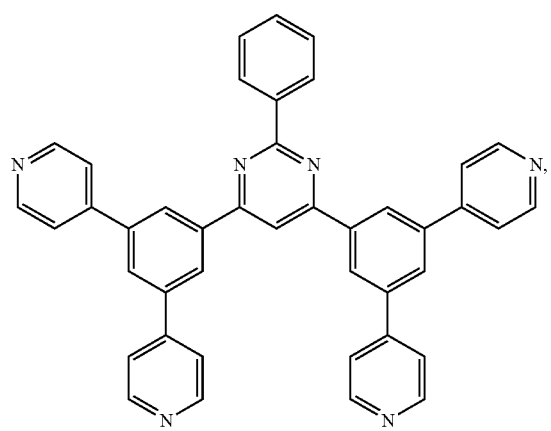

A-5
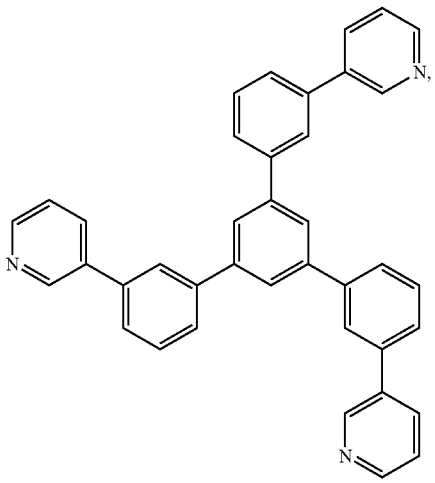

A-6
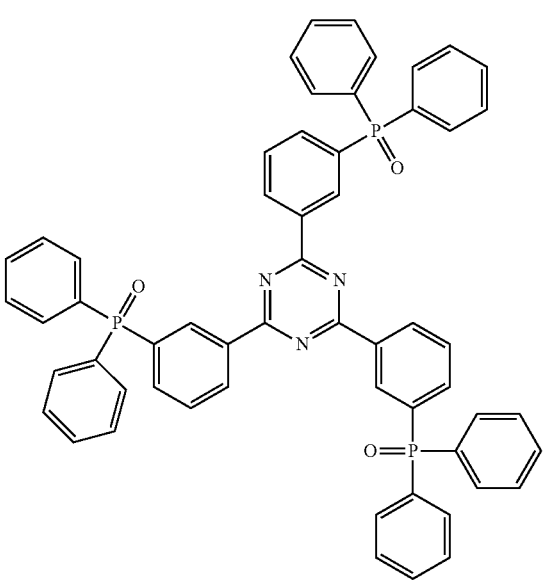

A-7
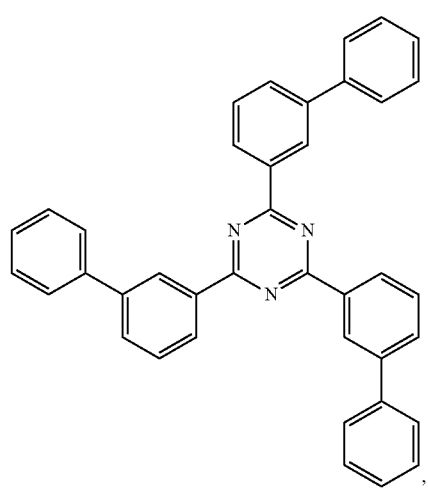

A-8
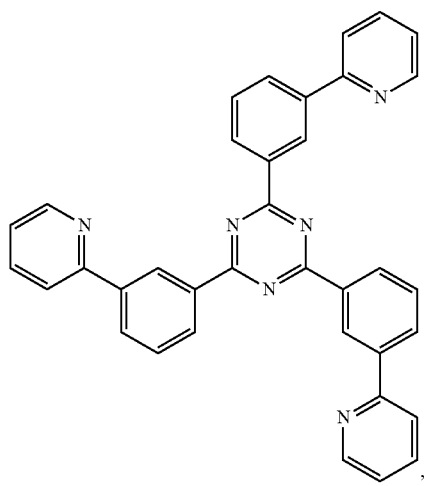
A-9
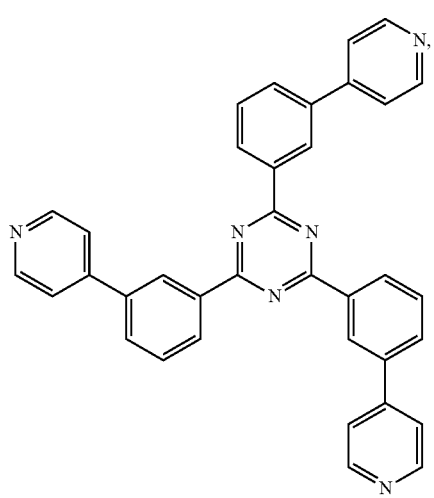
A-10
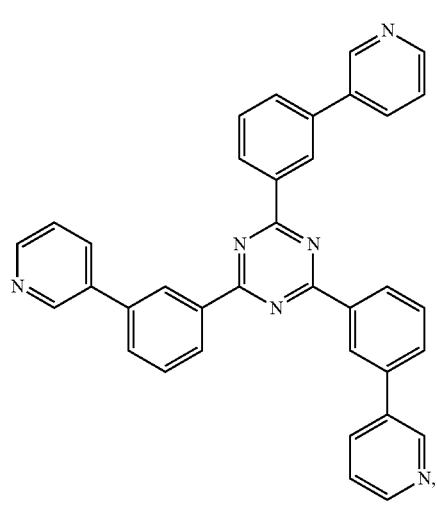
A-11
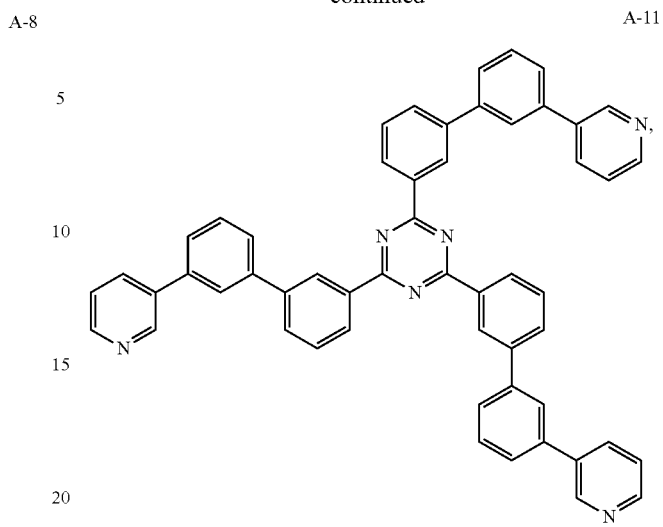
A-12
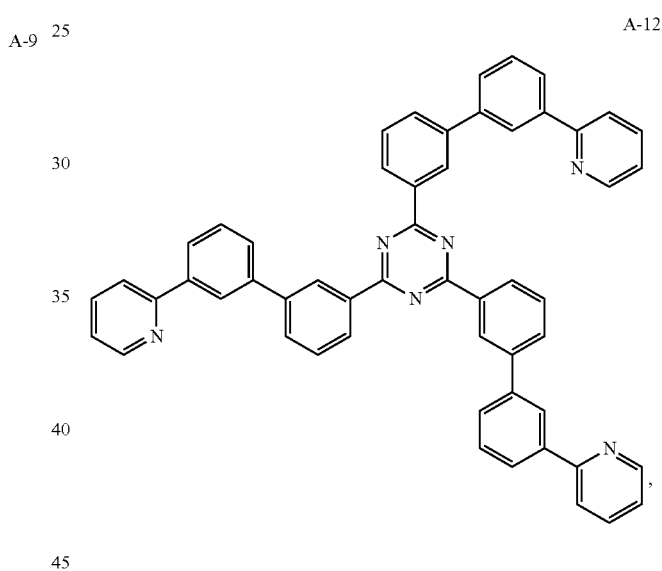
A-13
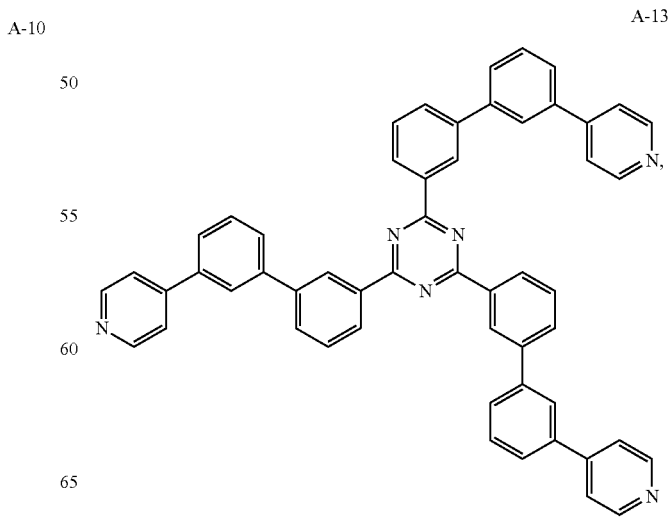

-continued
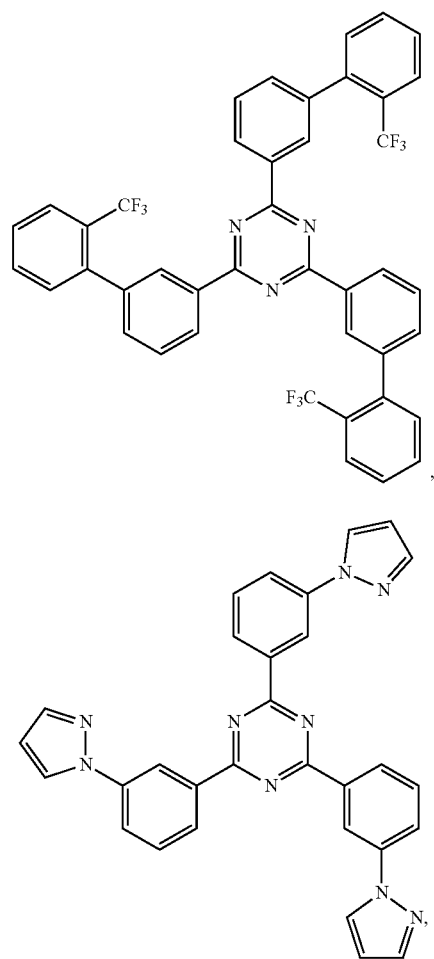
A-14
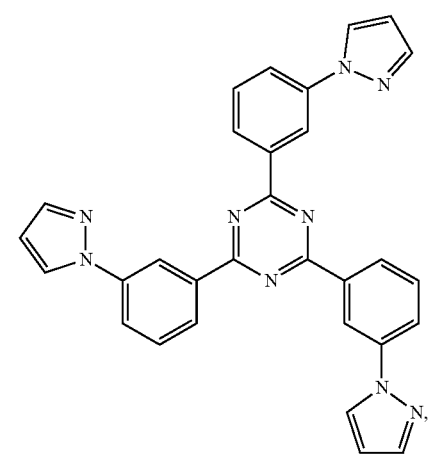
A-15
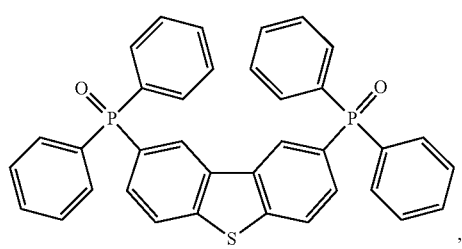
A-16
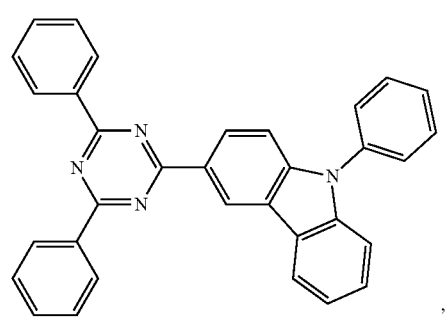
A-17
-continued
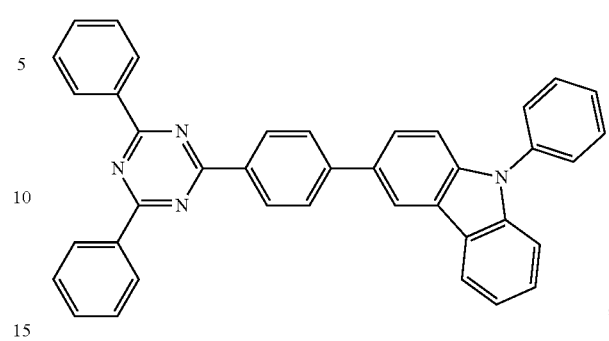
A-18
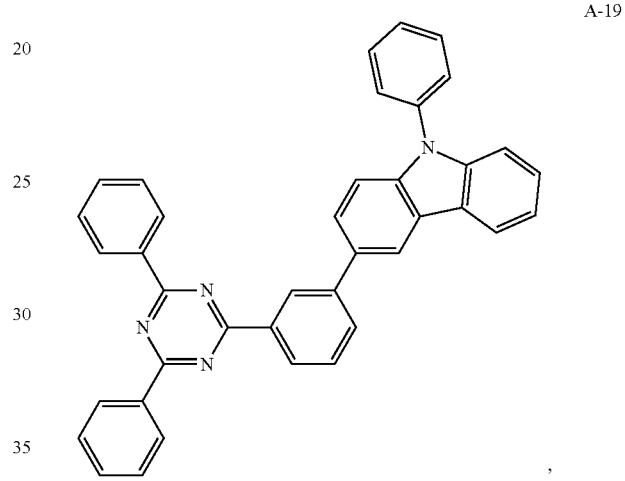
A-19
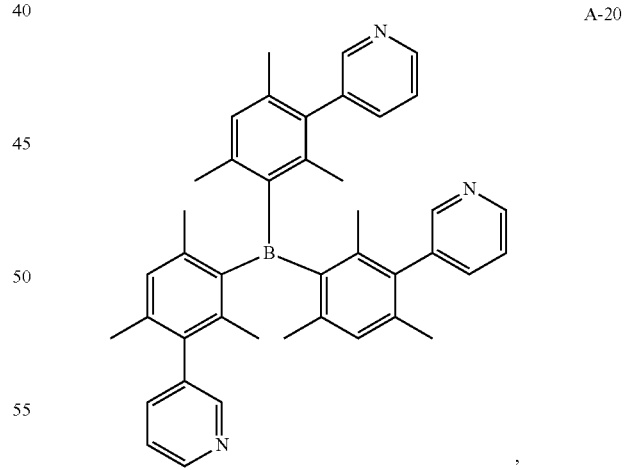
A-20
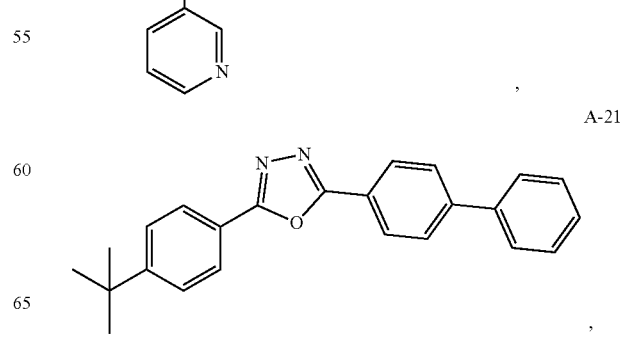
A-21

A-22
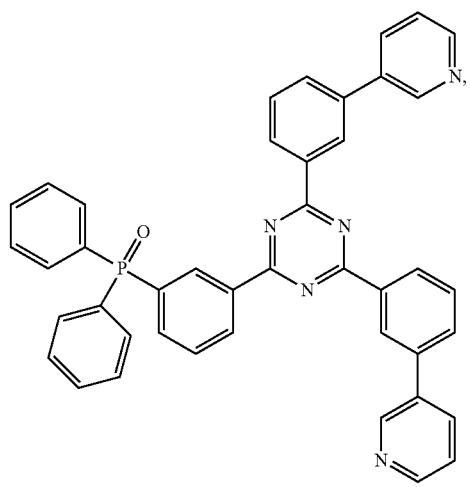
A-25
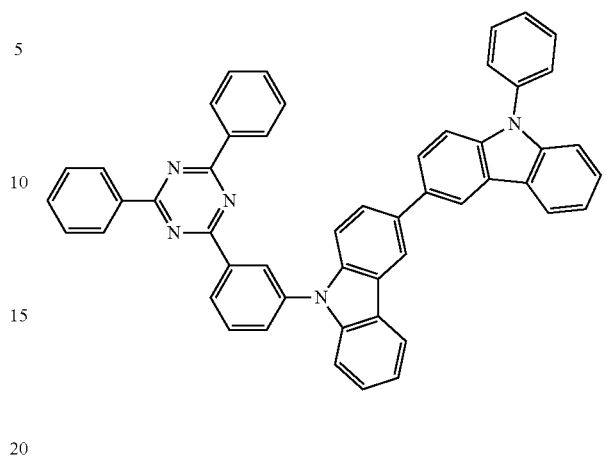
A-23
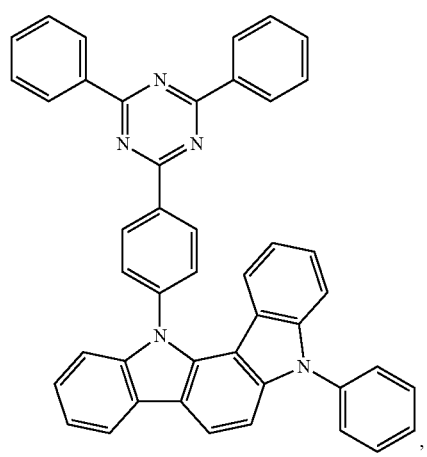
A-26
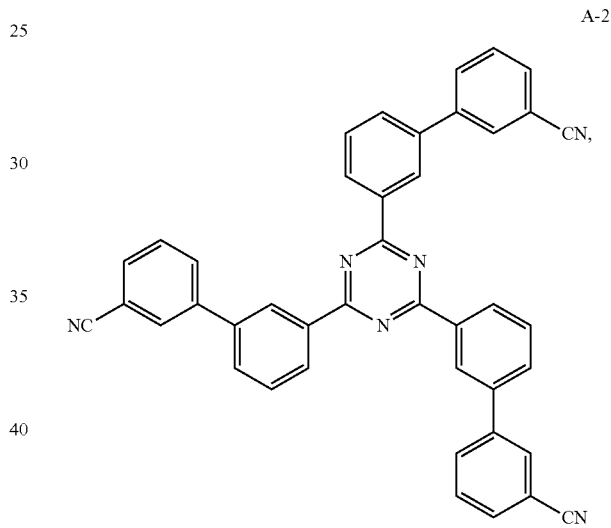
A-24
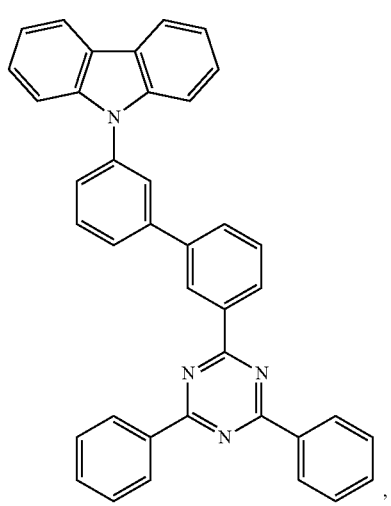
A-27
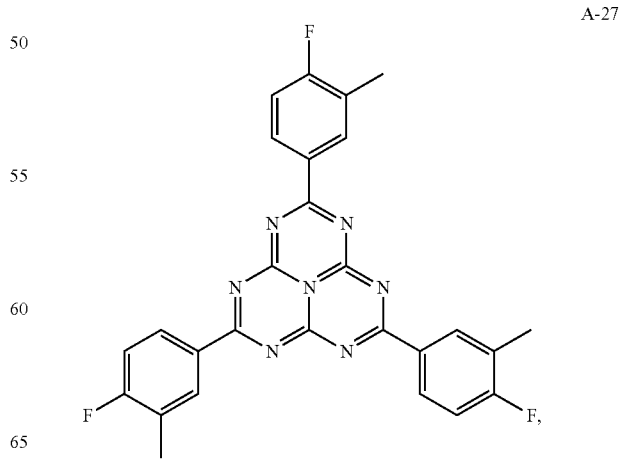

A-28
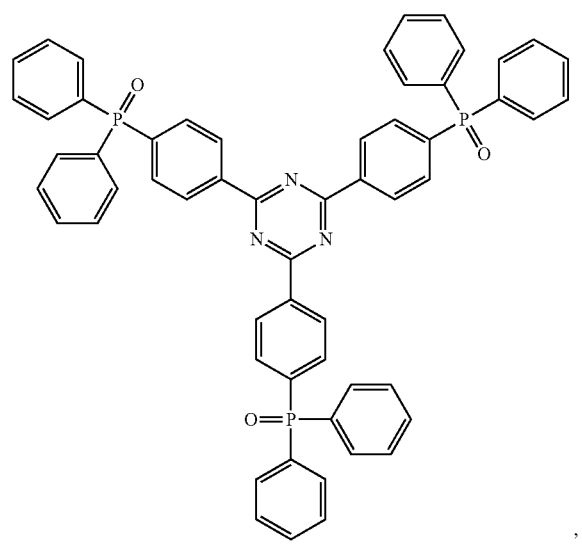
A-29
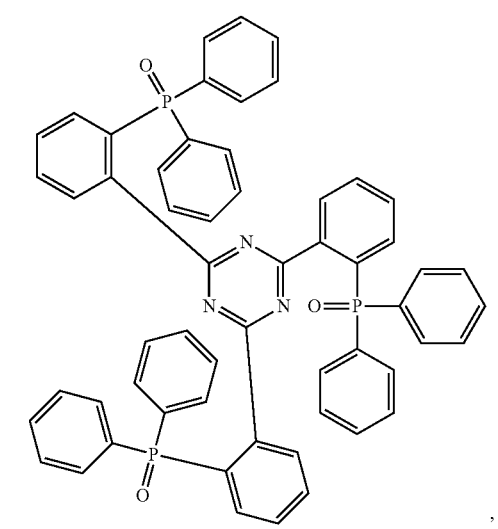
A-30
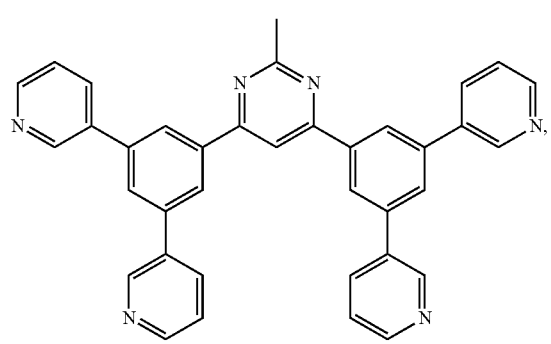
A-31
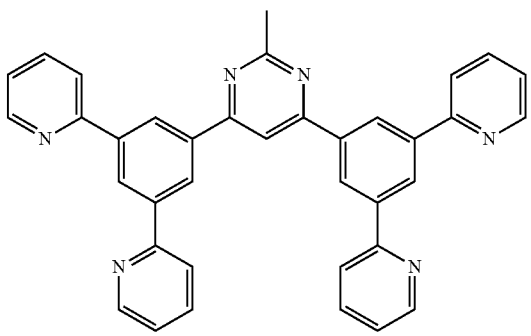
A-32
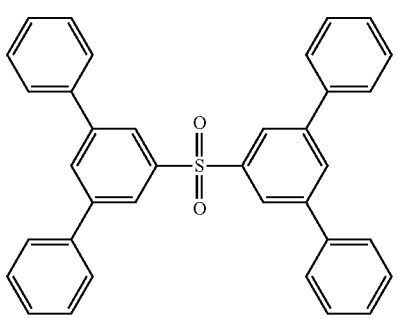
A-33
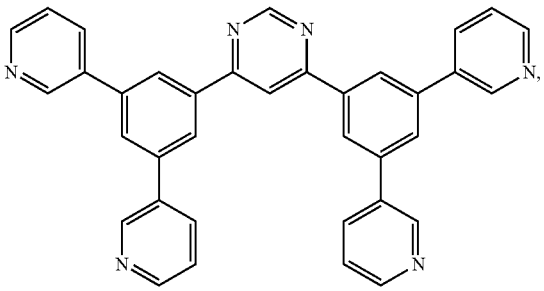
A-34
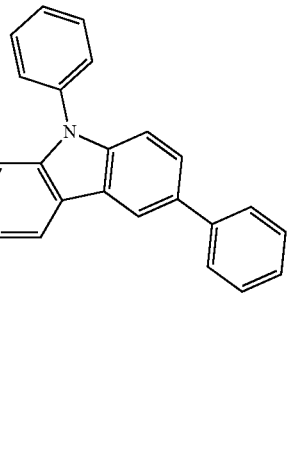

A-35
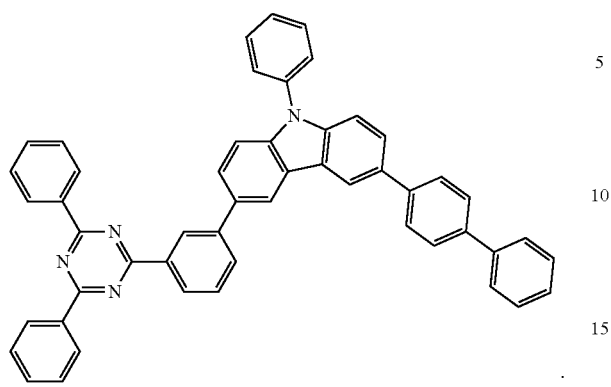
Optionally, in the organic electroluminescent device, the thermally activated delayed fluorescence material is selected from at least one of the compounds having the structure shown below:
T-1
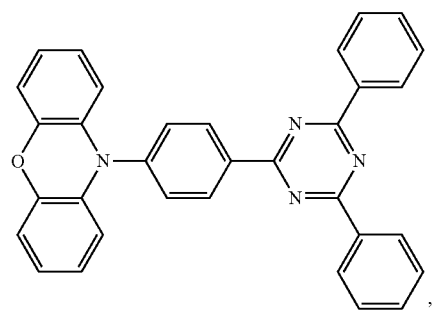
,
T-2
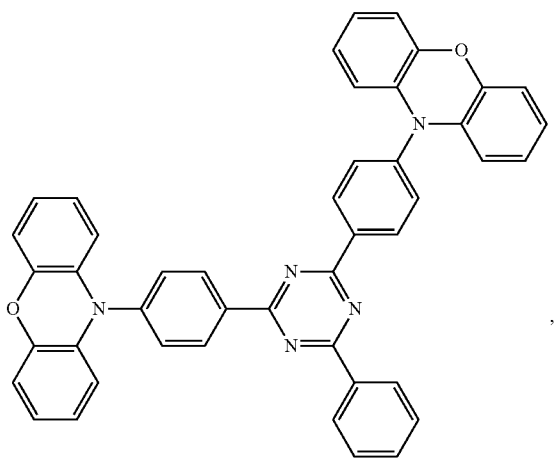
,
T-3
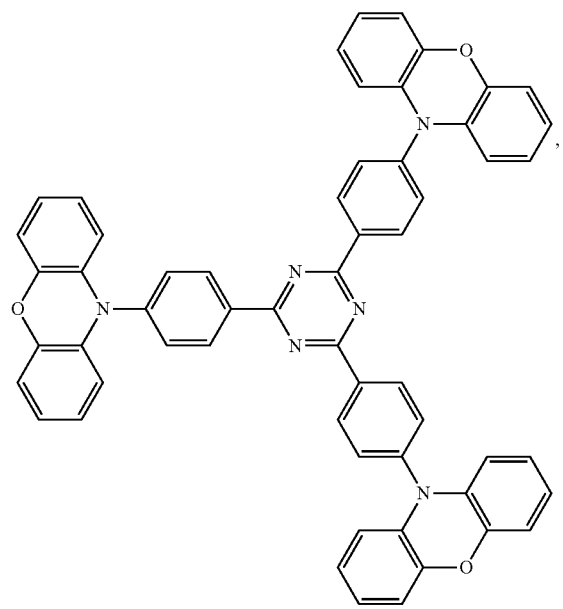
,
T-4
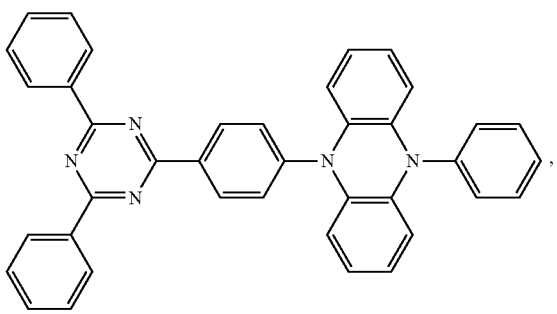
, -continued
T-5
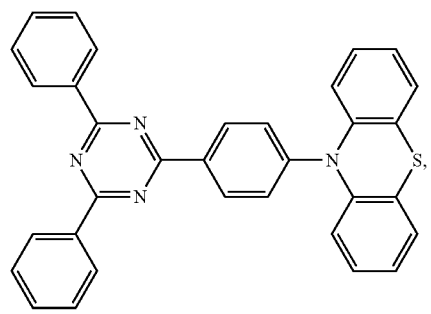
T-6
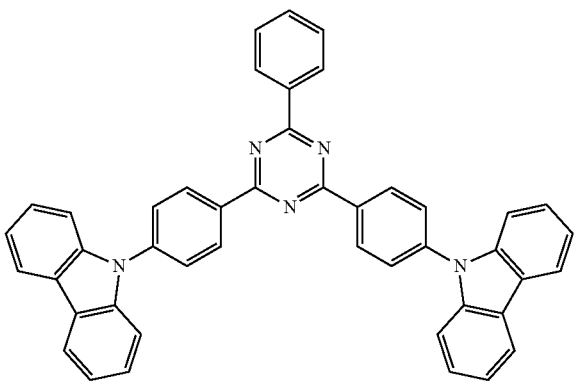
T-7
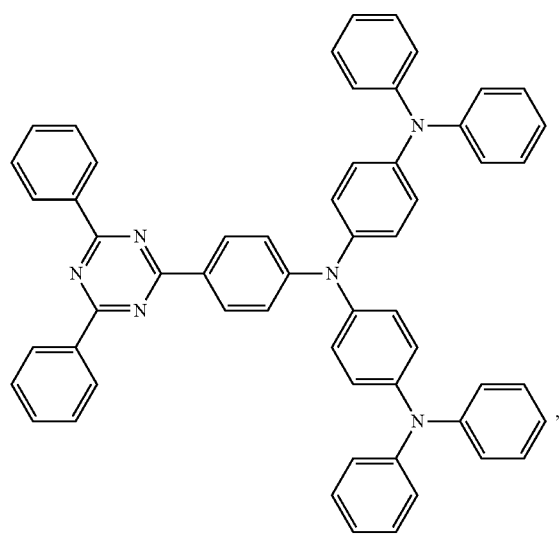
T-8
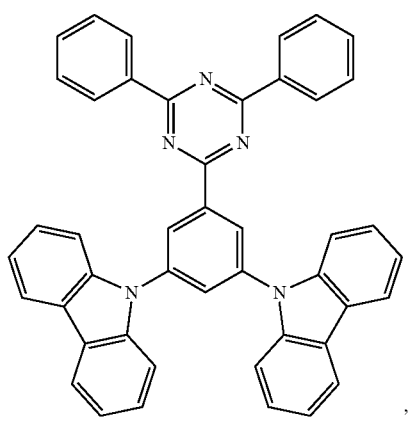
T-9
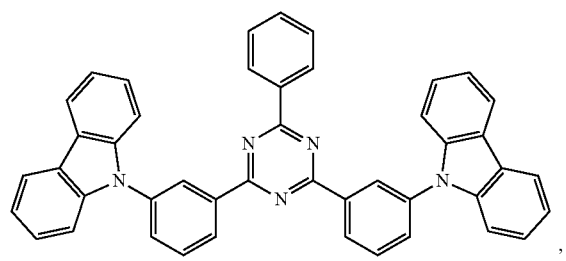
T-10
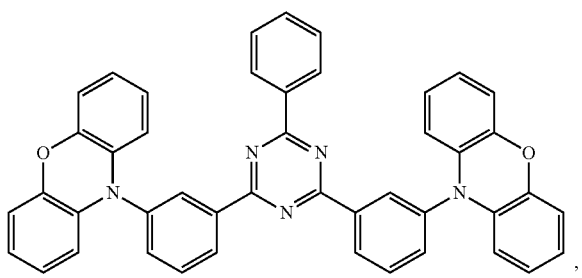
T-11
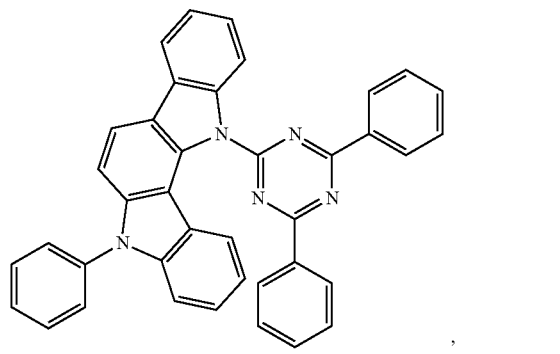
T-12
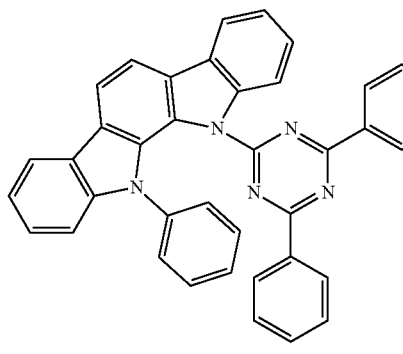

-continued
T-13
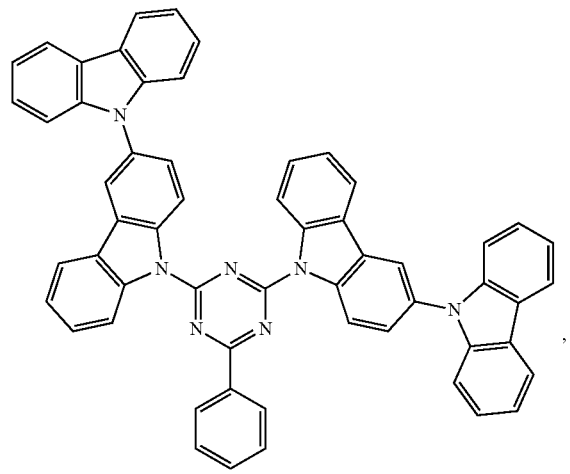
T-14
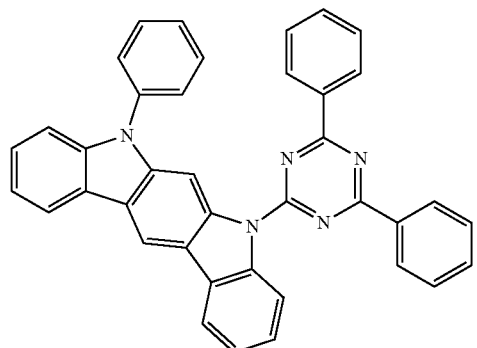
T-15
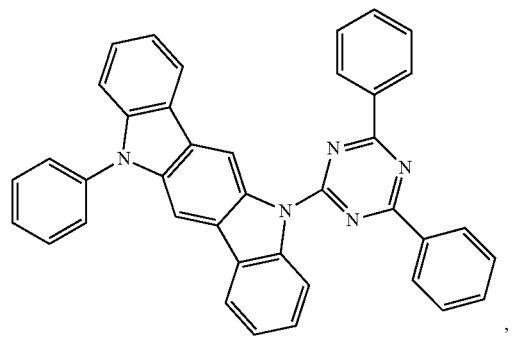
T-16
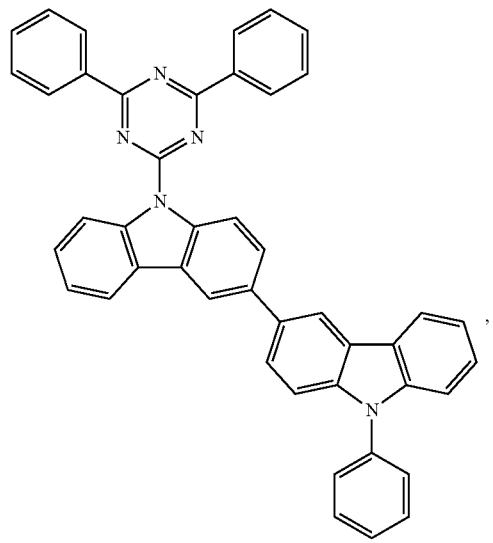
T-17
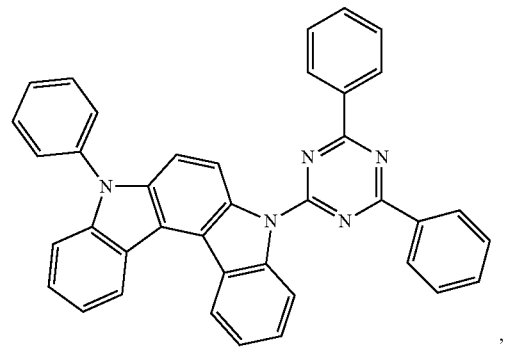
T-18
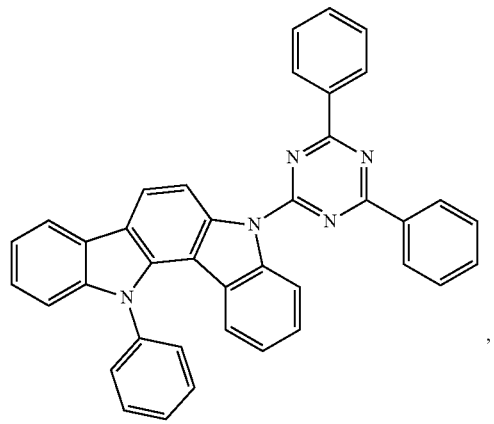

-continued
T-19
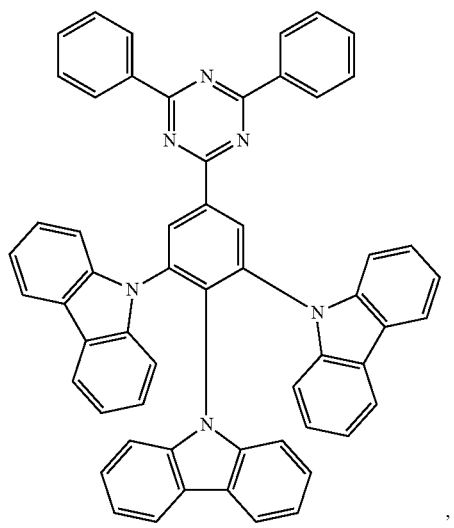
T-20
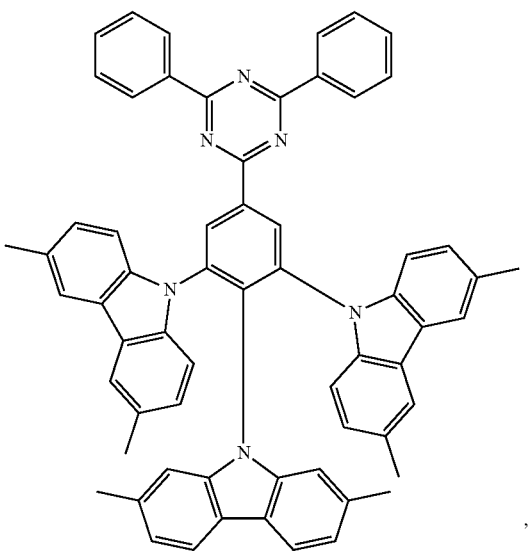
T-21
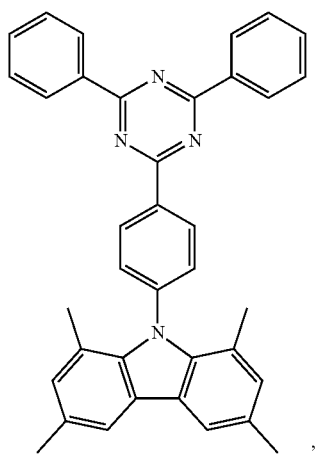
T-22
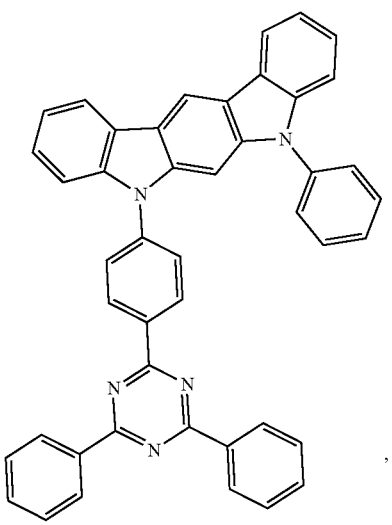
T-23
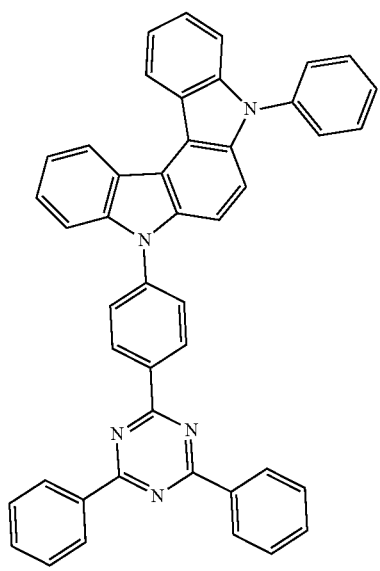
T-24
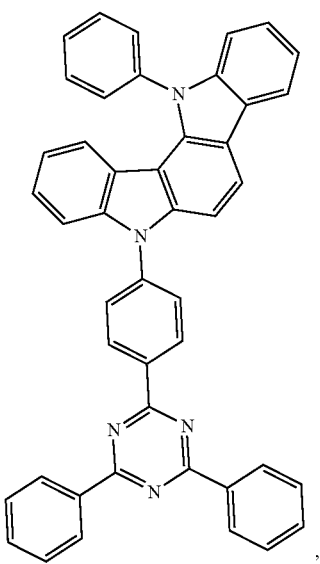

-continued
T-25
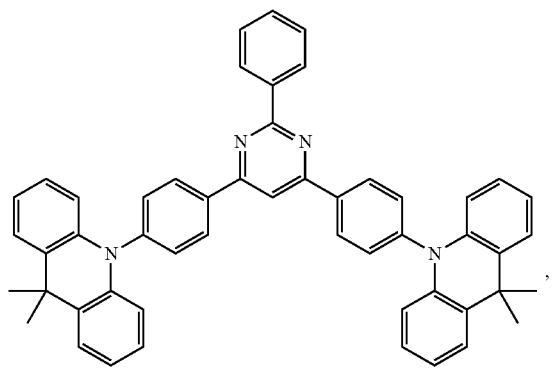
T-26
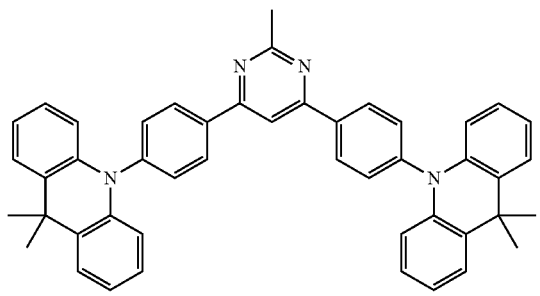
T-27
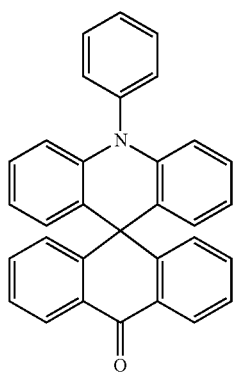
T-28
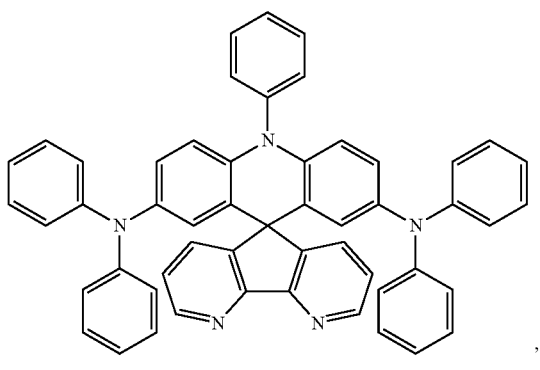
T-29
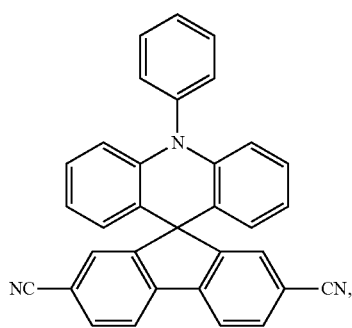
T-30
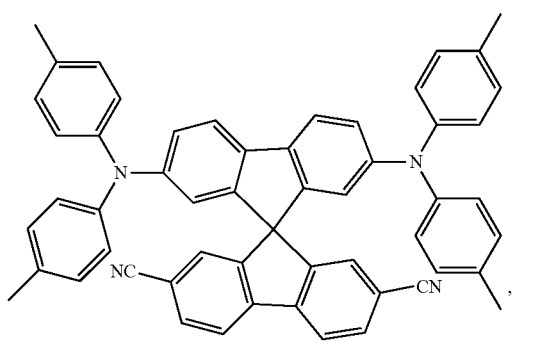
T-31
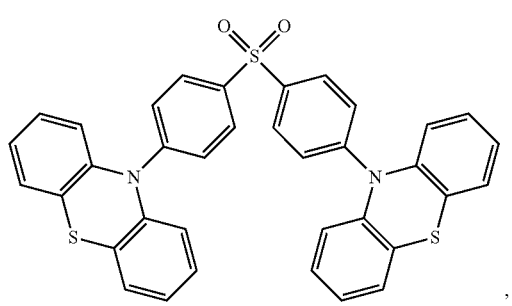
T-32
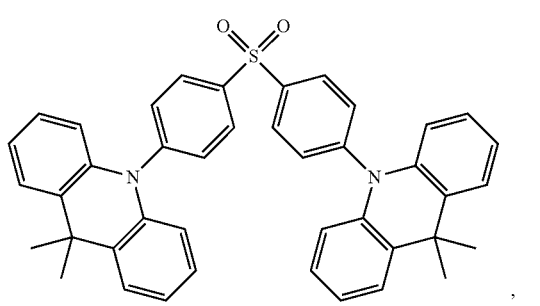

-continued
T-33
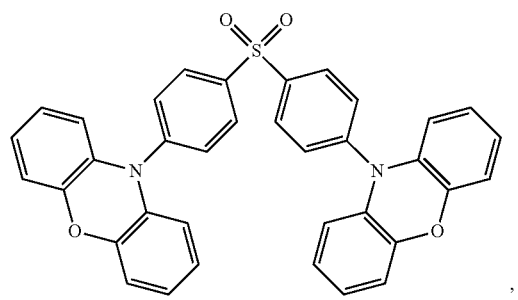
T-34
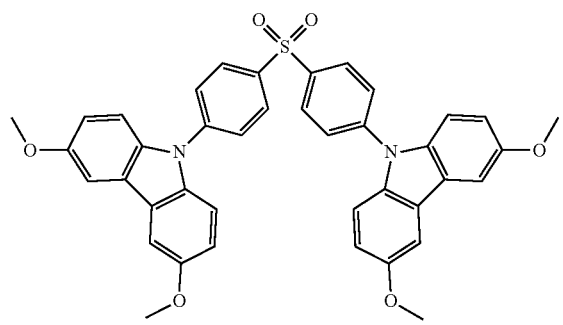
T-35
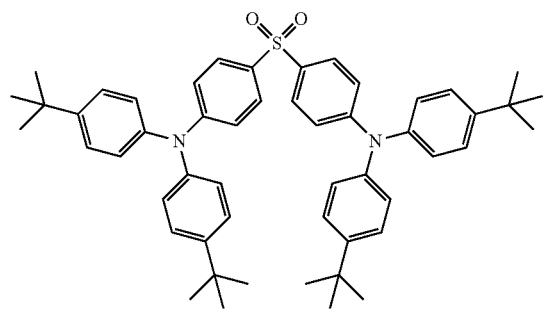
T-36
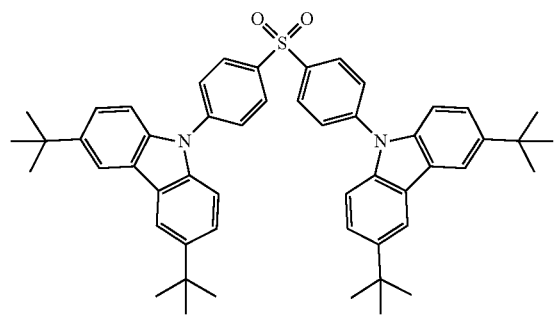
T-37
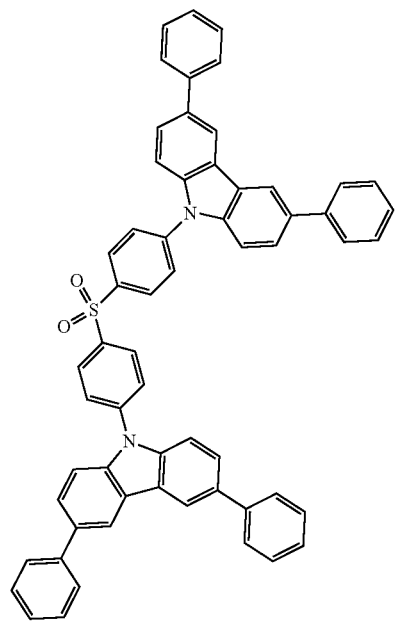
T-38
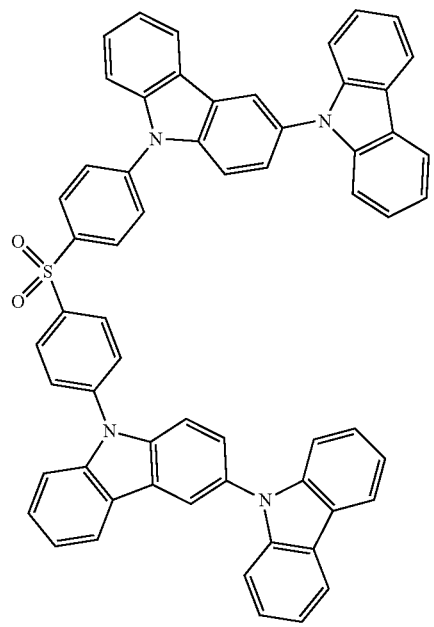

-continued
T-39
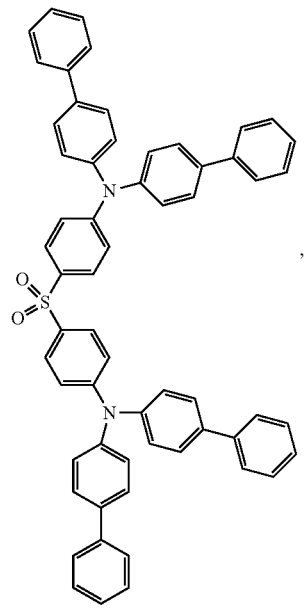
T-40
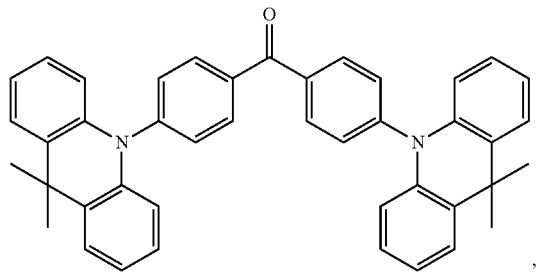
T-41
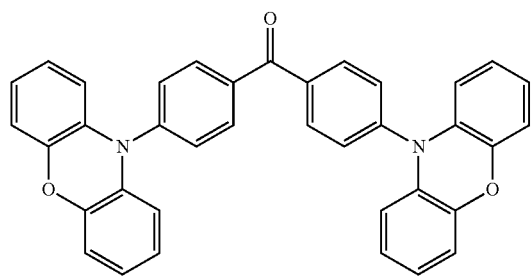
T-42
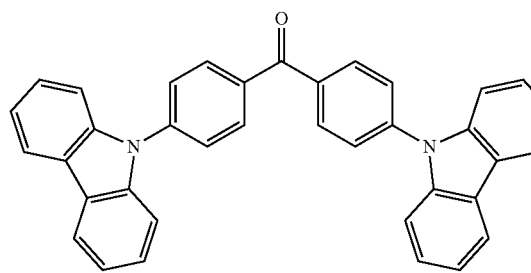
T-43
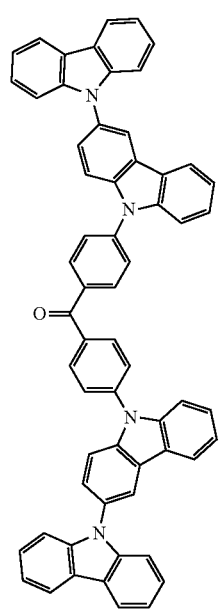
T-44
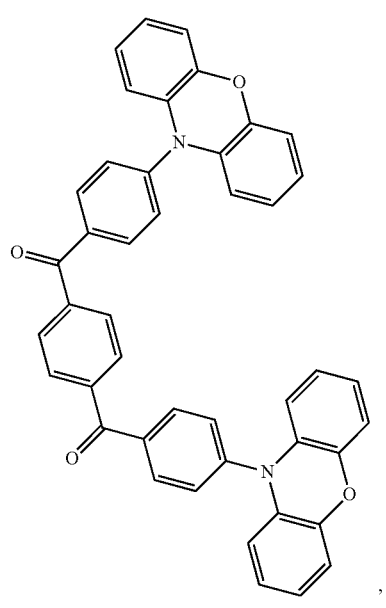

T-45
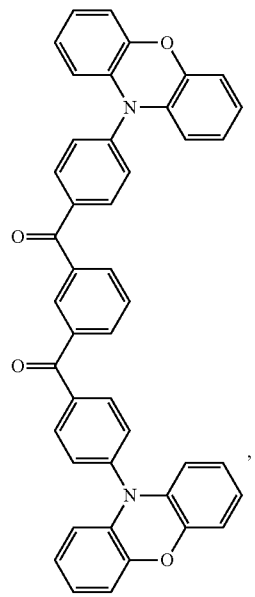
T-46
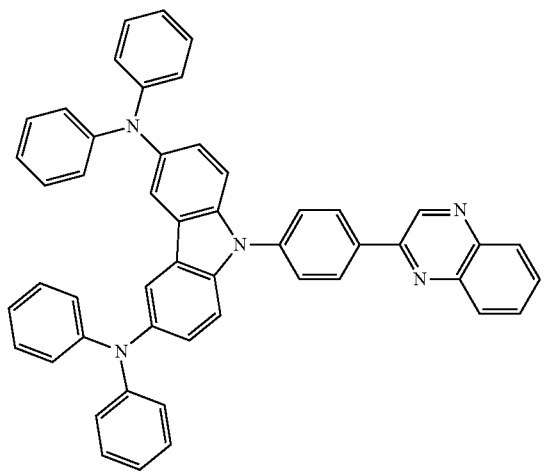
T-47
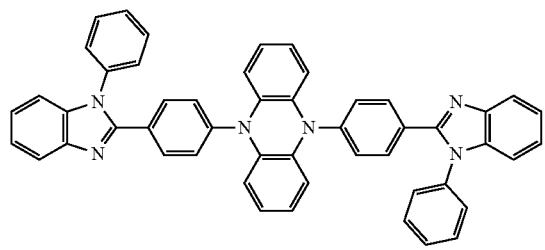
T-48
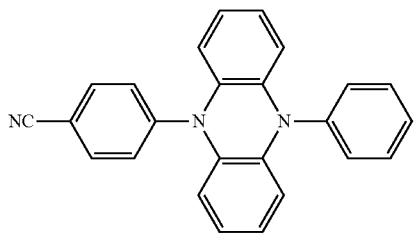
T-49
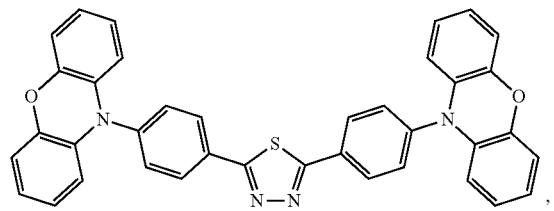
T-50
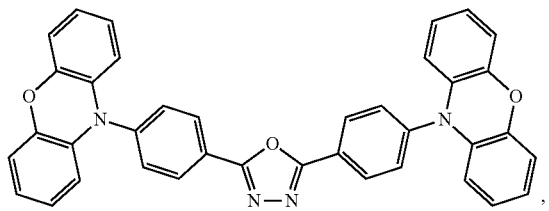
T-51
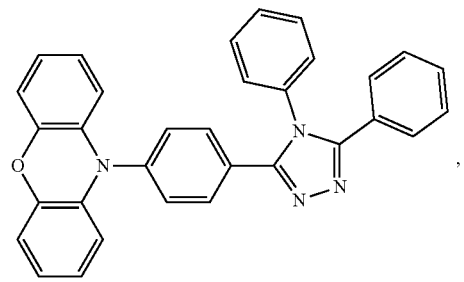
T-52
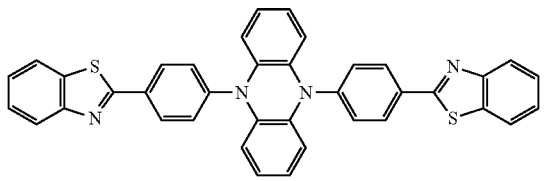

-continued
T-53
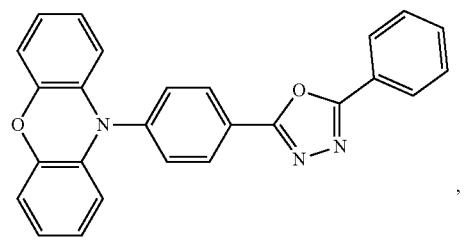,
T-54
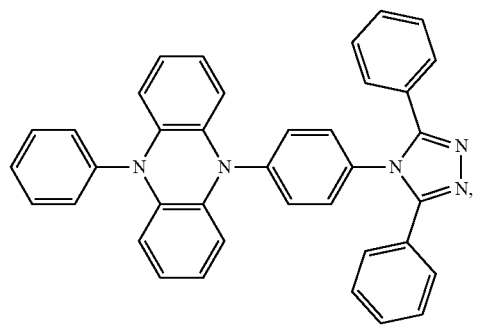,
T-55
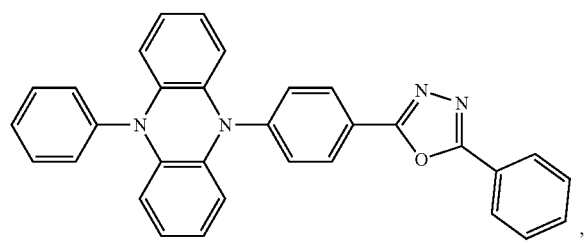,
T-56
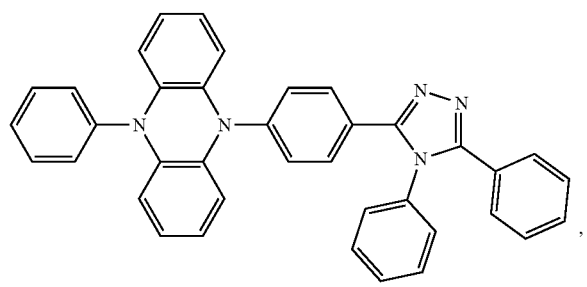,
T-57
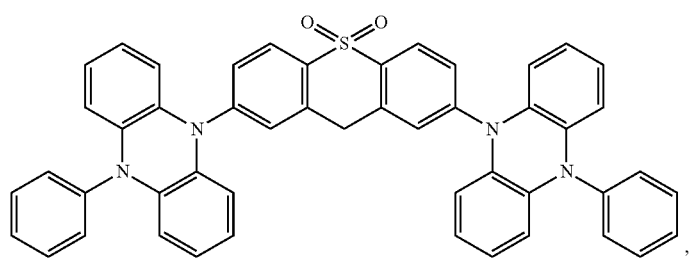,
T-58
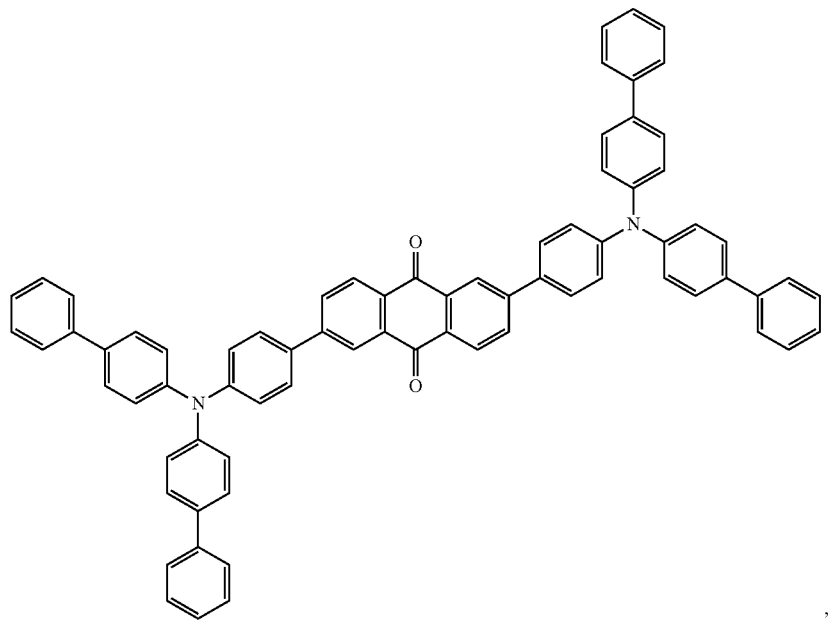, -continued
T-59
T-60
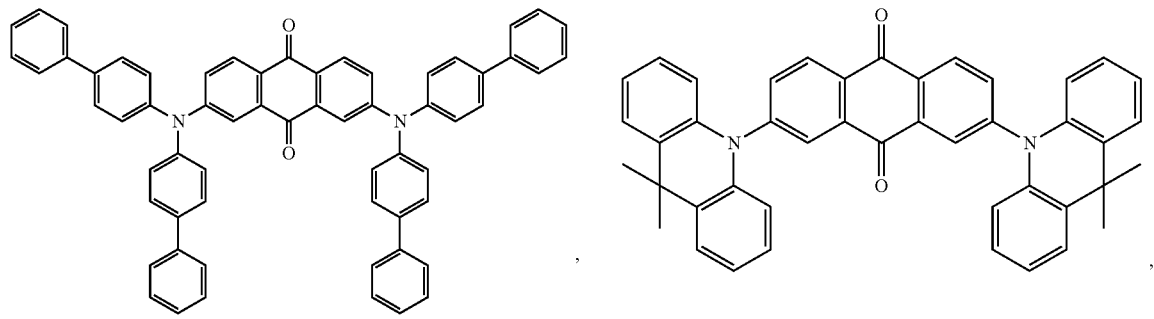
T-61
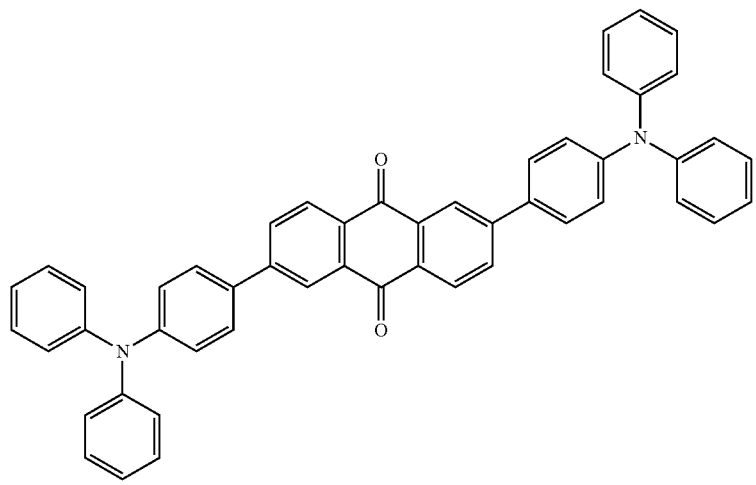
T-62
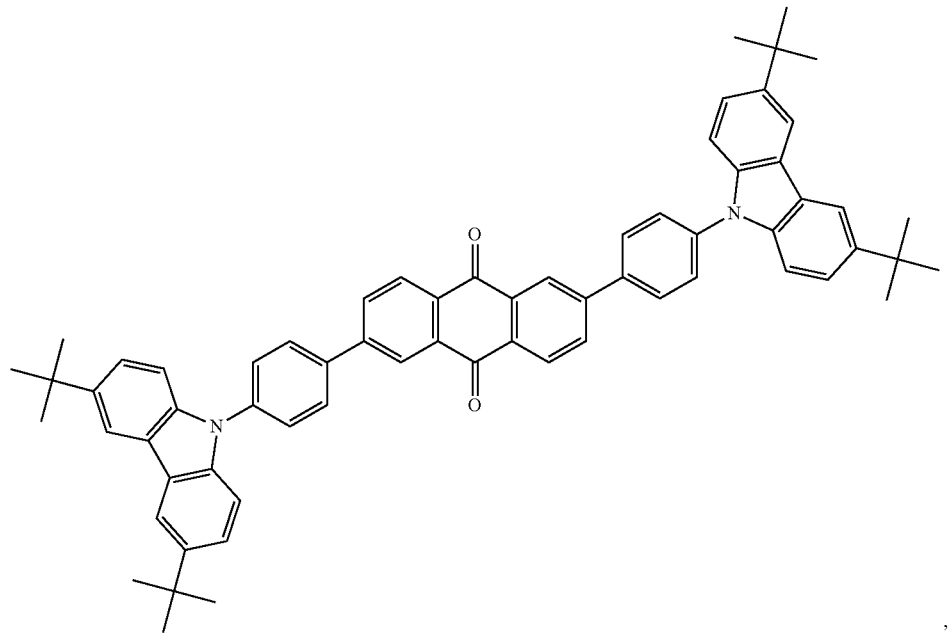

-continued
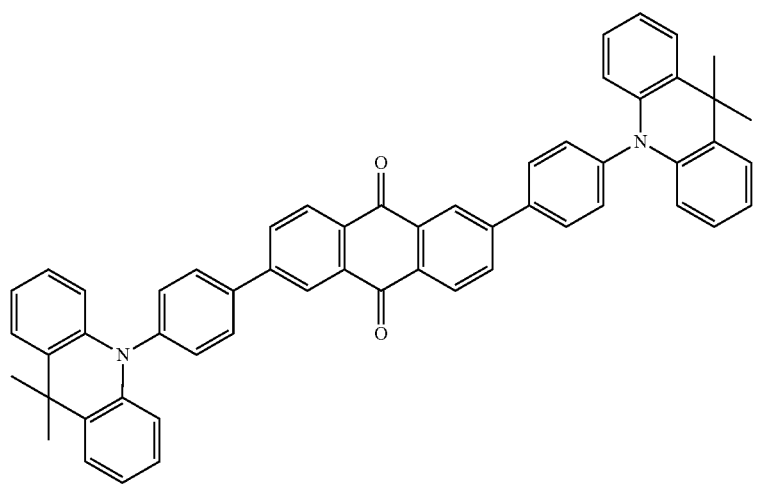
T-63
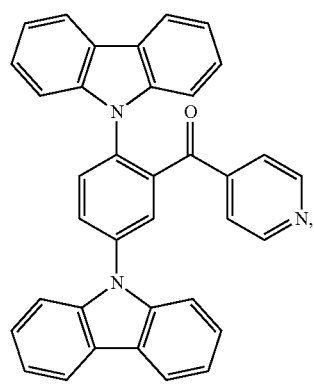
T-64
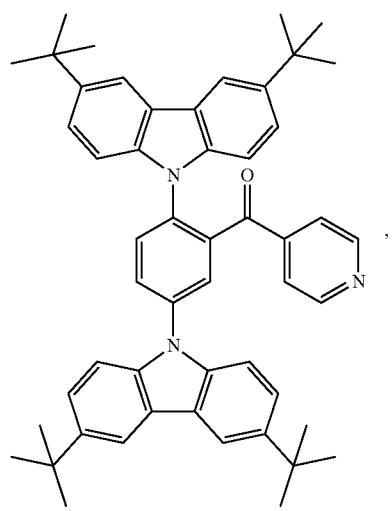
T-65
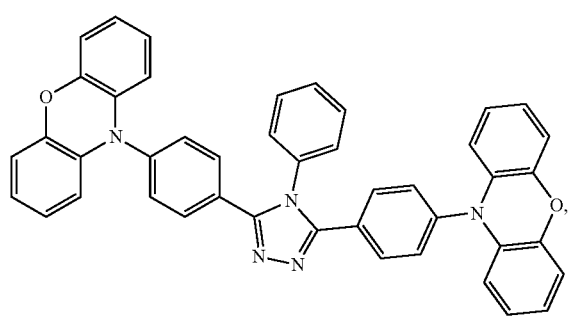
T-66
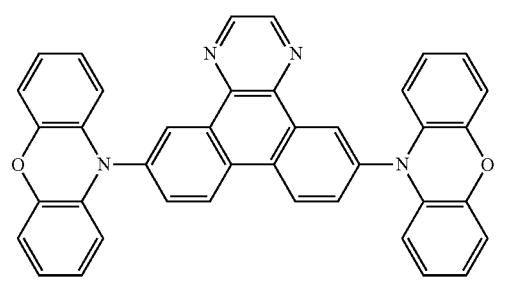
T-67

T-68
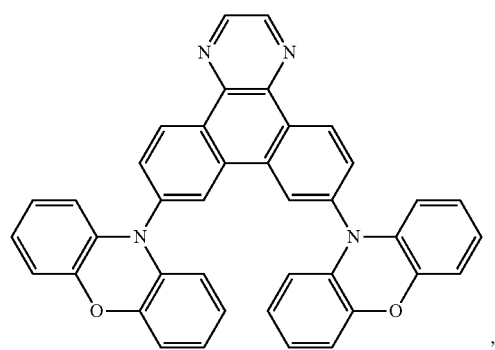
T-69
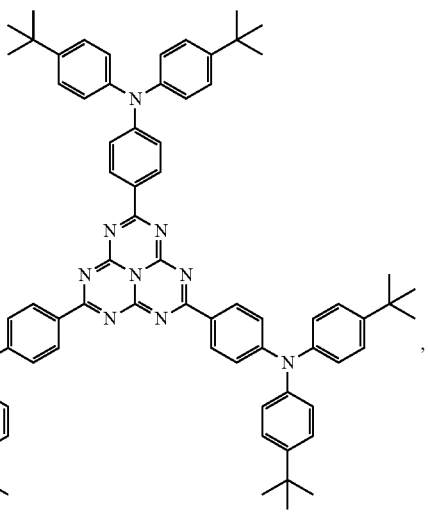
T-70
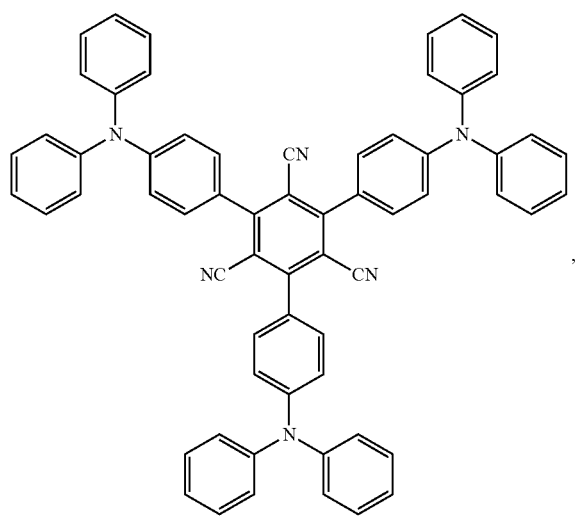
T-71
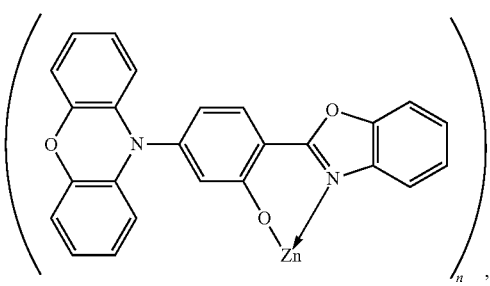
T-72
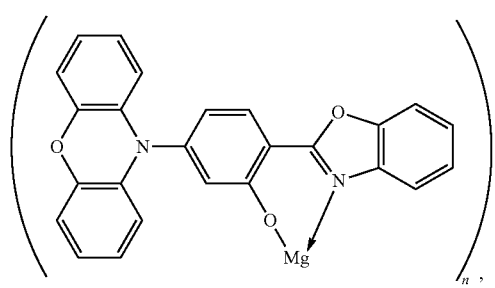
T-73
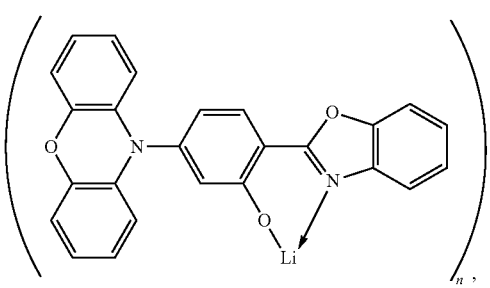

-continued
T-74
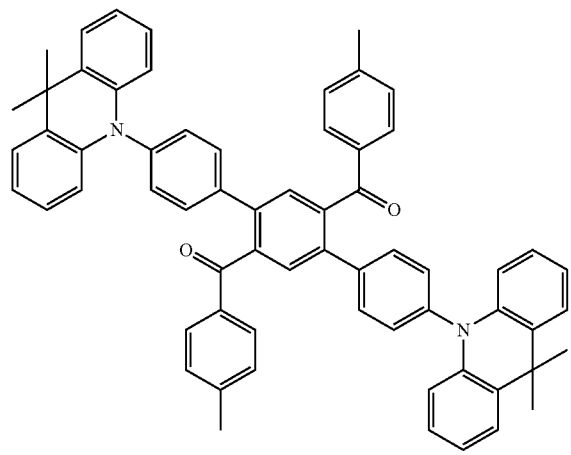
T-75
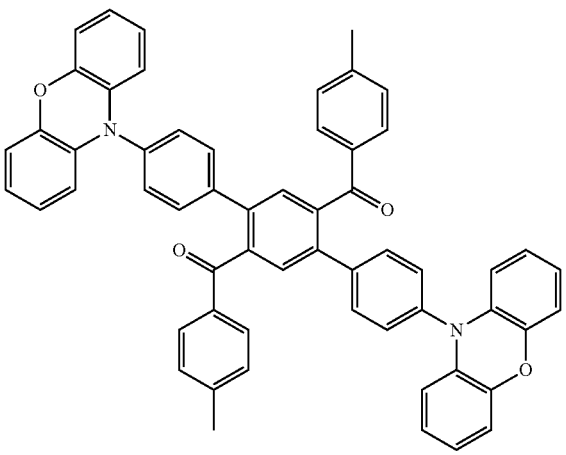
T-76
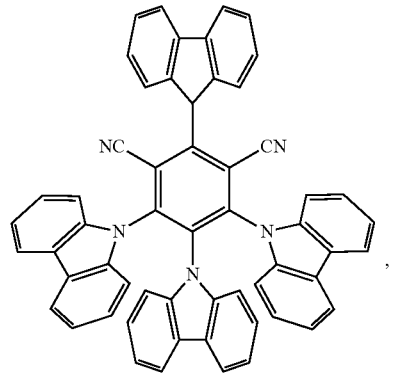
T-77
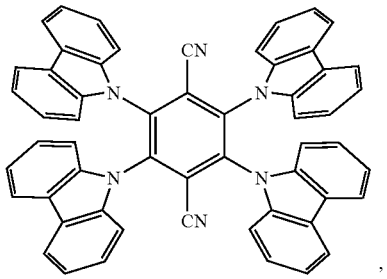
T-78
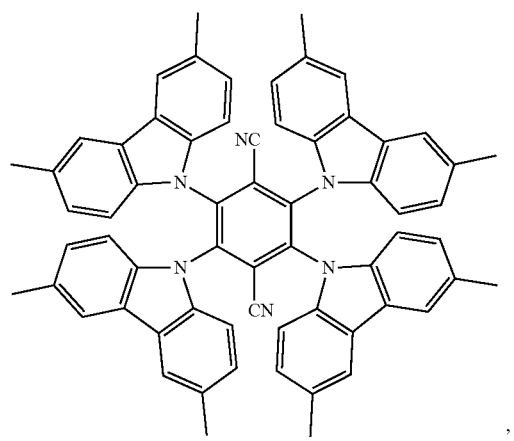
T-79
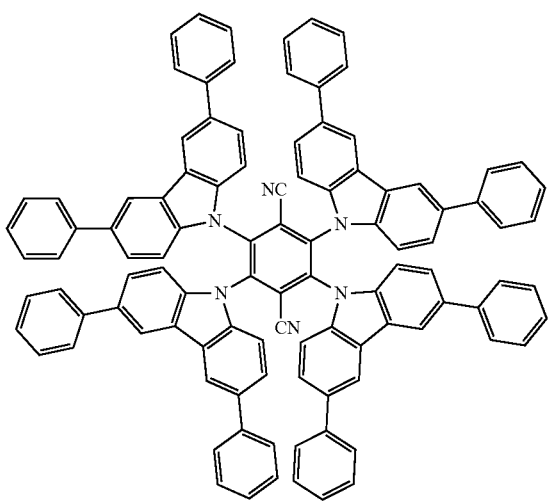
T-80
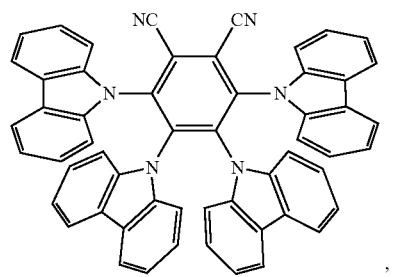
T-81
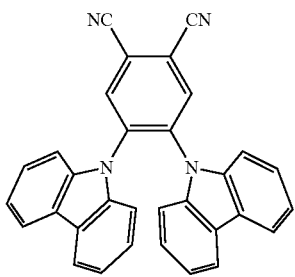

T-82
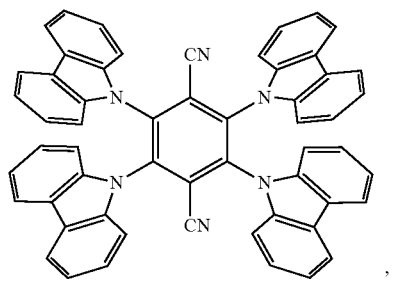
T-83
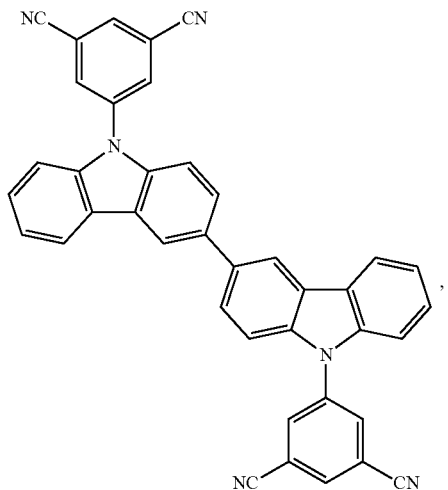
T-84
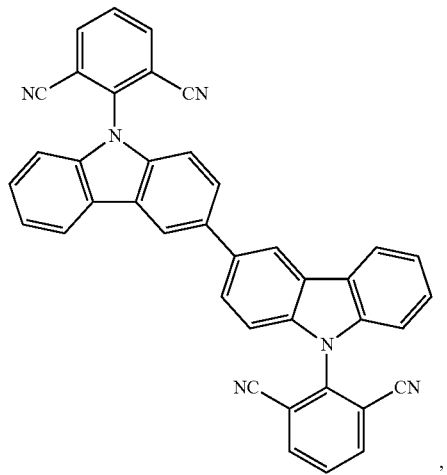
T-85
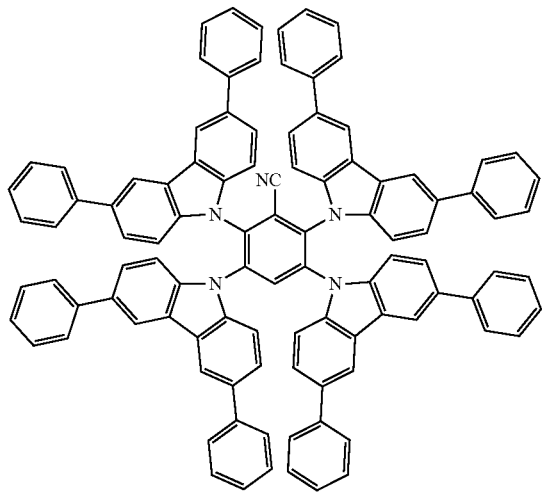
T-86
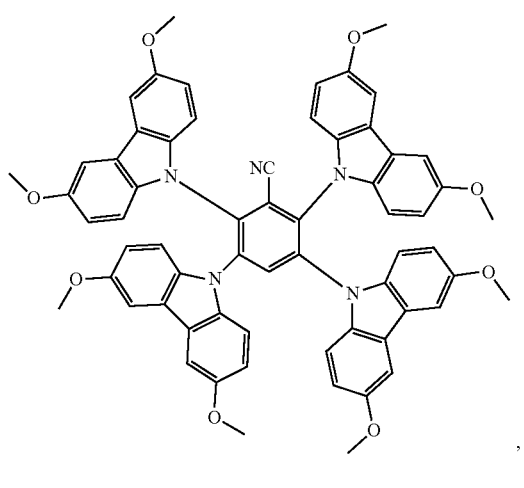
T-87
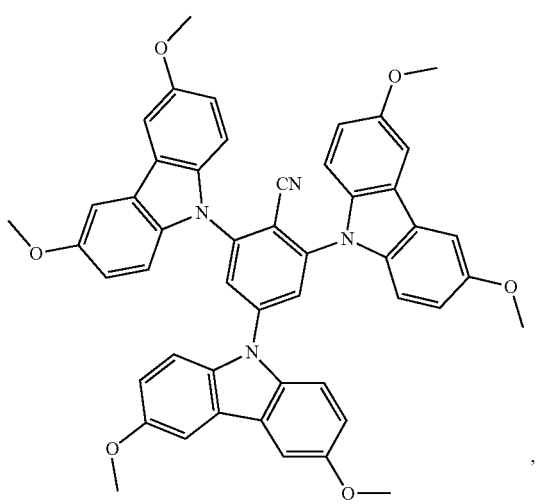

-continued
T-88
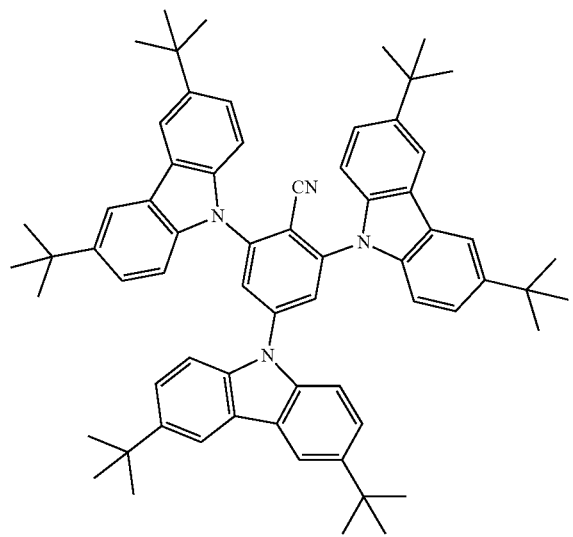
T-89
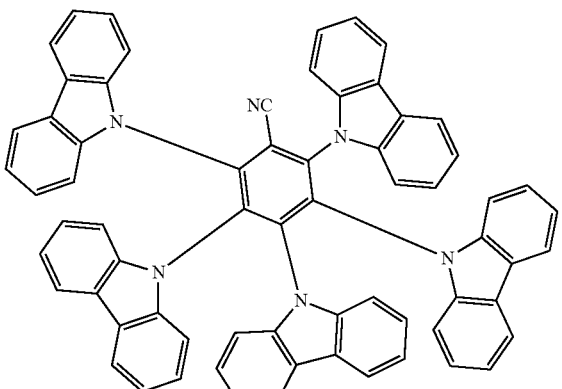
T-90
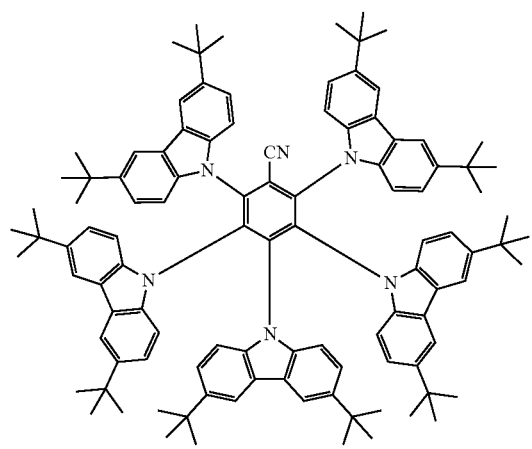
T-91
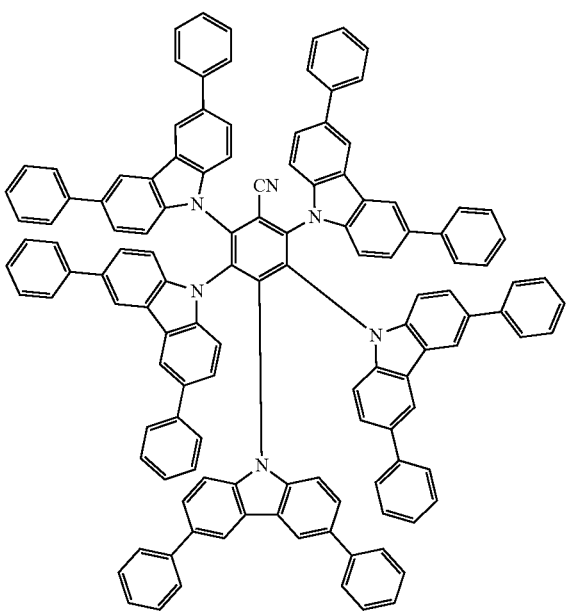

-continued
T-92
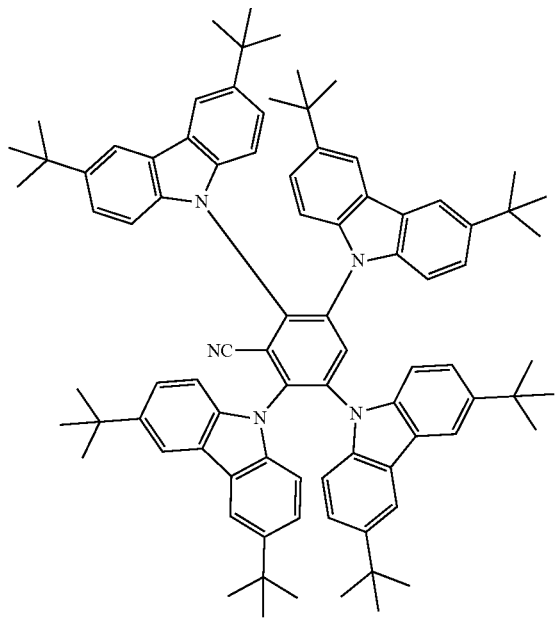
T-93
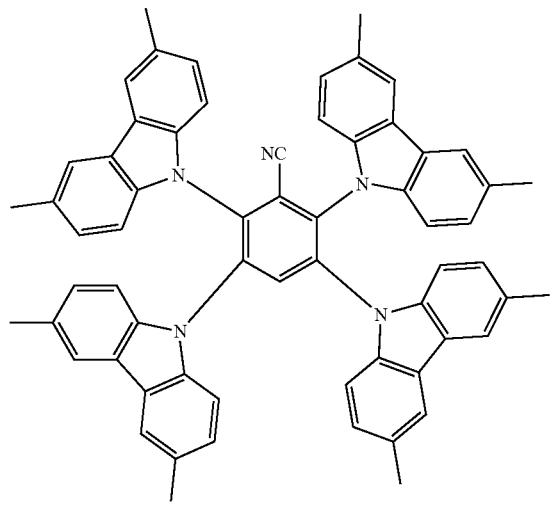
T-94
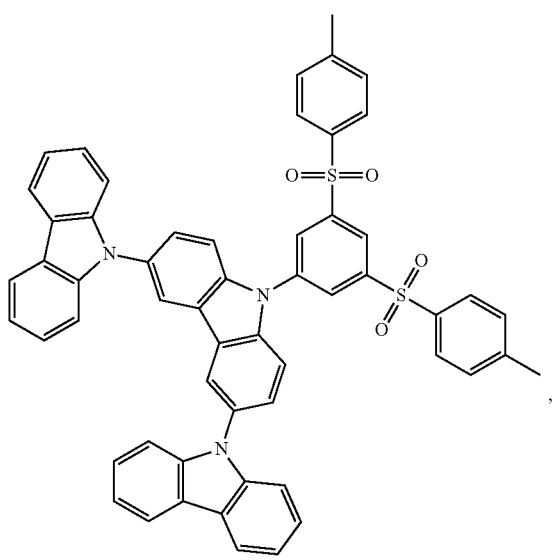
T-95
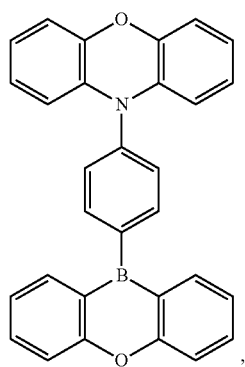
T-96
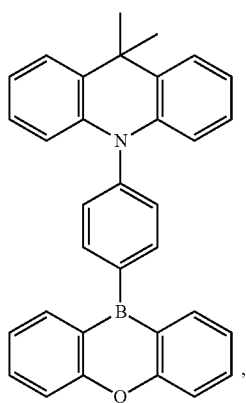
T-97

-continued
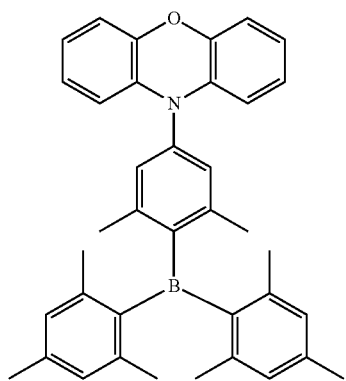
T-98
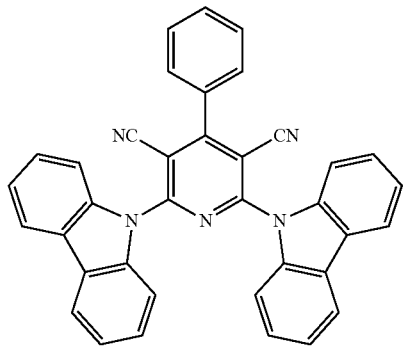
T-99
Optionally, in the organic electroluminescent device, the fluorescent dye is selected from at least one of the compounds having the structures shown below:
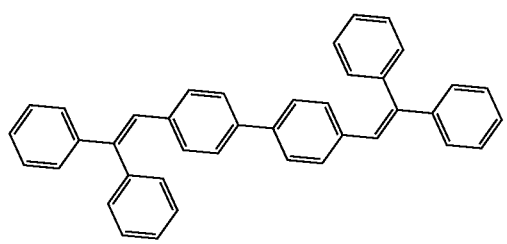
F-1
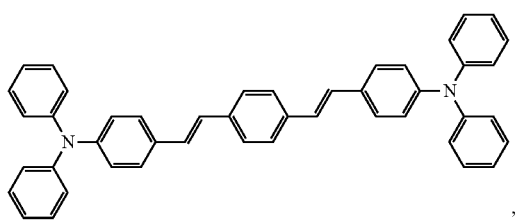
F-2
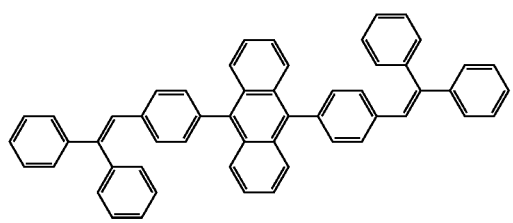
F-3
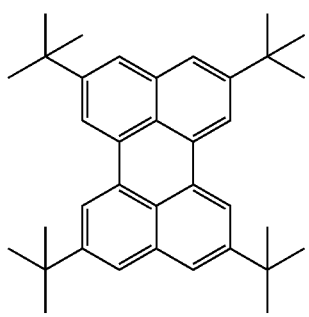
F-4
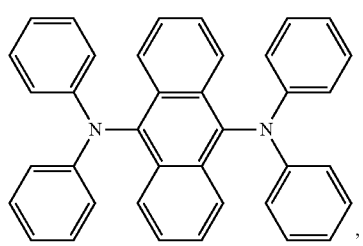
F-5
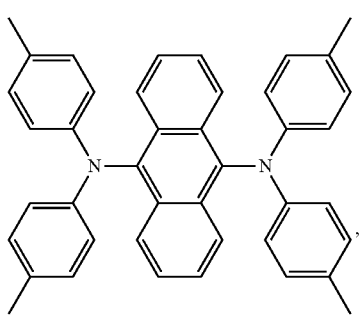
F-6

-continued
F-7
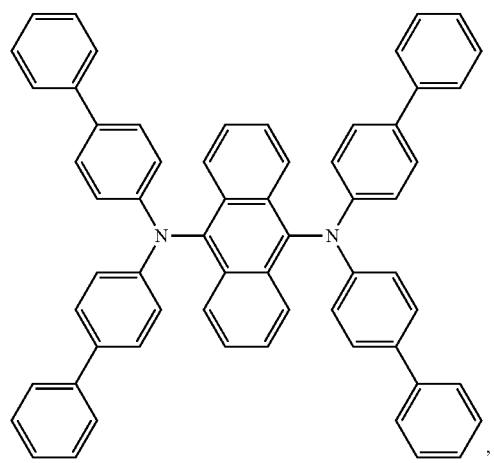
F-8
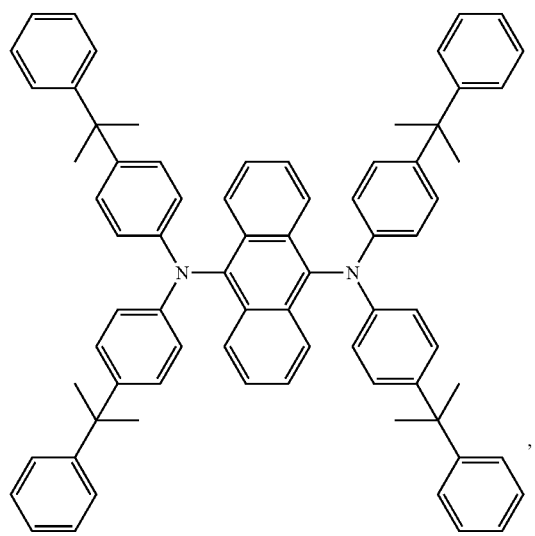
F-9
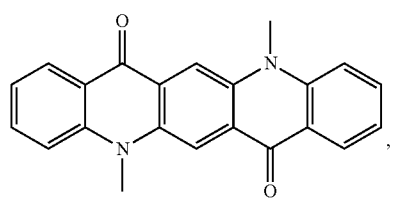
F-10
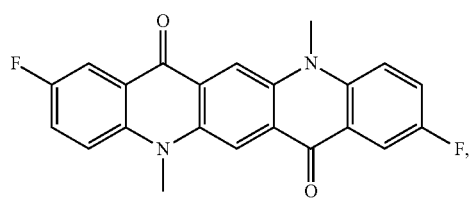
F-11
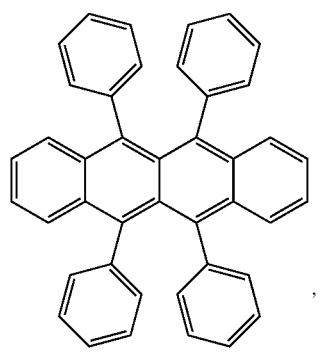
F-12
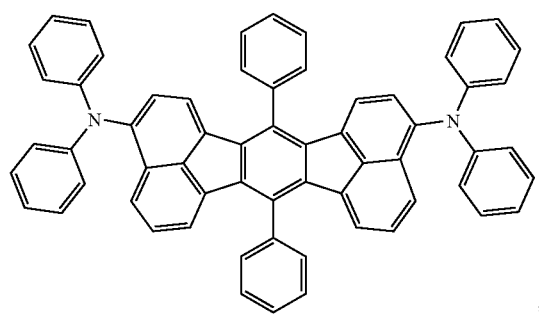
F-13
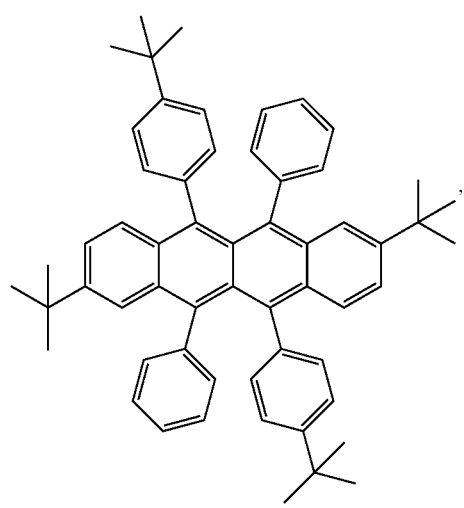
F-14
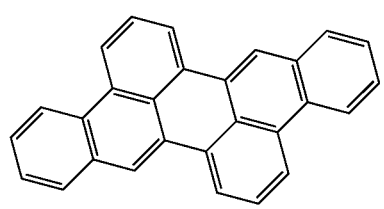

-continued
F-15
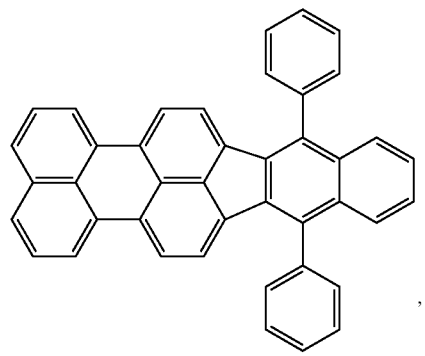
F-16
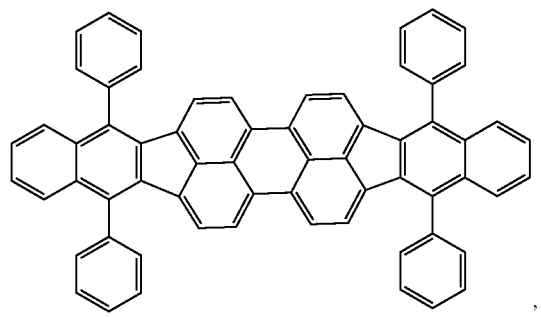
F-17
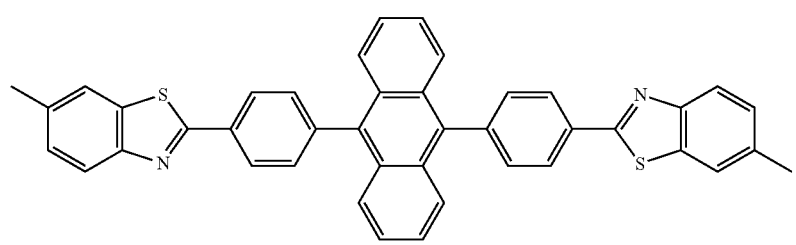
F-18
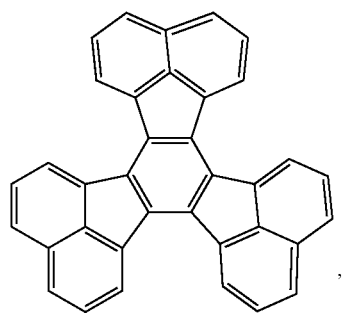
F-19
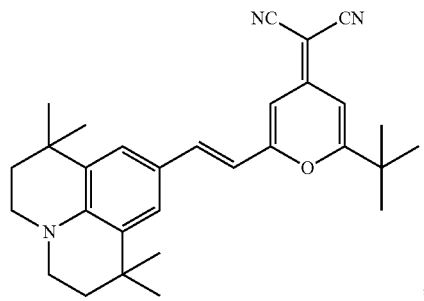
F-20
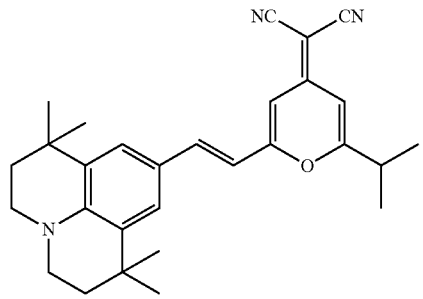
F-21
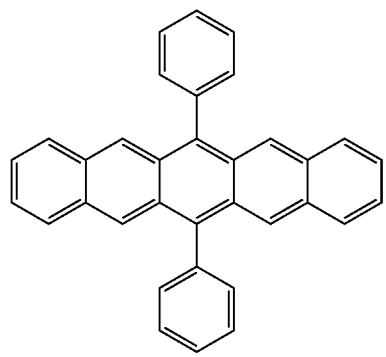
F-22
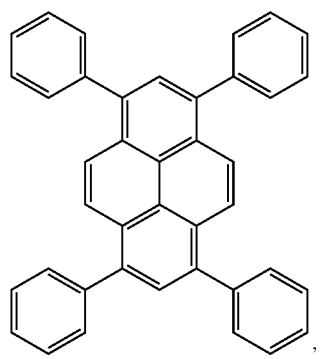
F-23
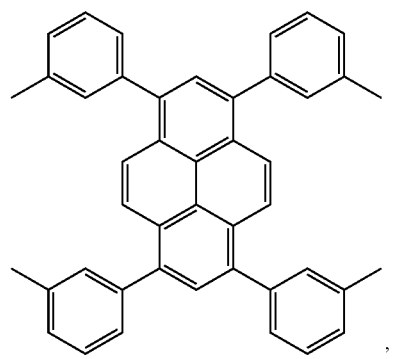

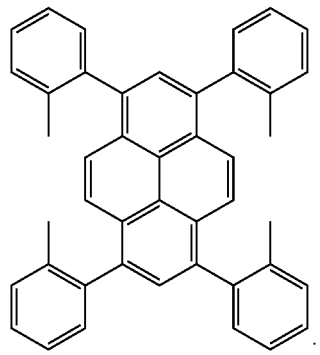

F-24

Another aspect of the present disclosure provides a method for preparing an organic electroluminescent device, comprising the steps of: sequentially preparing an anode, a hole transport layer, a light-emitting layer, an electron transport layer, and a cathode on a substrate;
  wherein, the light-emitting layer is prepared by simultaneously evaporating an electron donor material, an electron acceptor material, an auxiliary host material with thermally activated delayed fluorescence characteristics and a fluorescent dye in different evaporation sources respectively; or
  the light-emitting layer layer is prepared by pre-mixing the electron donor material and the electron acceptor material in a same evaporation source, and then simultaneously evaporating the pre-mixed electron donor material and electron acceptor material, the auxiliary host material with thermally activated delayed fluorescence characteristics and the fluorescent dye in different evaporation sources respectively.

Optionally, in the method for preparing an organic electroluminescent device, when the electron donor material and the electron acceptor material are evaporated in the same evaporation source, the absolute value of the molar mass difference between the electron donor material and the electron acceptor material is less than 100 g/mol, the absolute value of the temperature difference of the sublimation temperature between the electron donor material and the electron acceptor material is less than or equal to 20° C.

The technical solution of the present disclosure has the following advantages:

1. The material of the light-emitting layer of the organic electroluminescent device provided by the present disclosure includes a host material, an auxiliary host material and a fluorescent dye. The host material is an exciplex prepared by mixing an electron donor material and an electron acceptor material. The electron donor material has a relatively deep LUMO (Lowest Unoccupied Molecular Orbital) energy level, and the electron acceptor material has a relatively shallow HOMO (Highest Occupied Molecular Orbital) energy level. When the electron donor material and the electron acceptor material form an exciplex, the HOMO energy level and the LUMO energy level of the exciplex are derived from the electron donor material and the electron acceptor, respectively, so that the exciplex is formed into a relatively narrow band gap and a small singlet $S_1$-triplet $T_1$ energy level difference $\Delta E_{ST}$. Therefore, it is advantageous to realize transition of the triplet excitons of the host material to the singlet excitons through reverse intersystem crossing (RISC). The triplet energy level of the host material is higher than the singlet state energy level of the auxiliary host material, thereby facilitating Förster energy transfer from the singlet $S_1$ of the host material to the singlet $S_1$ of the auxiliary host material and the singlet $S_1$ of the dye, increasing effective energy transfer, improving the efficiency of organic electroluminescent devices. The auxiliary host material is a thermally activated delayed fluorescence material (TADF), which has a small singlet-triplet energy level difference, and not only can accept the energy of the host material transferred to the singlet state $S_1$ through the Förster energy transfer and transferred to the triplet $T_1$ through the short-range Dexter energy, but also can convert the triplet excitons into singlet excitons through reverse intersystem crossing (RISC), and then transfer to the singlet $S_1$ of dye through Förster energy transfer, and finally emit fluorescence by radiation transition of singlet exciton of the dye. Therefore, the Förster energy and the singlet exciton ratio are further improved, and at the same time, the triplet excitons are suppressed, the exciton loss is effectively reduced, and the luminous efficiency of the device is improved. TADF as an auxiliary material should be matched with HOMO and LUMO of the transport layer materials to avoid direct recombination of carriers on the fluorescent dye.

At the same time, the light-emitting layer formed by co-doping the exciplex as the host material with the auxiliary host material and the fluorescent dye can greatly reduce the Dexter energy transfer from the triplet $T_1$ of the host material to the triplet $T_1$ of the fluorescent dye, avoiding molecular bond cleavage caused by excessive triplet exciton energy of fluorescent dye molecules, suppressing triplet-polaron quenching (TPQ) in devices, thereby improving the lifetime of the devices, so that the organic electroluminescent devices have high external quantum efficiency, low efficiency roll-off and long lifetime, facilitating efficient use of the device for a long time.

On the other hand, due to the narrow band gap of the host material, the driving voltage of the device is lowered, which further improves the lifetime of the device and saves energy.

2. The mass ratio of the electron donor material to the electron acceptor material provided by the present disclosure can promote the interaction between molecules in an excited state and promote the formation of an exciplex having a narrow band gap.

3. The present disclosure provides a method for preparing an organic electroluminescent device, wherein the light-emitting layer is prepared by simultaneously evaporating an electron donor material, an electron acceptor material, an auxiliary host material (TADF) and a fluorescent dye in different evaporation sources respectively; or the light-emitting layer is prepared by pre-mixing the electron donor material and the electron acceptor material in a same evaporation source, and then simultaneously evaporating the pre-mixed electron donor material and electron acceptor material, the auxiliary host material with electron transport capability and hole transport capability and the dye in different evaporation sources respectively.

The above preparation method can prepare a light-emitting layer by co-doping an exciplex as a host material, an auxiliary host material and a dye via a three-source or four-source pre-mixing evaporation. The material of the light-emitting layer is uniformly dispersed between the electron transport layer and the hole transport layer, so that the organic electroluminescent device has high luminous efficiency and long lifetime.

BRIEF DESCRIPTION OF THE DRAWINGS

To describe the technical solutions of the embodiments of the present disclosure or the prior art more clearly, the following briefly introduces the accompanying drawings required for describing the embodiments or the prior art. Apparently, the accompanying drawings in the following description show some embodiments of the present disclosure, and persons skilled in the art may also derive other drawings from these accompanying drawings without creative efforts.

DETAILED DESCRIPTION OF THE INVENTION

Figure 1:
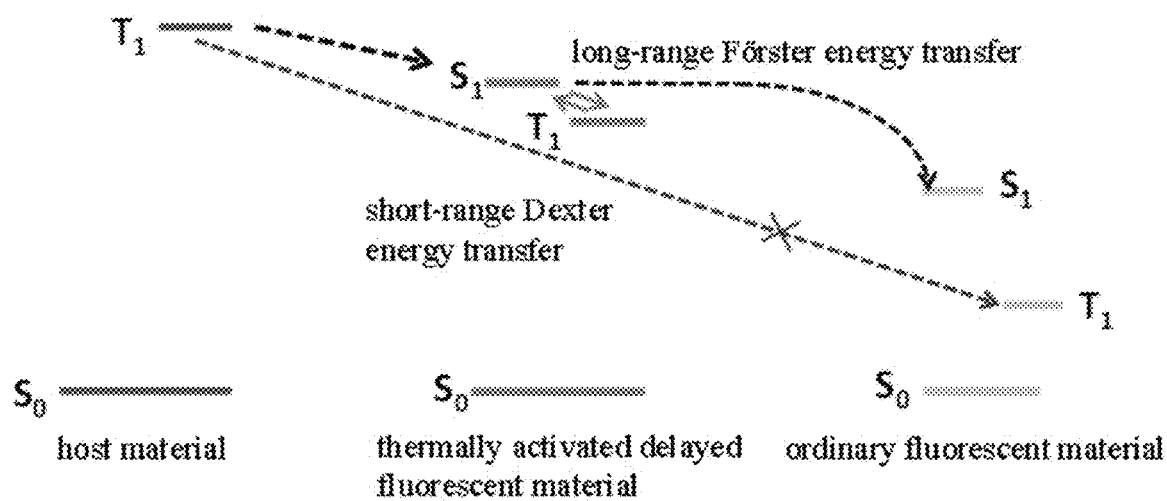
FIG. 1 is a schematic diagram showing the energy level transfer of an organic electroluminescent device in the prior art.

In an existing organic electroluminescent device, a wide band gap material is used as a host material, and a double doping system is used. There are two kinds of objects in such a system, one of which is a thermally activated delayed fluorescence (TADF) material as an auxiliary host, and the other is an ordinary fluorescent material. The principle of illumination is shown in FIG. 1. Although it can increase the Coulomb effect (Förster energy transfer) of the TADF material molecule to the fluorescent material molecule, there is energy transfer from the triplet $T_1$ of the host material to the triplet $T_1$ of the fluorescent material molecule through the exchange function (Dexter energy transfer), resulting in damage of device luminous efficiency; on the other hand, due to the wide band gap of the host material, the device has a higher driving voltage.

The technical solutions of the present disclosure are clearly and completely described in the following with reference to the accompanying drawings. It is obvious that the described embodiments are a part of the embodiments of the present disclosure, and not all of the embodiments. All other embodiments obtained by persons skilled in the art based on the embodiments of the present disclosure without creative efforts shall fall within the protection scope of the present disclosure.

In the description of the present disclosure, it is to be noted that the terms "first", "second", and "third" are used for descriptive purposes only, and are not to be construed as indicating or implying relative importance.

The present disclosure may be implemented in many different forms and should not be construed as being limited to the embodiments set forth herein. In contrast, these embodiments are provided so that the present disclosure will be thorough and complete, and the concept of the present disclosure will be fully conveyed to those skilled in the art, and the present disclosure will only be defined by the claims. In the accompanying drawings, dimensions and relative dimensions of layers and regions may be exaggerated for clarity. It should be understood that when an element such as a layer is referred to as "formed on" or "provided on" another element, the element may be provided directly on another element, or there may be an intermediate element. In contrast, when an element is refer to as "directly formed on" or "directly provided on" another element, there is no intermediate element.

Embodiment 1

The present embodiment provides an organic electroluminescent device including a light-emitting layer. The light-emitting layer is formed by co-doping a host material, a TADF auxiliary host material and a fluorescent dye. The host material is an exciplex formed by mixing an electron donor material and an electron acceptor material.

The electron donor material has a molecular structure shown below:

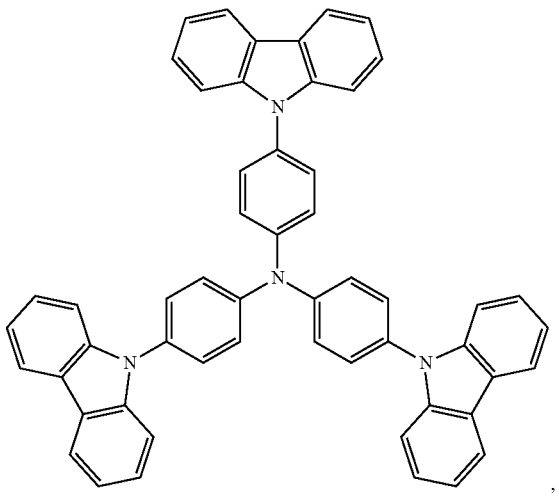

D-1 the electron acceptor material has a molecular structure shown below:

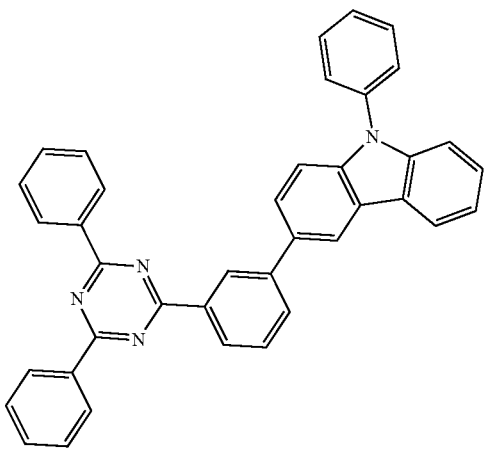

A-19

Figure 2:
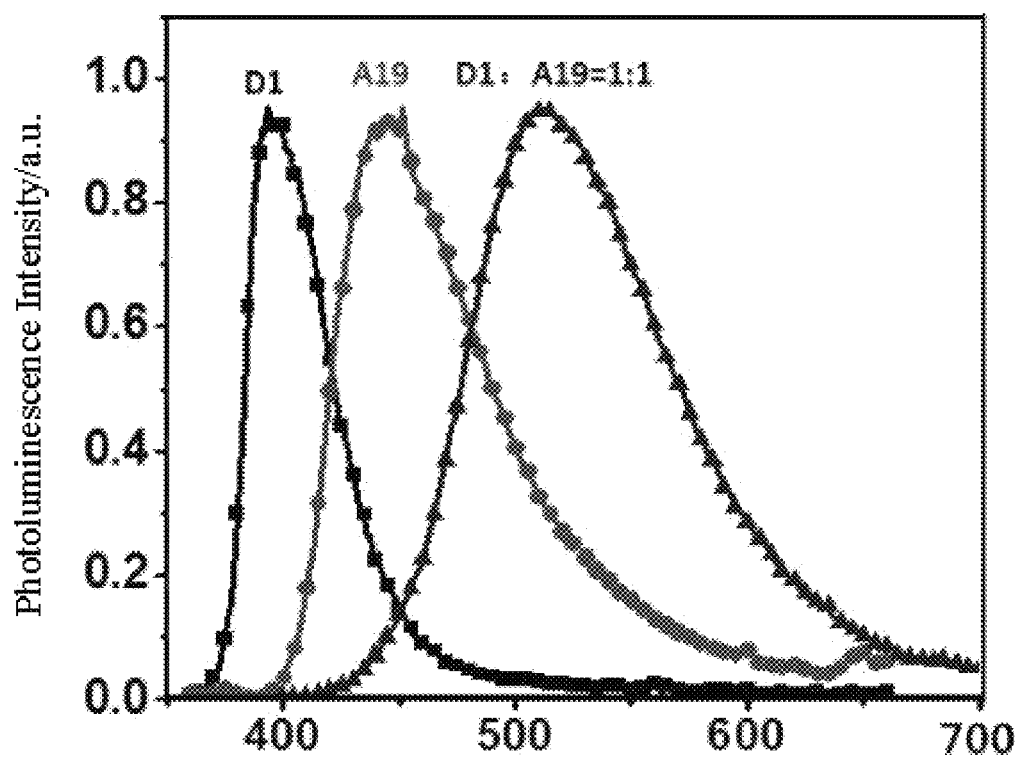
FIG. 2 is fluorescence spectra (emission spectrum) of an electron donor material, an electron acceptor material, and a mixture of them, according to Embodiment 1 of the present disclosure.

As shown in FIG. 2, the spectrum of the mixture of the electron donor material and the electron acceptor material are significantly red-shifted as compared with the emission spectra of the electron donor material and the electron acceptor material, indicating that they form an exciplex.

The TADF auxiliary host material (PXZ-DPS) has a molecular structure (T-31) shown below:

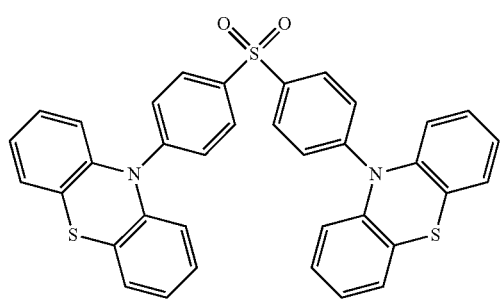

T-31 the fluorescent dye (YH201) has a molecular structure (F-8) shown below:

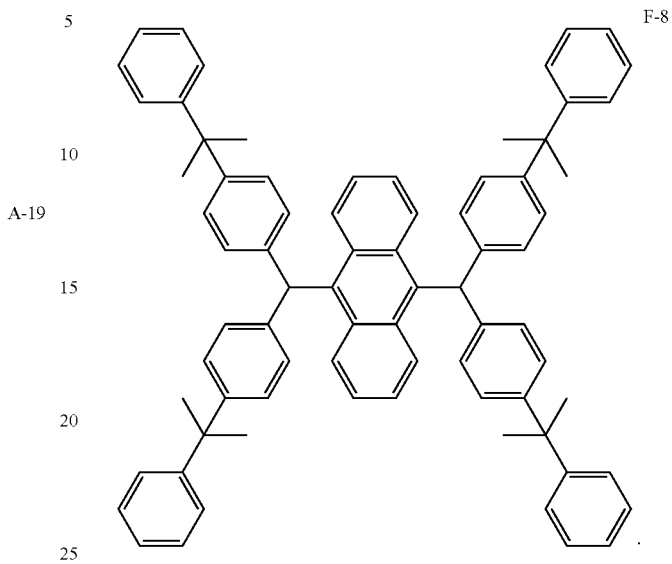

F-8

The singlet $S_1$ and the triplet $T_1$ energy levels of the host material are higher than the singlet $S_1$ and the triplet $T_1$ energy levels of the TADF auxiliary host material. The singlet $S_1$ and the triplet $T_1$ energy levels of the TADF auxiliary host material are higher than the singlet $S_1$ and the triplet $T_1$ energy levels of the fluorescent dye. The singlet $S_1$ and triplet $T_1$ energy levels of the electron donor material and the singlet $S_1$ and triplet $T_1$ energy levels of the electron acceptor material are higher than the singlet $S_1$ and triplet $T_1$ energy levels of the exciplex.

The organic electroluminescent device has a first electrode 1, a second electrode 2, and an organic functional layer 3 between the first electrode 1 and the second electrode 2. The first electrode 1 is an anode, the second electrode 2 is a cathode, and the organic functional layer 3 includes a hole transport layer 31, a light-emitting layer 32, and an electron transport layer 33 which are laminated.

Figure 3:
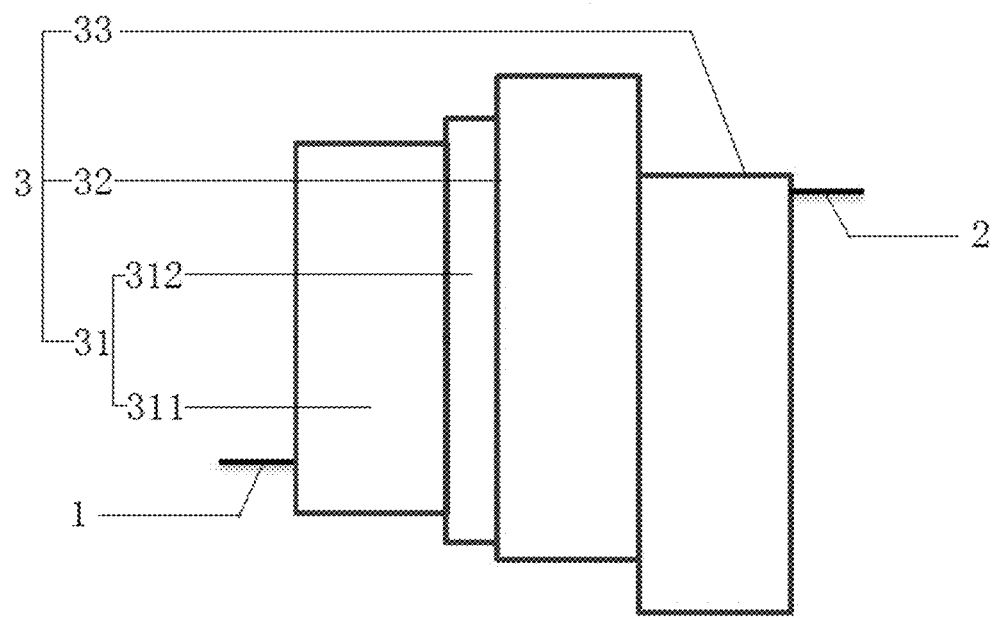
FIG. 3 is a schematic structural view of an organic electroluminescent device according to Embodiment 1 of the present disclosure.

As an alternative embodiment, as shown in FIG. 3, the anode of the organic electroluminescent device is made of ITO material; and the hole transport layer 31 is made of a hole transport material: 4,4'-cyclohexyl-bis[N,N-bis(4-methylphenyl)]aniline (abbreviation: TAPC) and 4,4',4'-tris(carbazol-9-yl)triphenylamine (abbreviation: TCTA), corresponding to the formation of laminated structure of the first hole transport material region 311 and the second hole transport material region 312; the electron transport layer 33 is made of 4,7-diphenyl-1,10-phenanthroline (abbreviation: Bphen) that is a electron transport type material; the cathode is made of an electron injection material LiF and a cathode material Al to form an electron injection layer/metal layer structure: LiF/Al.

In the organic electroluminescent device, the host material of the light-emitting layer is a bulk exciplex formed by mixing an electron acceptor material and an electron donor material in a mass ratio of 1:1, and the mass ratio for the TADF auxiliary host doping is 30 wt %. The mass ratio for the fluorescent dye doping is 3 wt %. The specific structure of the organic electroluminescent device is as follows: ITO/TAPC (30 nm)/TCTA (10 nm)/host (D-1-A19 1:1): 30 wt % PXZ-DPS (TADF): 3 wt % YH201 (F)/Bphen (40 nm)/LiF (0.5 nm)/Al (150 nm).

Figure 4:
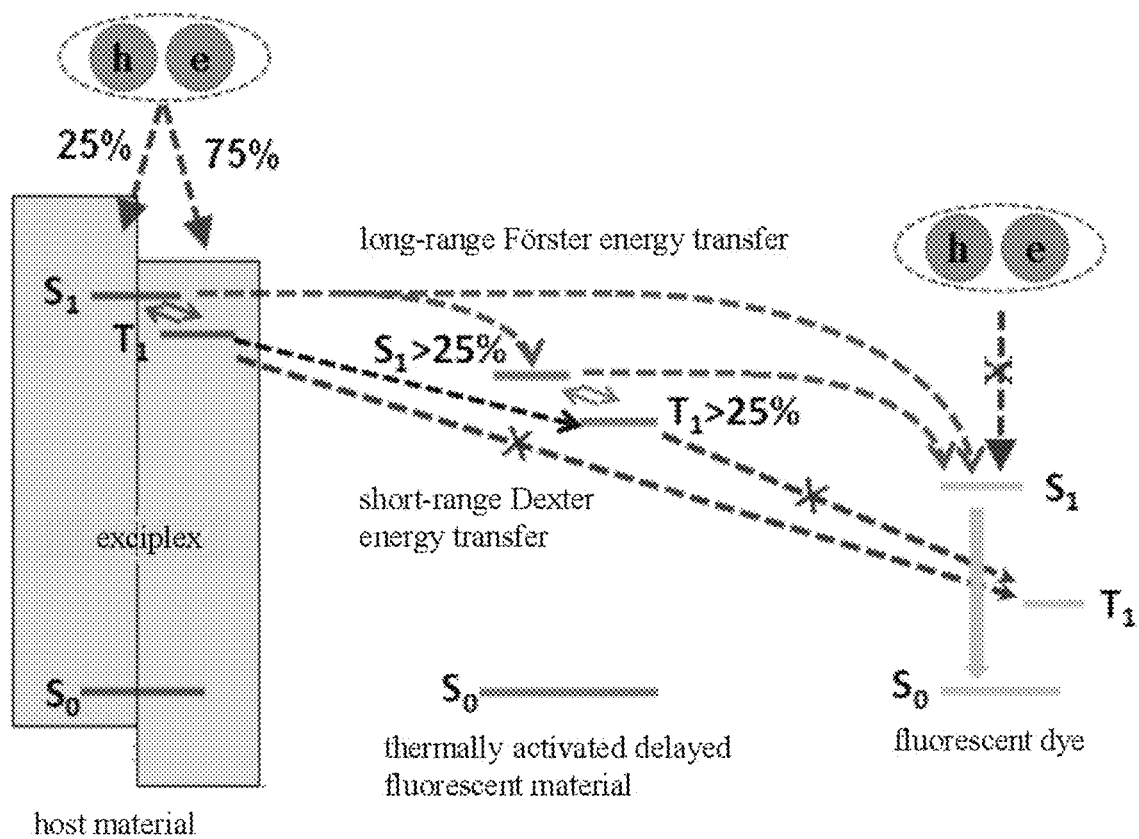
FIG. 4 is a schematic diagram of energy level transfer of an organic electroluminescent device in the present disclosure.

The luminescence mechanism of the above organic electroluminescent device is shown in FIG. 4: the host material formed by the bulk exciplex has a relatively narrow band gap and a small singlet-triplet energy level difference $\Delta E_{ST}$. The carriers recombined in the host material can be converted from triplet excitons to singlet excitons by reverse intersystem crossing (RISC) transition. The triplet energy level of the host material is higher than the singlet energy level of the TADF auxiliary host material, which can promote the Förster energy transfer from the singlet $S_1$ of the host material to the singlet $S_1$ of the auxiliary host material and the singlet $S_1$ of the fluorescent dye, thereby increasing the effective energy transfer, improving the efficiency of organic electroluminescent devices. The TADF auxiliary host material matches the HOMO energy level and the LUMO energy level of the transport layer material to avoid direct recombination of carriers on the fluorescent dye. The TADF auxiliary host material has a small singlet-triplet energy level difference, which not only can accept the energy of the host material transferred to the singlet state $S_1$ through the Förster energy transfer and transferred to the triplet $T_1$ through the short-range Dexter energy, but also can convert the triplet excitons into singlet excitons through reverse intersystem crossing (RISC), and then transfer to the singlet $S_1$ of fluorescent dye through Förster energy transfer, and finally emit fluorescence by radiation transition of the singlet exciton of the fluorescent dye, further improving the Förster energy and singlet exciton ratio, suppressing the triplet excitons, avoiding the efficiency roll-off effect of the organic electroluminescent device, and improving the external quantum efficiency of the device, thereby achieving high device efficiency.

In addition, the exciplex as the host material can reduce the Dexter energy transfer from the triplet $T_1$ of the host material to the triplet $T_1$ of the fluorescent dye, avoid the molecular bond cleavage caused by the excessive triplet exciton energy of the fluorescent dye molecule, and suppress the triplet-polaron quenching (TPQ) in the device, thereby improving the lifetime of device and achieving efficient use of the device for a long time.

Embodiment 2

The present embodiment provides an organic electroluminescent device having the same structure as that of Embodiment 1, except that the electron donor material of the formed exciplex has the structure shown by the following D-2:

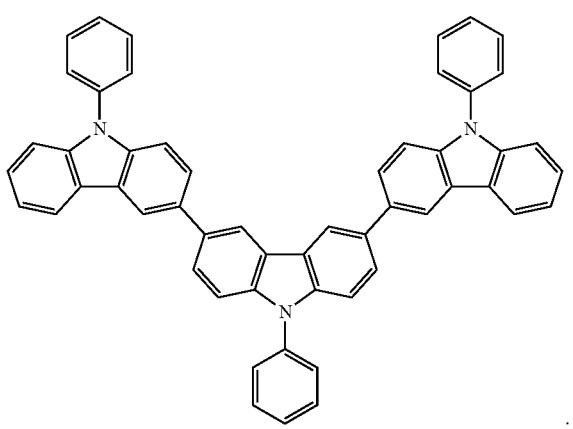

D-2

The structure of the organic electroluminescent device is as follows: ITO/TAPC (30 nm)/TCTA (10 nm)/host (D-2-A19 1:1): 30 wt % PXZ-DPS (TADF): 3 wt % YH201 (F)/Bphen (40 nm)/LiF (0.5 nm)/Al (150 nm).

Embodiment 3

The present embodiment provides an organic electroluminescent device having the same structure as that of Embodiment 1, except that the electron acceptor material of the formed exciplex has the structure shown by the following A-35:

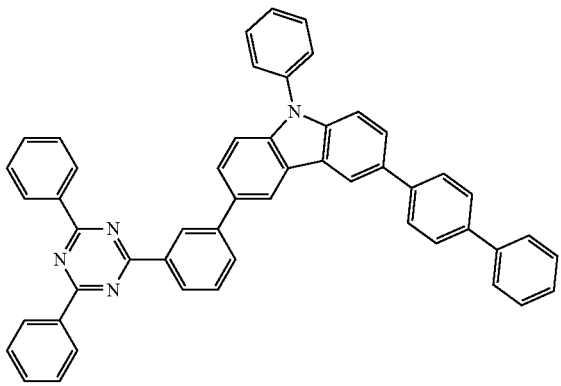

A-35

The structure of the organic electroluminescent device is as follows: ITO/TAPC (30 nm)/TCTA (10 nm)/host (D-1-A-35 1:1): 30 wt % PXZ-DPS (TADF): 3 wt % YH201 (F)/Bphen (40 nm)/LiF (0.5 nm)/Al (150 nm).

Embodiment 4

The embodiment provides an organic electroluminescent device having the same structure as that of Embodiment 3, except that the electron donor material D-1 and the electron acceptor material A-35 of the formed exciplex are placed in the same evaporation source for pre-mixing, and the specific structure of the organic electroluminescent device is as follows: ITO/TAPC (30 nm)/TCTA (10 nm)/host (D-1-A-35 1:1): 30 wt % PXZ-DPS (TADF): 3 wt % YH201(F)/Bphen (40 nm)/LiF (0.5 nm)/Al (150 nm).

Embodiment 5

The present embodiment provides an organic electroluminescent device, which is different from Embodiment 1 in that: the electron donor material has a structure shown by D-11, and the electron acceptor material has a structure shown by A-10, and the mass ratio of the electron donor material to the electron acceptor material is 1:9; the thermally activated delayed fluorescence material has a structure shown by T-1, the doping ratio of TADF is 5 wt %, and the fluorescent dye has a structure shown by F-12, the doping ratio of the fluorescent dye is 0.1 wt %. The device has an external quantum efficiency of 19.5% and a chromaticity coordinate of (0.50, 0.50) at a brightness of 10000 cd/m$^2$.

Embodiment 6

The present embodiment provides an organic electroluminescent device, which is different from Embodiment 1 in that: the electron donor material has a structure shown by D-3, and the electron acceptor material has a structure shown by A-26, and the mass ratio of the electron donor material to the electron acceptor material is 9:1; the thermally activated delayed fluorescence material has a structure shown by T-5, the doping ratio of TADF is 80 wt %, and the fluorescent dye has a structure shown by F-5, the doping ratio of the fluorescent dye is 1 wt %. The device has an external quantum efficiency of 15.8% and a chromaticity coordinate of (0.36, 0.57) at a brightness of 10000 cd/m$^2$.

Embodiment 7

The present embodiment provides an organic electroluminescent device, which is different from Embodiment 1 in that: the electron donor material has a structure shown by D-4, and the electron acceptor material has a structure shown by A-3, and the mass ratio of the electron donor material to the electron acceptor material is 1:3; the thermally activated delayed fluorescence material has a structure shown by T-17, the doping ratio of TADF is 4 wt %, and the fluorescent dye has a structure shown by F-7, the doping ratio of the fluorescent dye is 10 wt %. The device has an external quantum efficiency of 16.2% and a chromaticity coordinate of (0.36, 0.57) at a brightness of 10000 cd/m$^2$.

Embodiment 8

The present embodiment provides an organic electroluminescent device, which is different from Embodiment 1 in that: the electron donor material has a structure shown by D-7, and the electron acceptor material has a structure shown by A-7, and the mass ratio of the electron donor material to the electron acceptor material is 4:1; the thermally activated delayed fluorescence material has a structure shown by T-31, the doping ratio of TADF is 15 wt %, and the fluorescent dye has a structure shown by F-6, the doping ratio of the fluorescent dye is 10 wt %. The device has an external quantum efficiency of 17.8% and a chromaticity coordinate of (0.37, 0.58) at a brightness of 10000 cd/m$^2$.

Embodiment 9

The present embodiment provides an organic electroluminescent device, which is different from Embodiment 1 in that: the electron donor material has a structure shown by D-12, and the electron acceptor material has a structure shown by A-16, and the mass ratio of the electron donor material to the electron acceptor material is 1:5; the thermally activated delayed fluorescence material has a structure shown by T-50, the doping ratio of TADF is 65 wt %, and the fluorescent dye has a structure shown by F-9, the doping ratio of the fluorescent dye is 5 wt %. The device has an external quantum efficiency of 15.1% and a chromaticity coordinate of (0.44, 0.55) at a brightness of 10000 cd/m$^2$.

Embodiment 10

The present embodiment provides an organic electroluminescent device, which is different from Embodiment 1 in that: the electron donor material has a structure shown by D-15, and the electron acceptor material has a structure shown by A-17, and the mass ratio of the electron donor material to the electron acceptor material is 2:1; the thermally activated delayed fluorescence material has a structure shown by T-66, the doping ratio of TADF is 70 wt %, and the fluorescent dye has a structure shown by F-10, the doping ratio of the fluorescent dye is 8 wt %. The device has an external quantum efficiency of 14.6% and a chromaticity coordinate of (0.43, 0.55) at a brightness of 10000 cd/m$^2$.

Embodiment 11

The present embodiment provides an organic electroluminescent device, which is different from Embodiment 1 in that: the electron donor material has a structure shown by D-18, and the electron acceptor material has a structure shown by A-21, and the mass ratio of the electron donor material to the electron acceptor material is 1:8; the thermally activated delayed fluorescence material has a structure shown by T-70, the doping ratio of TADF is 25 wt %, and the fluorescent dye has a structure shown by F-19, the doping ratio of the fluorescent dye is 0.5 wt %. The device has an external quantum efficiency of 13.8% and a chromaticity coordinate of (0.59, 0.41) at a brightness of 10000 cd/m$^2$.

Embodiment 12

The present embodiment provides an organic electroluminescent device, which is different from Embodiment 1 in that: the electron donor material has a structure shown by D-19, and the electron acceptor material has a structure shown by A-32, and the mass ratio of the electron donor material to the electron acceptor material is 3:1; the thermally activated delayed fluorescence material has a structure shown by T-76, the doping ratio of TADF is 30 wt %, and the fluorescent dye has a structure shown by F-20, the doping ratio of the fluorescent dye is 1 wt %. The device has an external quantum efficiency of 13.5% and a chromaticity coordinate of (0.59, 0.40) at a brightness of 10000 cd/m$^2$.

Embodiment 13

The present embodiment provides an organic electroluminescent device, which is different from Embodiment 1 in that: the electron donor material has a structure shown by D-16, and the electron acceptor material has a structure shown by A-33, and the mass ratio of the electron donor material to the electron acceptor material is 6:1; the thermally activated delayed fluorescence material has a structure shown by T-99, the doping ratio of TADF is 50 wt %, and the fluorescent dye has a structure shown by F-11, the doping ratio of the fluorescent dye is 2 wt %. The device has an external quantum efficiency of 14.2% and a chromaticity coordinate of (0.49, 0.50) at a brightness of 10000 cd/m$^2$.

In the above embodiments, the electron donor material, the electron acceptor material, the auxiliary host material, and the fluorescent dye are simultaneously evaporated in different evaporation sources to form a light-emitting layer; or the electron donor material and the electron acceptor material after being pre-mixed in the same evaporation source are evaporated simultaneously with the auxiliary host material and the fluorescent dye in different evaporation sources to form a light-emitting layer.

As an alternative embodiment, the electron donor material in the above embodiment may be replaced with an electron donor material having any of the structures shown by D-1 to D-19.

As an alternative embodiment, the electron acceptor material in the above embodiment may be replaced with an electron acceptor material having any of the structures shown by A-1 to A-35.

As an alternative embodiment, the thermally activated delayed fluorescence material in the above embodiment may be replaced with a thermally activated delayed fluorescence material having any of the structures shown by T-1 to T-99.

As an alternative embodiment, the fluorescent dye in the above embodiment may be replaced with a fluorescent dye having any of the structures shown by F-1 to F-24.

As an alternative embodiment, the mass ratio of the electron donor material to the electron acceptor material in the above embodiment may be any ratio ranging from 1:9 to 9:1.

As an alternative embodiment, the doping ratio of TADF in the above embodiment may be any ratio ranging from 5 wt % to 80 wt %.

As an alternative embodiment, the doping ratio of the fluorescent dye in the above embodiment may be any ratio ranging from 0.1 wt % to 10 wt %.

Comparative Example 1

The present comparative example provides an organic electroluminescent device having the same structure as that of Embodiment 1. This organic electroluminescent device differs from the organic electroluminescent device provided in Embodiment 1 only in that the host material in the light-emitting layer is host mCBP with a wide band gap. mCBP has the structure shown below:

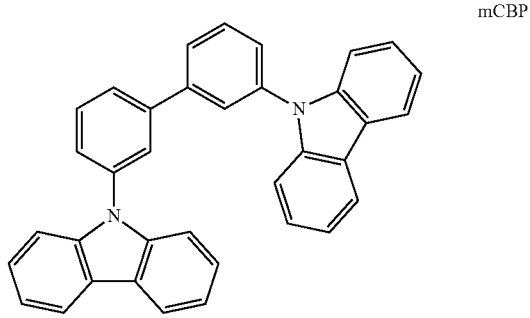 [SMILES: c1cc(-c2cccc(-n3c4ccccc4c4ccccc43)c2)cc(-n2c3ccccc3c3ccccc32)c1]

mCBP

Test Example 1

Figure 5:
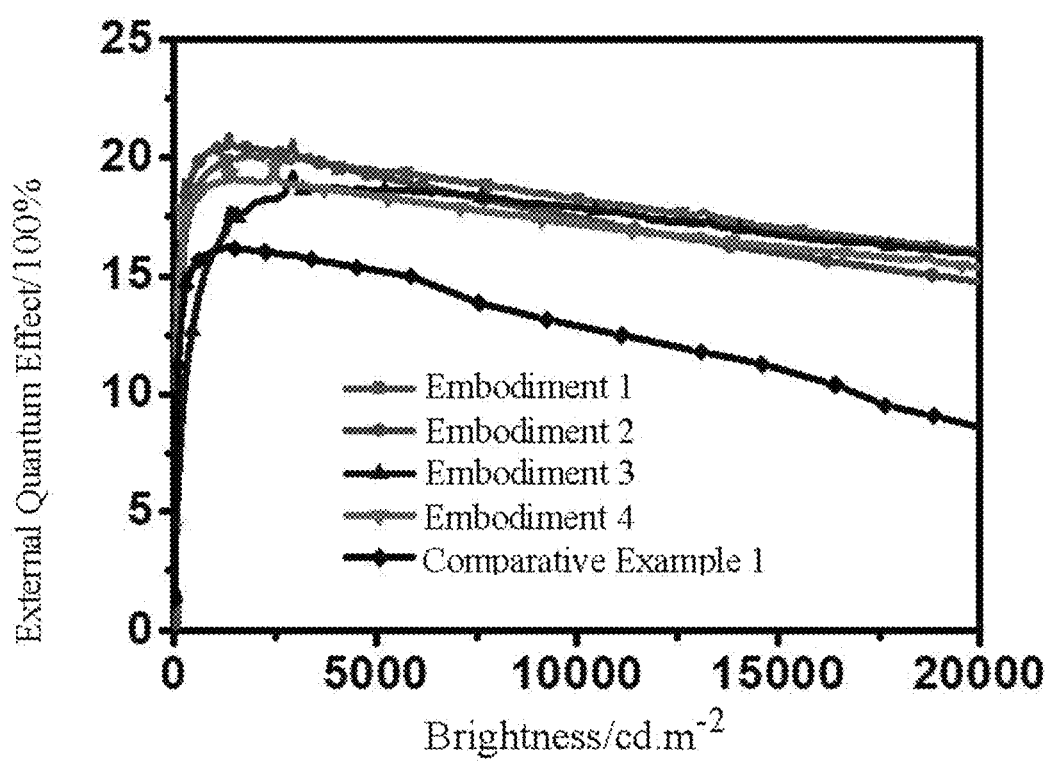
FIG. 5 is a test spectrum of organic electroluminescent devices in Embodiments 1-4 and Comparative Example 1 of the present disclosure.

Characteristics of the device such as current, voltage, brightness, and luminescence spectra etc. were tested simultaneously using a PR 650 spectral scanning luminance meter and a Keithley K 2400 source meter system. The organic electroluminescent devices provided in Embodiments 1-4 and Comparative Example 1 were tested, and the results are shown in Table 1 and FIG. 5. The external quantum efficiency (EQE) of the devices provided in Embodiments 1-4 was greater than that of the device in Comparative Example 1, and the efficiency roll-off was smaller than that of the device in Comparative Example 1.

TABLE 1

| | Driving voltage/V brightness 5000 cd/m$^2$ | Chromaticity coordinate CIE (x, y) | External quantum efficiency (%), at a brightness of 5000 cd/m$^2$ | External quantum efficiency (%), at a brightness of 10000 cd/m$^2$ | roll-off |
|---|---|---|---|---|---|
| Embodiment 1 | 3.60 | (0.36, 0.58) | 19.4 | 18.5 | 4.64% |
| Embodiment 2 | 3.62 | (0.36, 0.58) | 19.0 | 17.8 | 6.31% |
| Embodiment 3 | 3.70 | (0.36, 0.58) | 18.6 | 17.9 | 3.76% |
| Embodiment 4 | 3.82 | (0.36, 0.58) | 18.4 | 17.2 | 6.52% |
| Comparative Example 1 | 5.20 | (0.36, 0.58) | 15.1 | 13.0 | 14.47% |

It is apparent that the above-described embodiments are merely examples for clear descriptions, but not intended to limit the implementations. Other changes or variations of the various forms may be made by those skilled in the art based on the above description. There is no need and no way to exhaust all of the implementations. Obvious changes or variations resulting therefrom are still within the scope of the disclosure.

The invention claimed is:

1. An organic electroluminescent device comprising:
a light-emitting layer, the light-emitting layer including:
a host material that is an exciplex formed by an electron donor material and an electron acceptor material, wherein the electron donor material comprises:

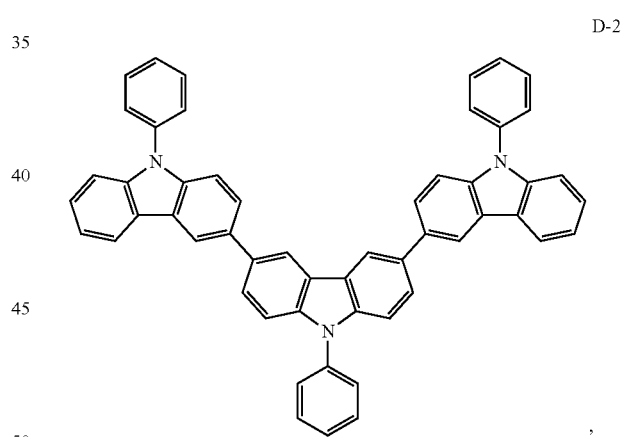

D-2 wherein the electron acceptor material is a compound containing a triazine group;
an auxiliary host material that is a thermally activated delayed fluorescence material; and
a fluorescent dye;
wherein the triplet energy level ($T_1$) of the exciplex is higher than the singlet energy level ($S_1$) of the auxiliary host material, the triplet energy level ($T_1$) of the auxiliary host material is higher than the singlet energy level ($S_1$) of the fluorescent dye, an energy level difference between the singlet energy level ($S_1$) and the triplet energy level ($T_1$) of the exciplex is less than 0.15 eV, and the exciplex has a band gap narrower than the band gap of mCBP.

2. The organic electroluminescent device of claim 1, wherein the triplet energy level ($T_1$) of the electron donor material and the triplet energy level (T₁) of the electron acceptor material are respectively higher than the triplet energy level (T₁) of the exciplex.

3. The organic electroluminescent device of claim 1, wherein a mass ratio of the electron donor material to the electron acceptor material is between 1:9 and 9:1.

4. The organic electroluminescent device of claim 1, wherein a doping ratio of the auxiliary host material is between 5 wt % and 80 wt %, and a doping ratio of the fluorescent dye is between 0.1 wt % and 10 wt %.

5. The organic electroluminescent device of claim 1, wherein an energy level difference between the singlet energy level (S₁) and the triplet energy level (T₁) of the auxiliary host material is less than 0.3 eV.

6. The organic electroluminescent device of claim 1, wherein the electron acceptor material is selected from at least one of the compounds having the structures shown below:

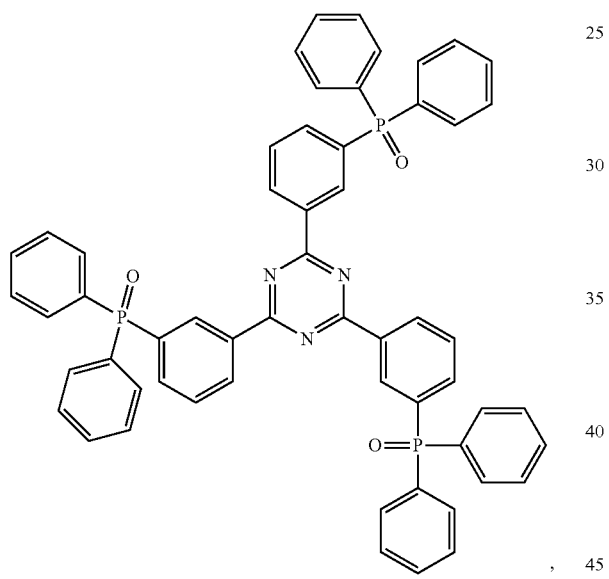

A-6

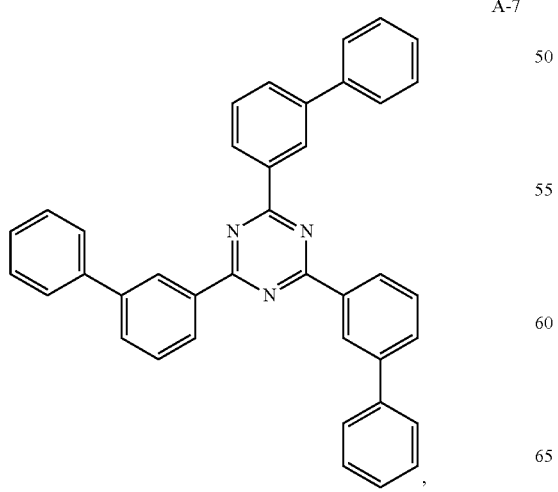

A-7

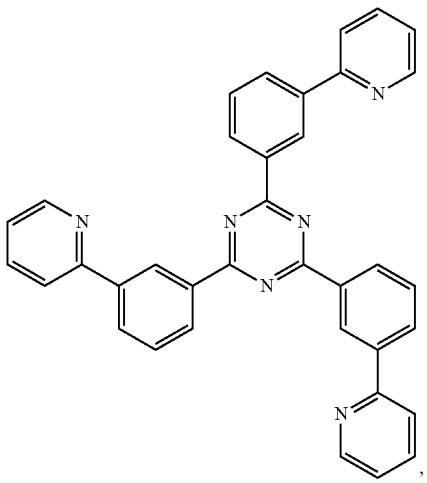

A-8

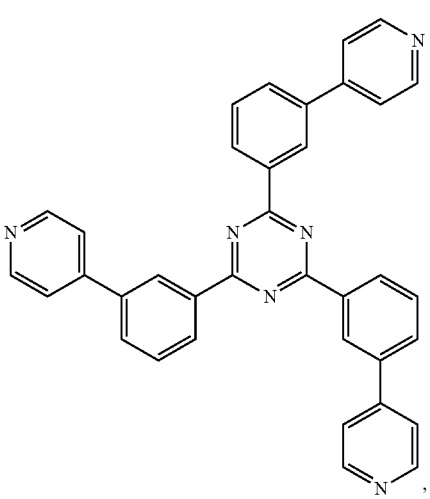

A-9

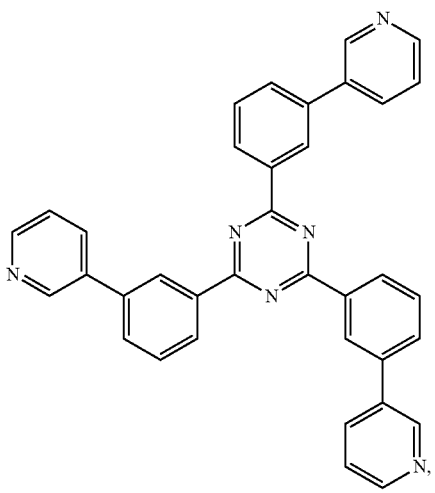

A-10

A-11
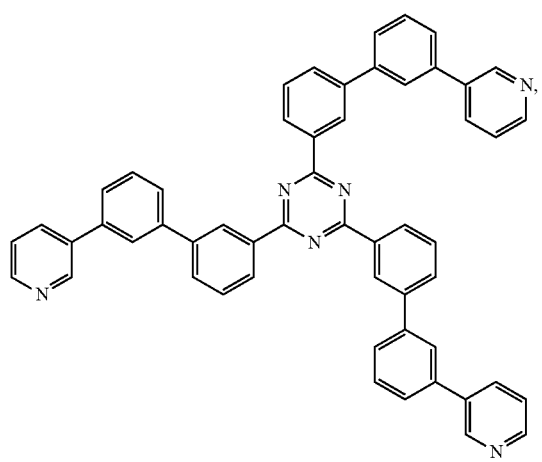
A-12
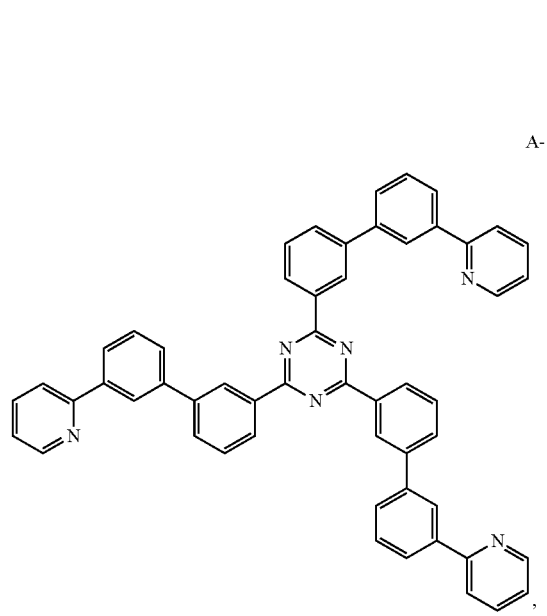
A-13
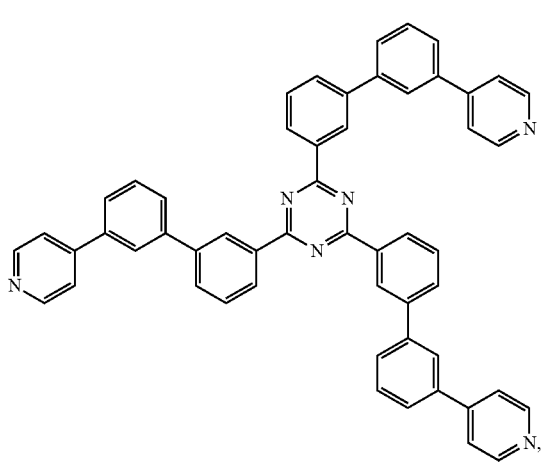
A-14
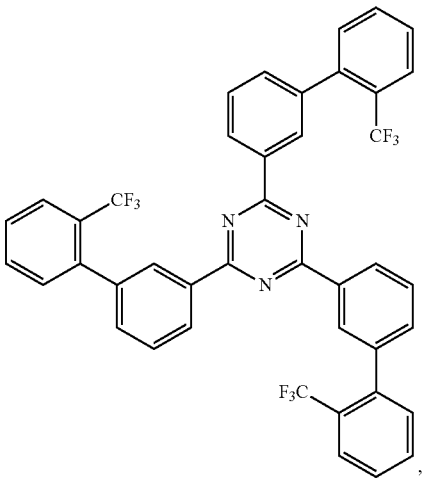
A-15
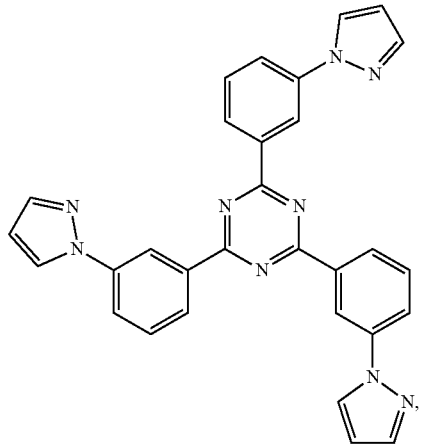
A-17
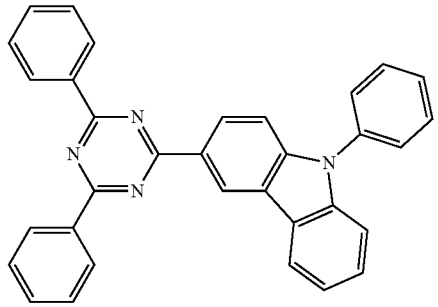
A-18
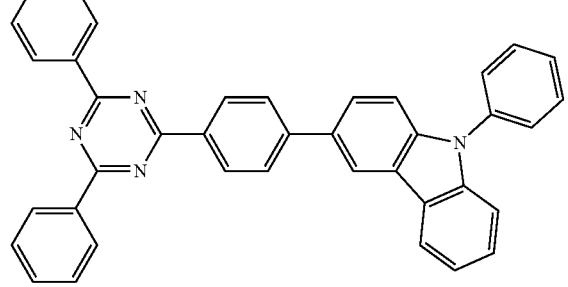

-continued
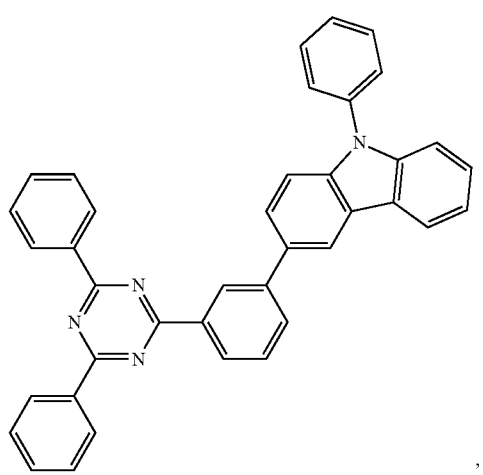
A-19
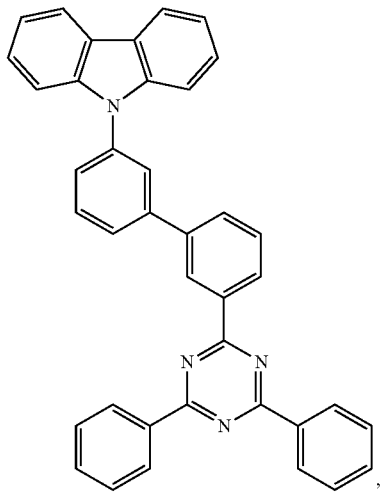
A-24
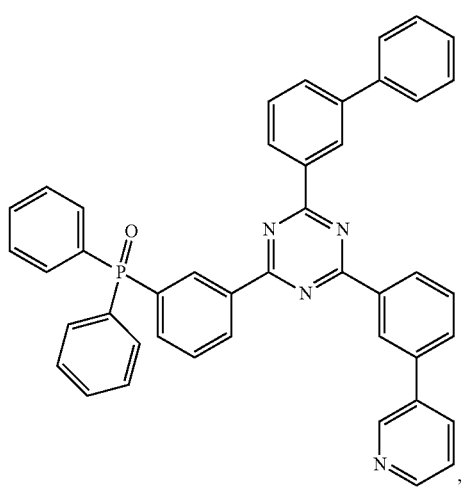
A-22
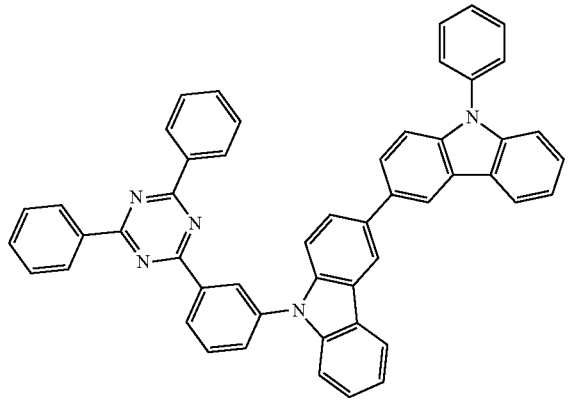
A-25
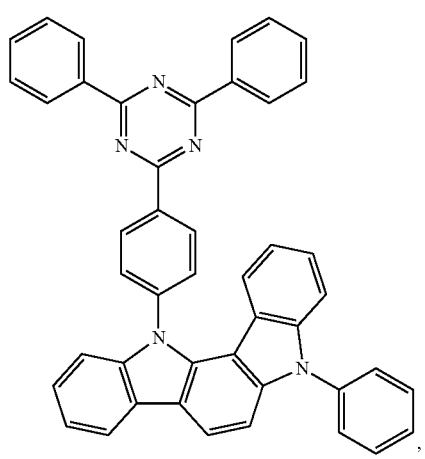
A-23
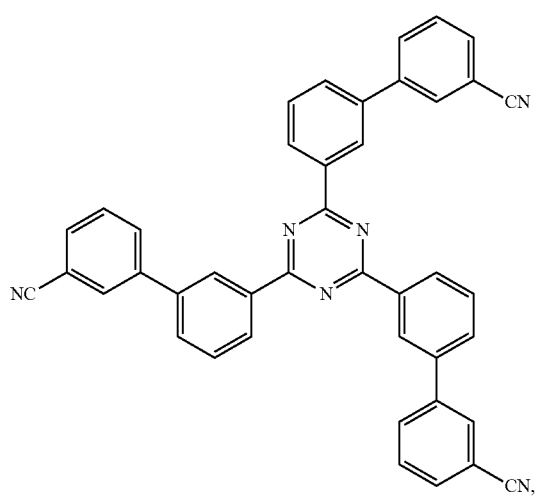
A-26

A-28
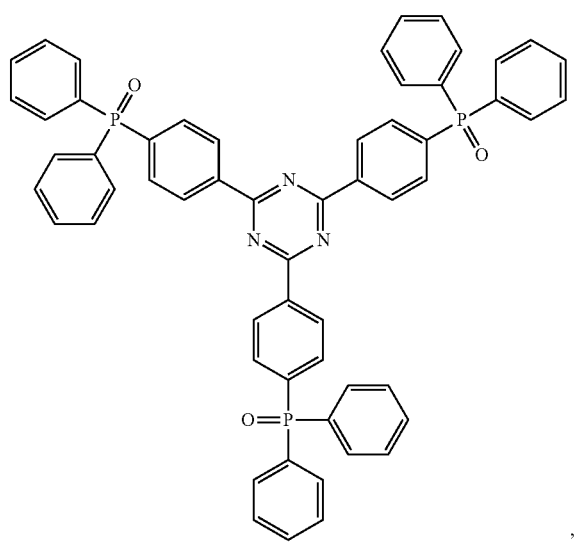
A-29
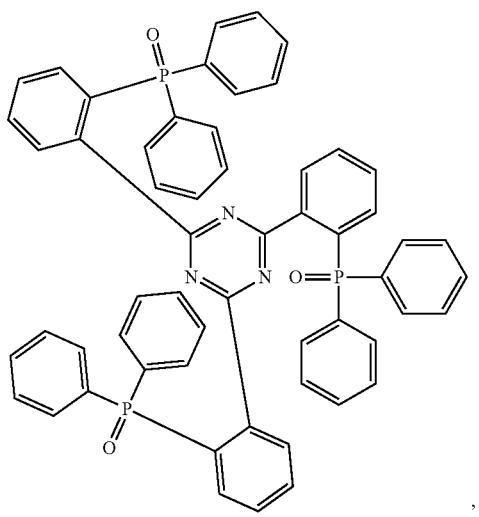
A-34
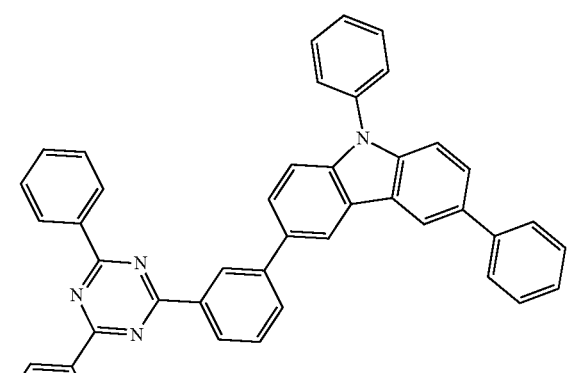
and
A-35
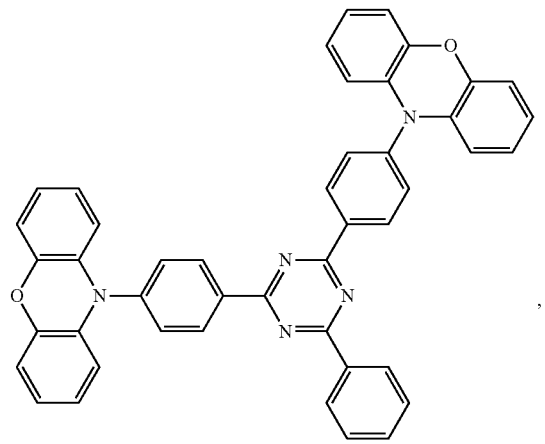
7. The organic electroluminescent device of claim 1, wherein the thermally activated delayed fluorescence material is selected from at least one of compounds of structures shown below:
T-1
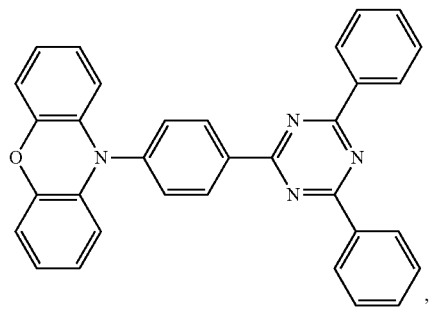
T-2
, -continued
T-3
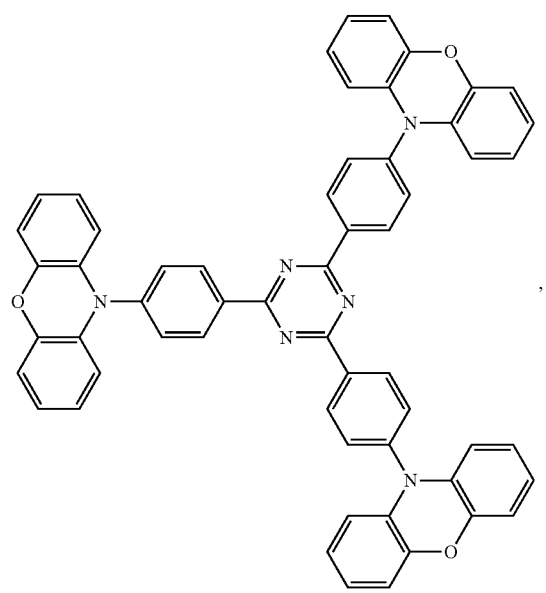
T-4
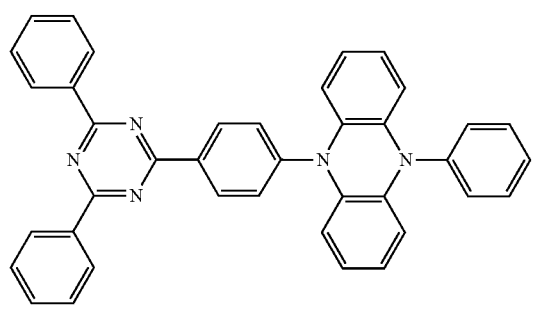
T-5
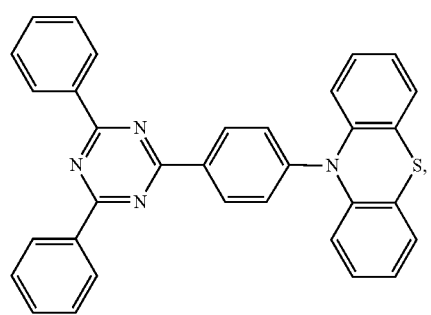
T-6
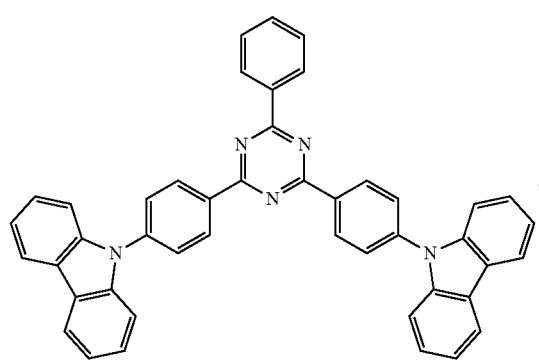
T-7
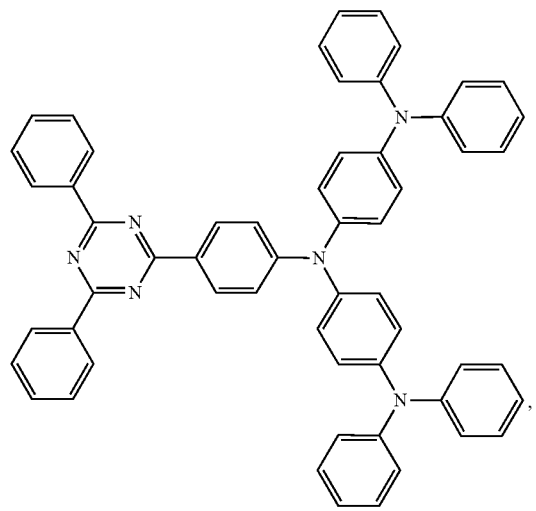
T-8
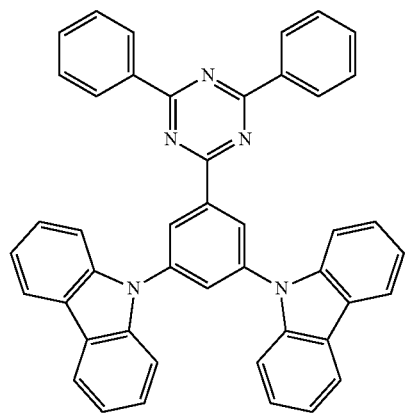

-continued
T-9
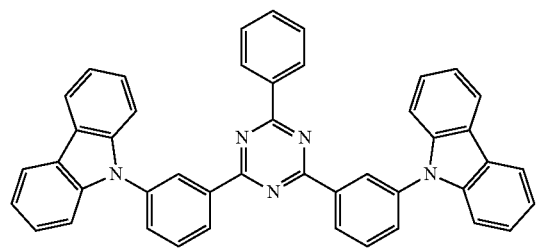
T-10
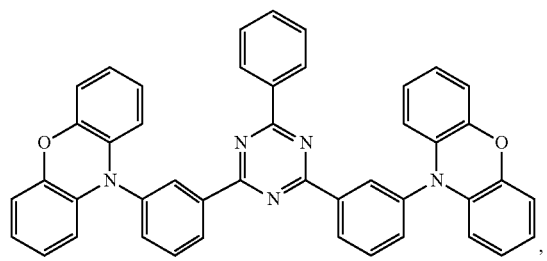
T-11
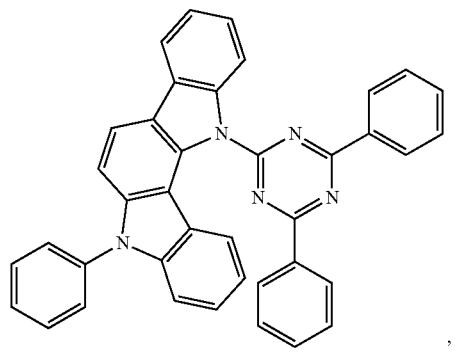
T-12
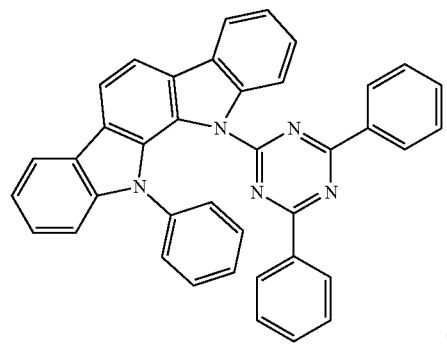
T-13
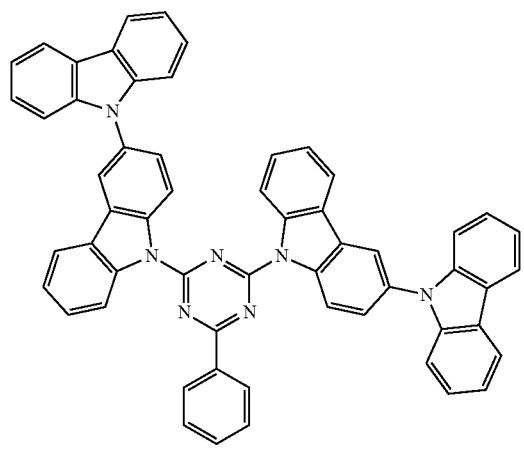
T-14
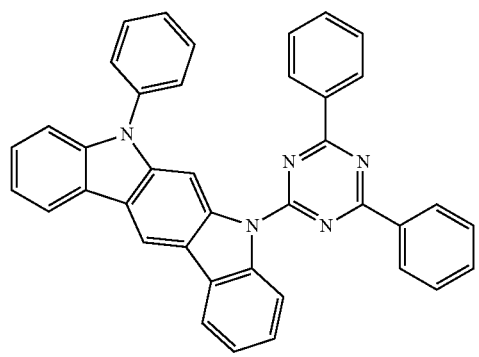
T-15
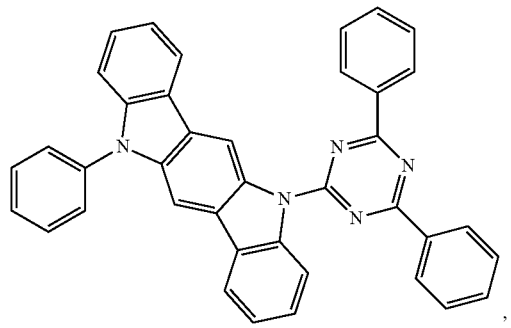
T-16
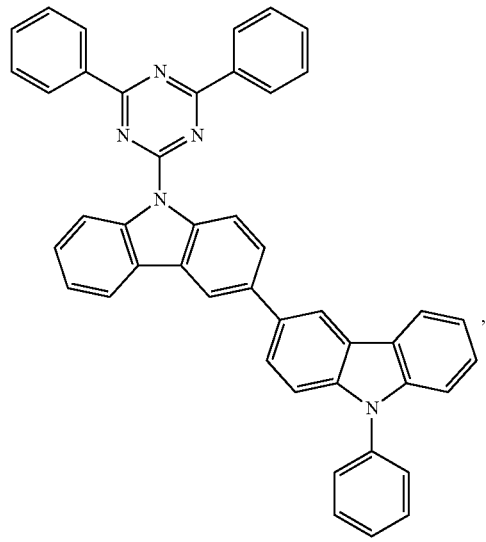

-continued
T-17
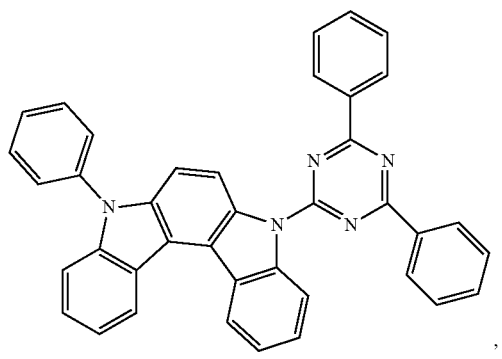
T-18
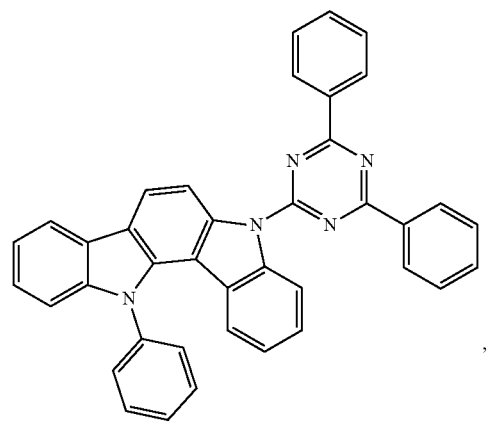
T-19
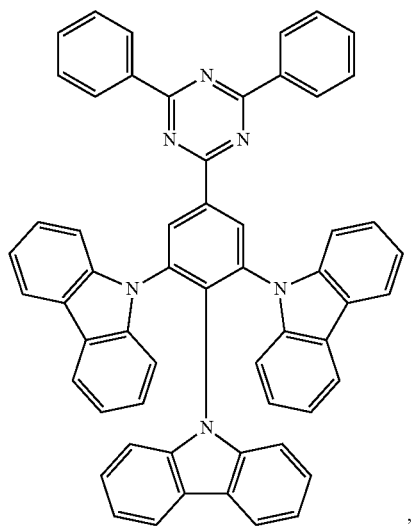
T-20
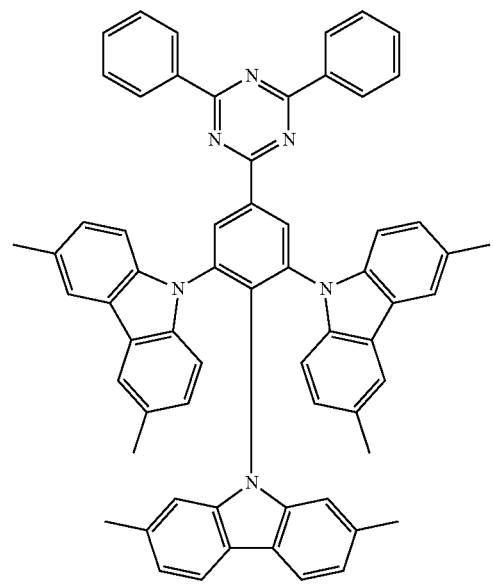
T-21
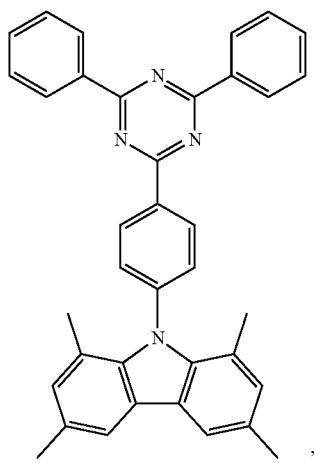
T-22
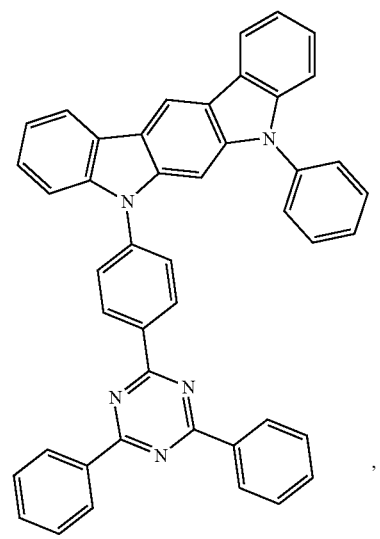

-continued
T-23
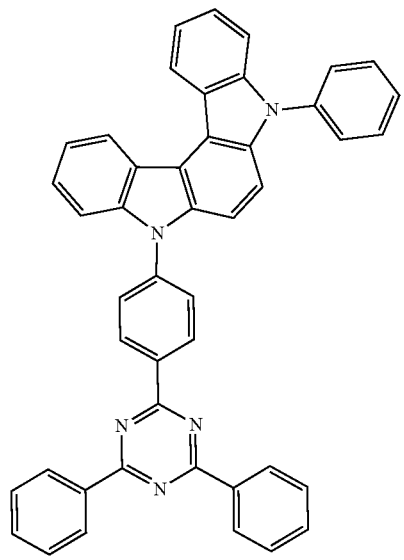
T-24
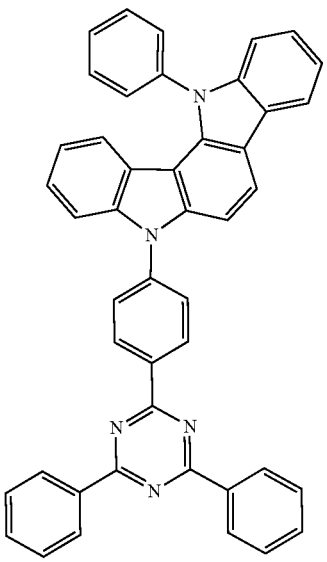
T-25
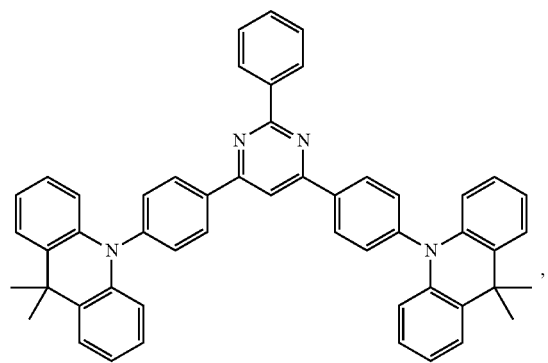
T-26
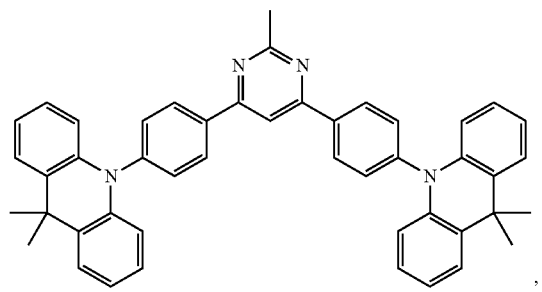
T-27
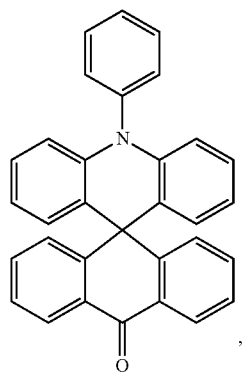
T-28
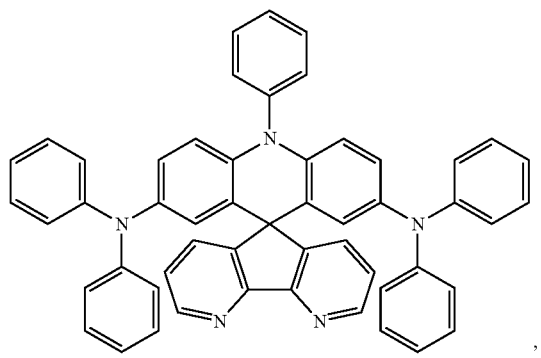

T-29
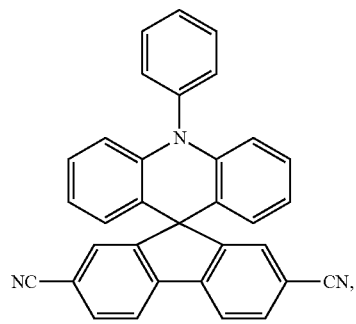
T-30
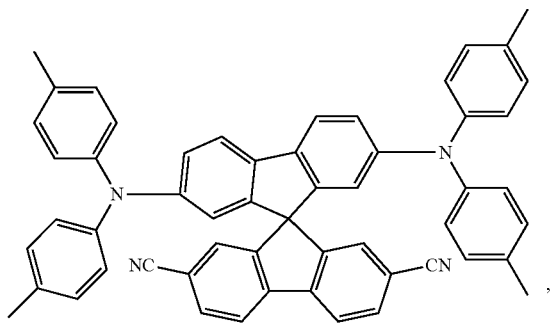
T-31
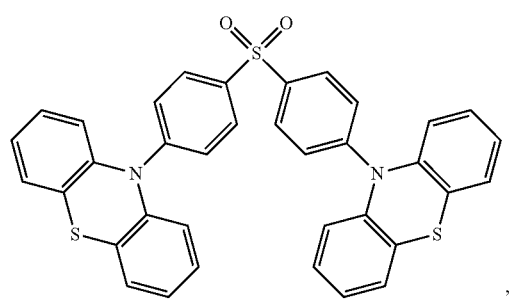
T-32
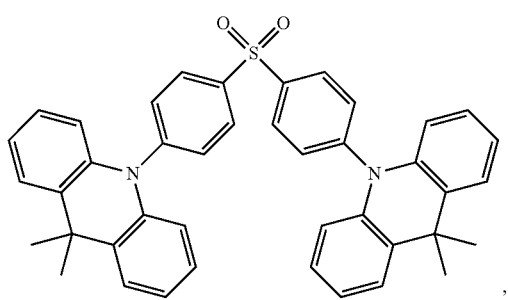
T-33
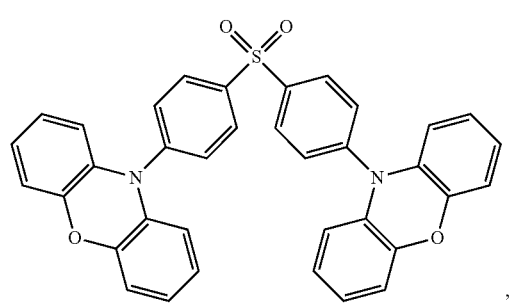
T-34
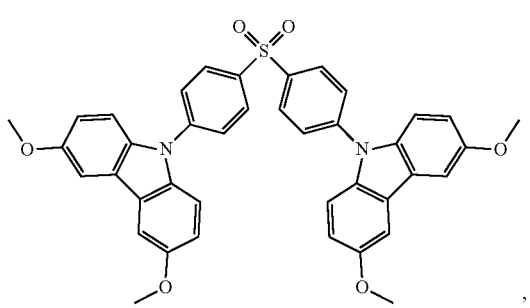
T-35
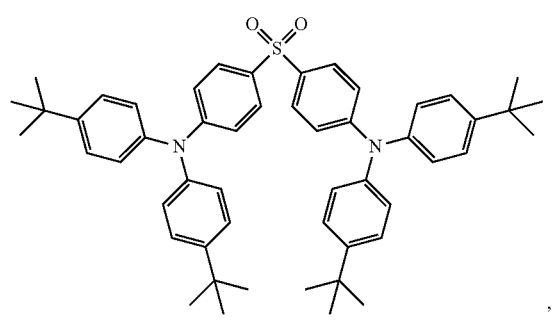
T-36
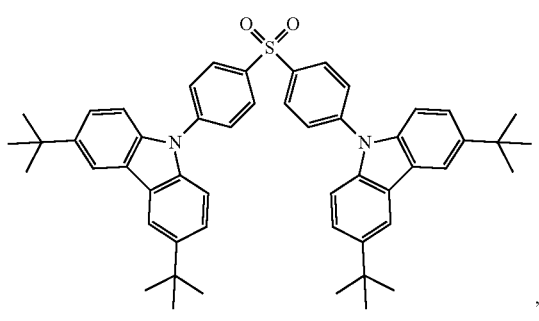

-continued
T-37
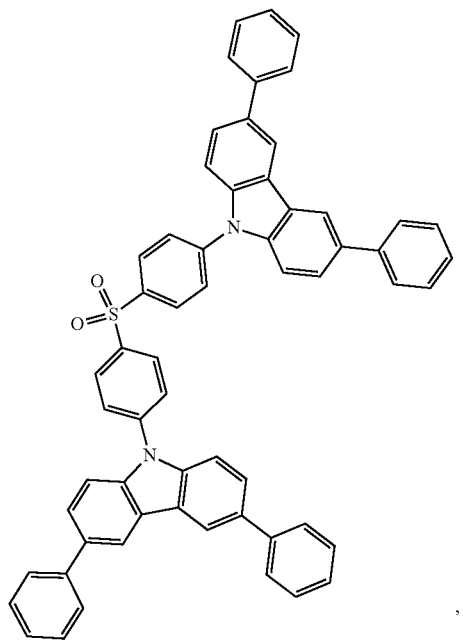
T-38
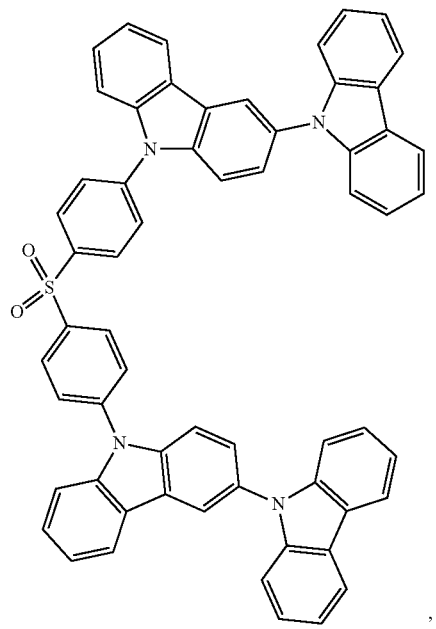
T-39
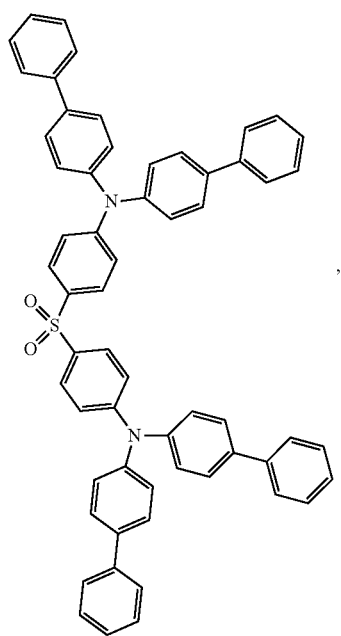
T-40
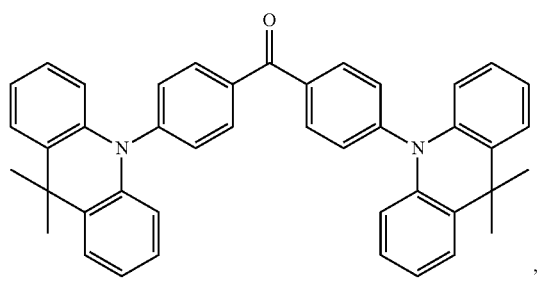
T-41
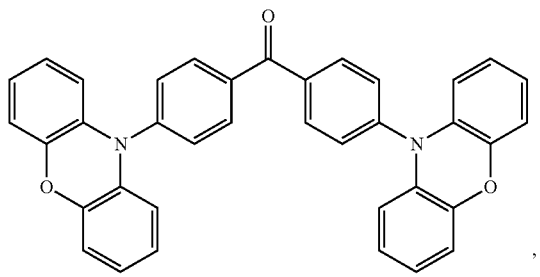
T-42
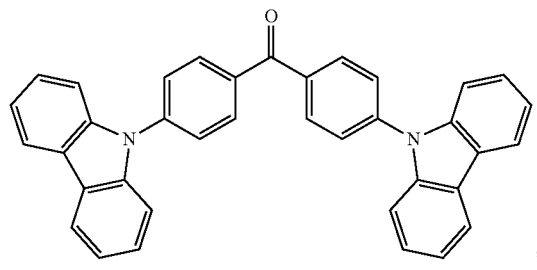

-continued
T-43
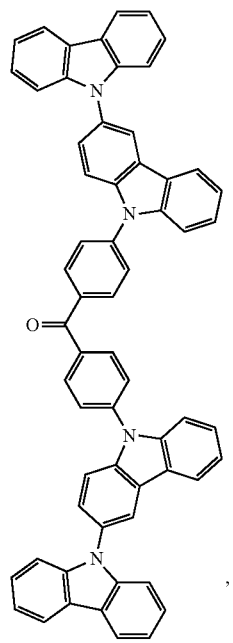
T-44
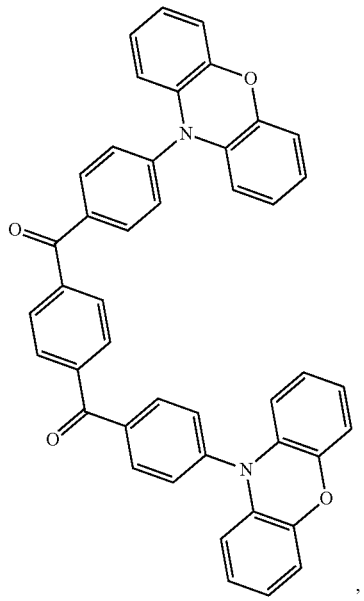
T-45
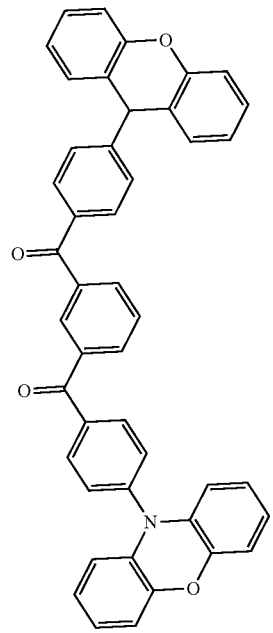
T-46
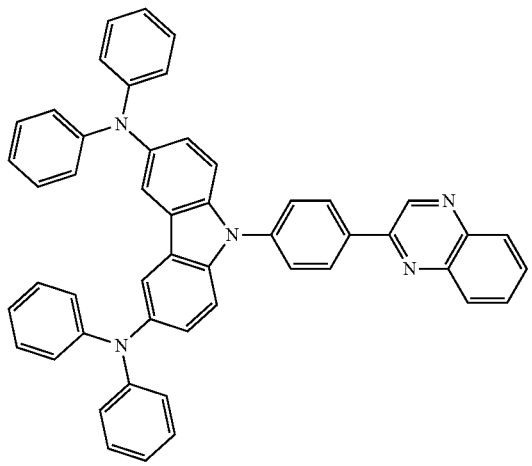
T-47
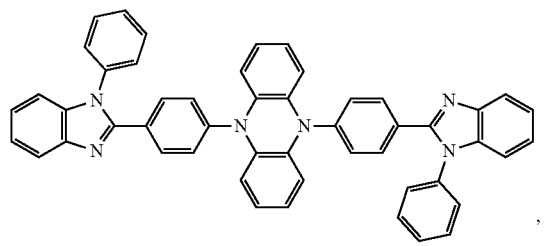
T-48
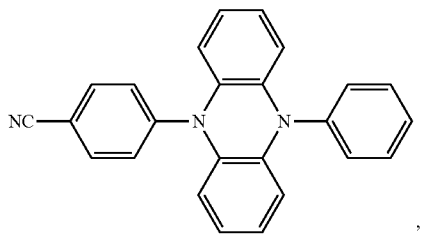

-continued
T-49
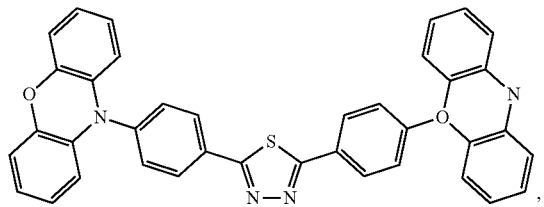
T-50
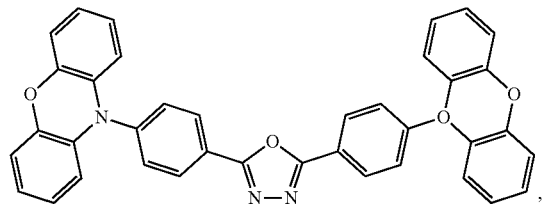
T-51
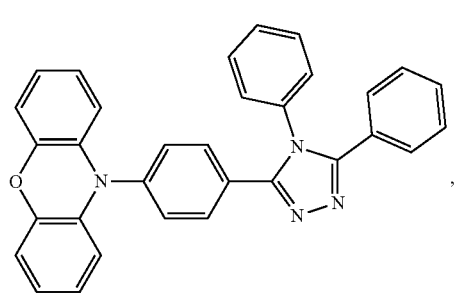
T-52
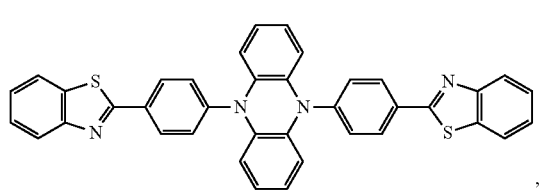
T-53
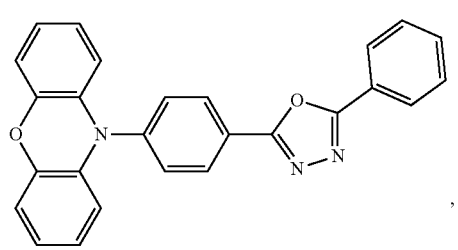
T-54
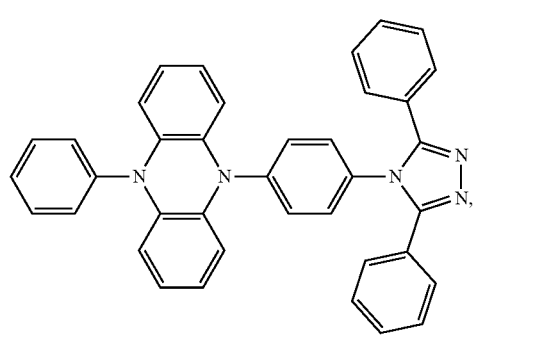
T-55
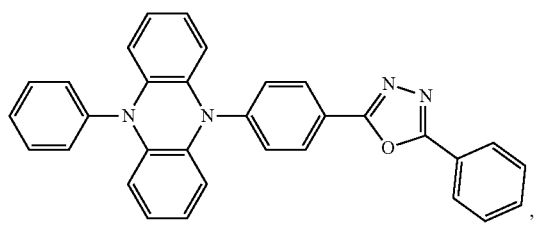
T-56
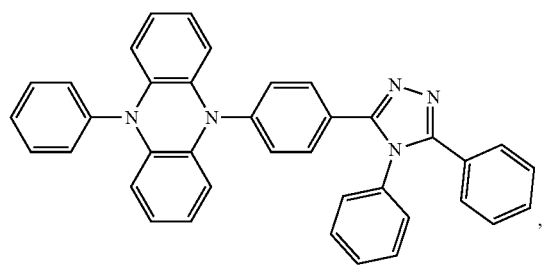
T-57
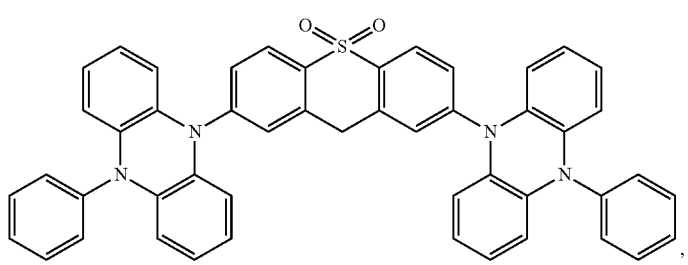

T-58
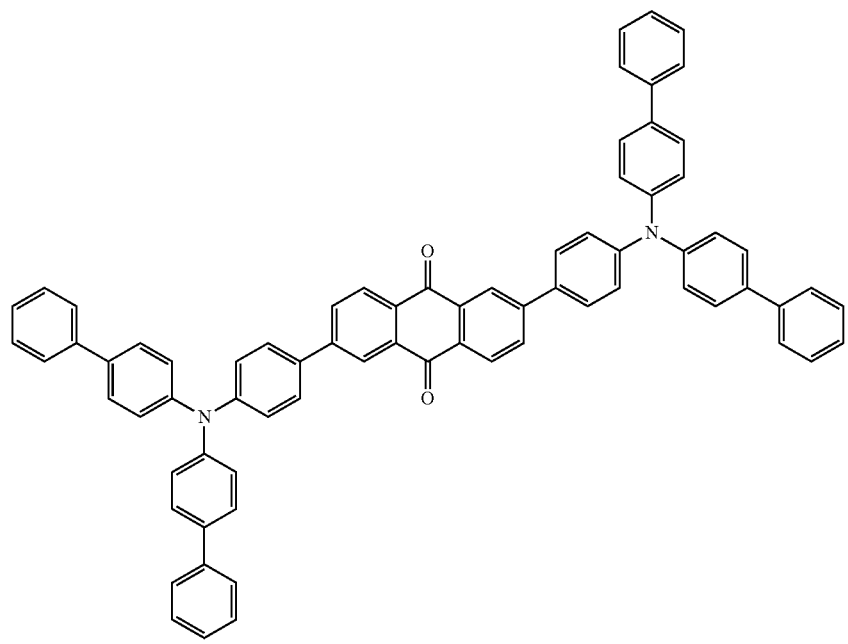
T-59
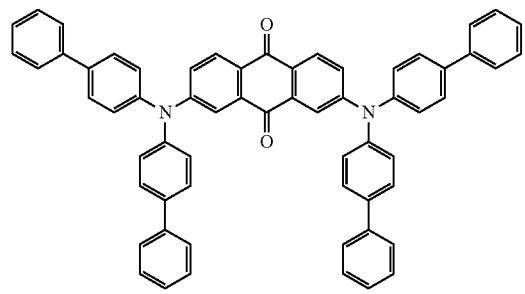
T-60
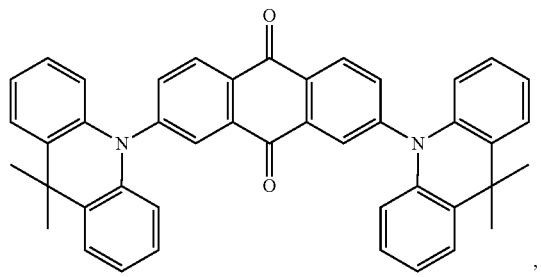
T-61
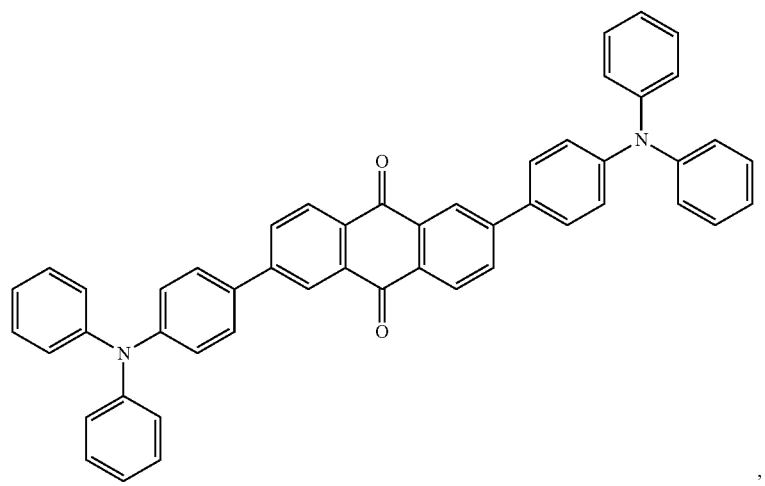

-continued
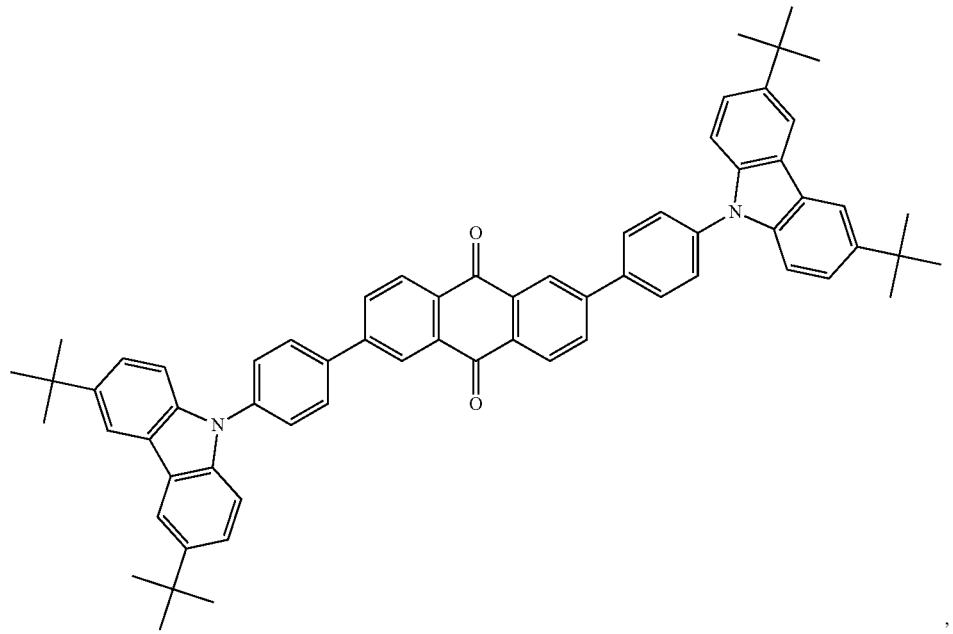
T-62
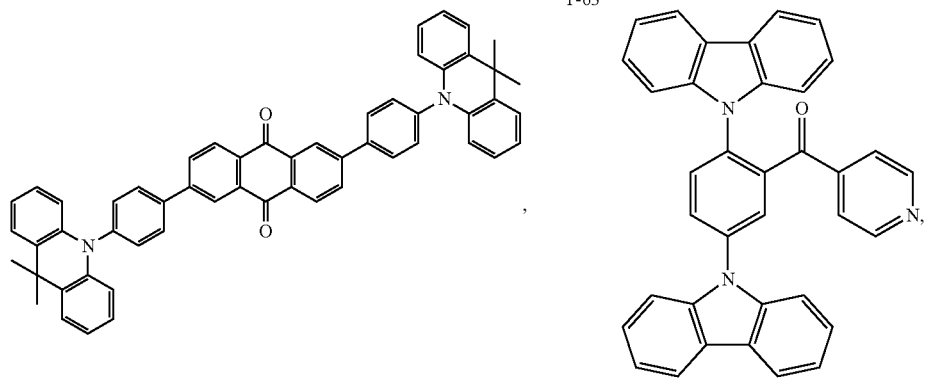
T-63, T-64
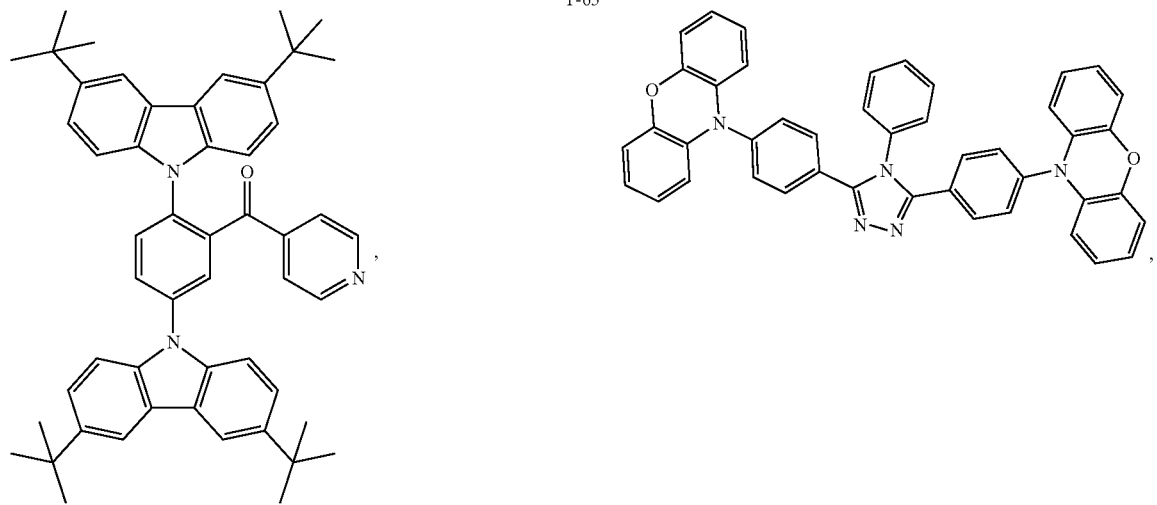
T-65, T-66

-continued
T-67
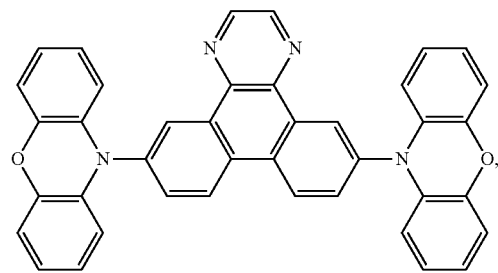
T-68
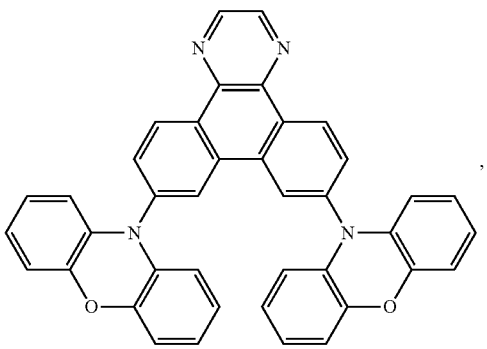
T-69
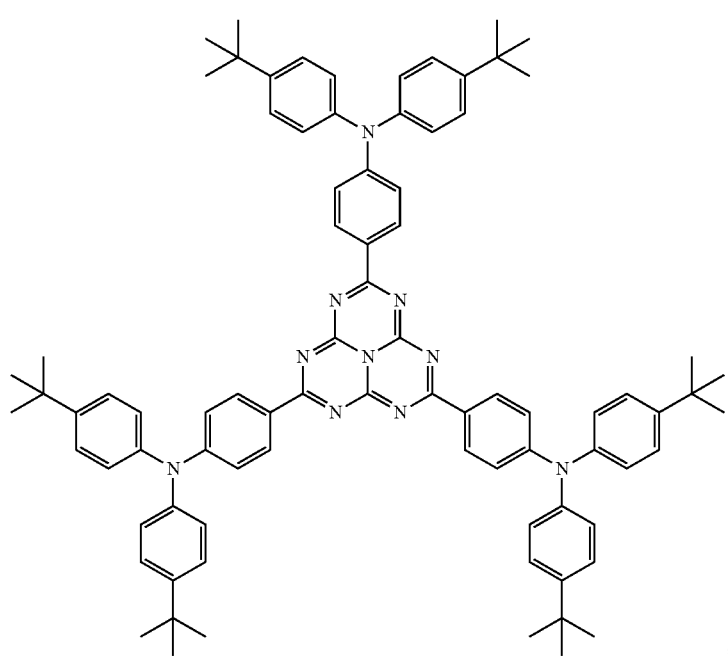
T-70
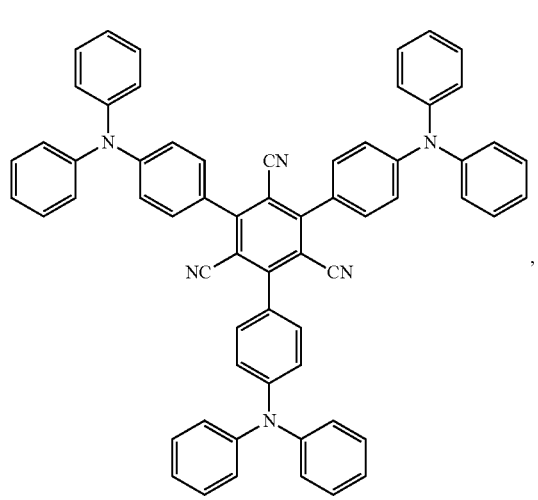
T-71
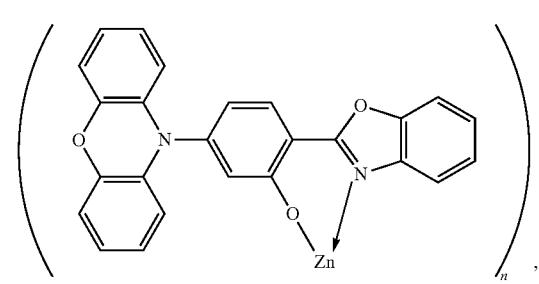

-continued
T-72
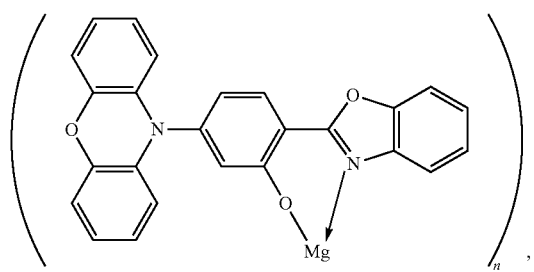
T-73
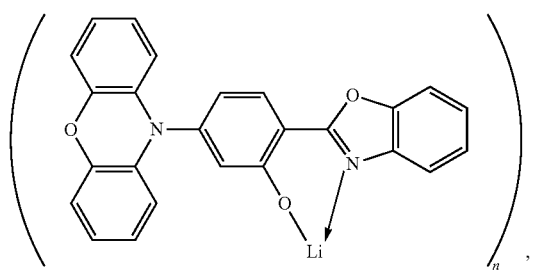
T-74
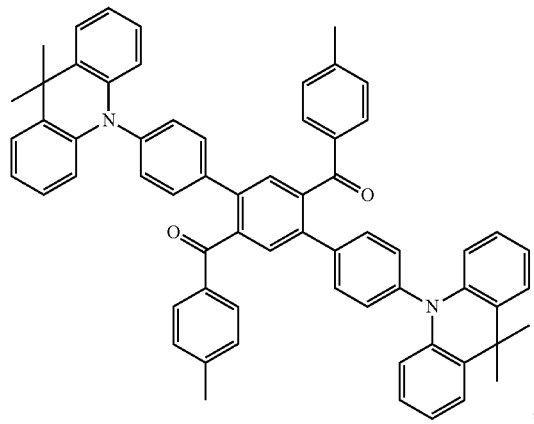
T-75
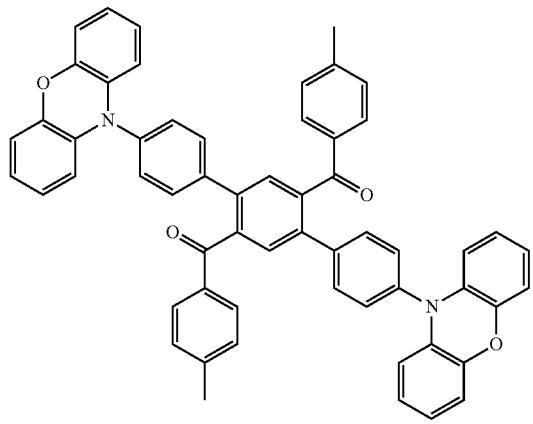
T-76
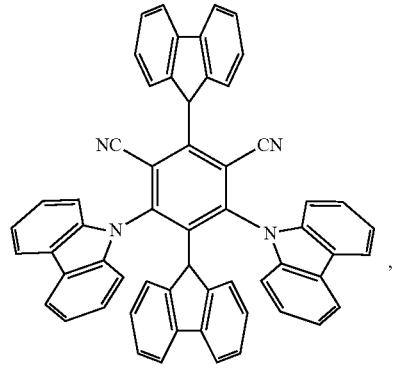
T-77
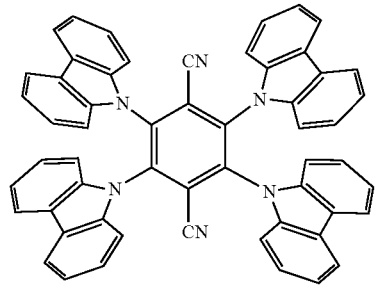
T-78
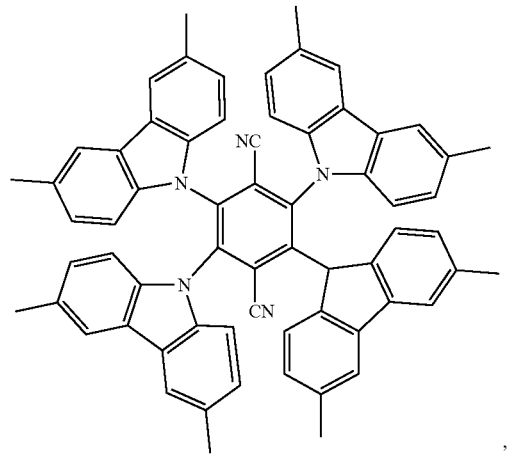
T-79
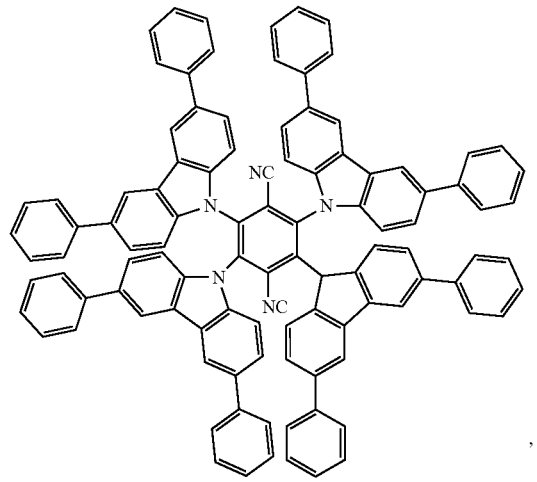

-continued
T-80
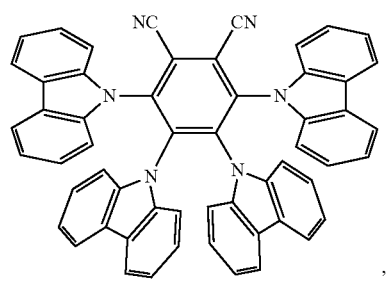
T-81
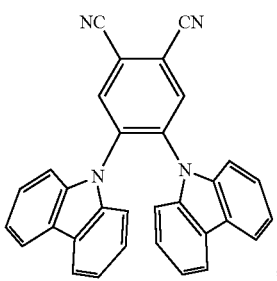
T-82
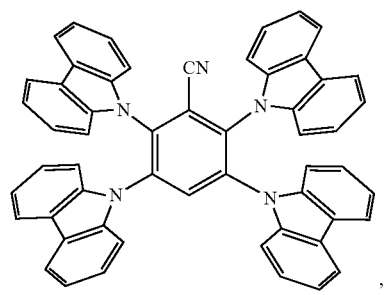
T-83
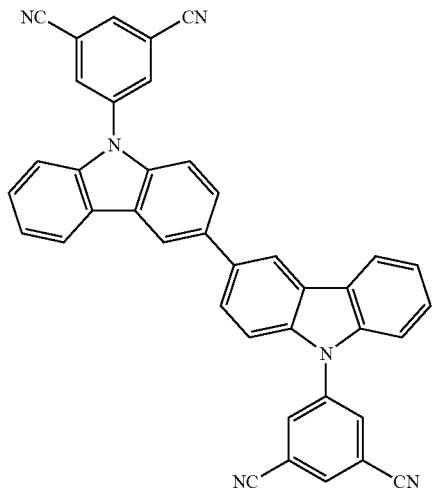
T-84
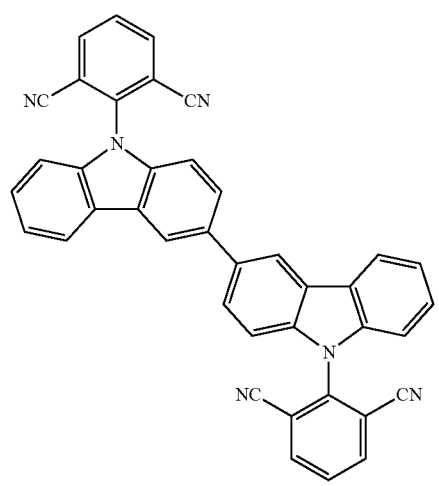
T-85
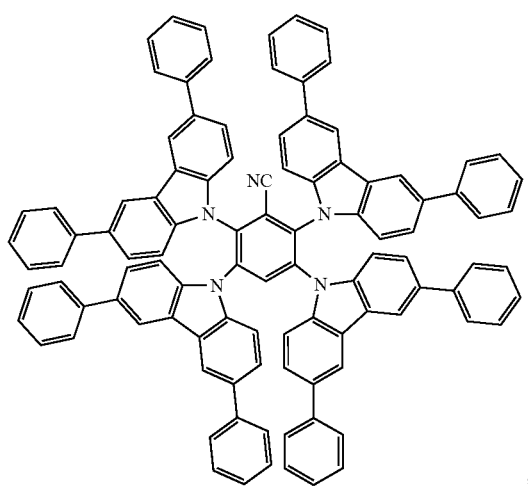

-continued
T-86
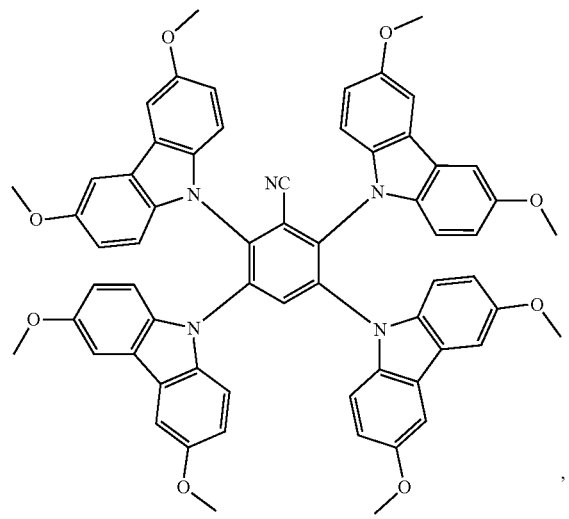
T-87
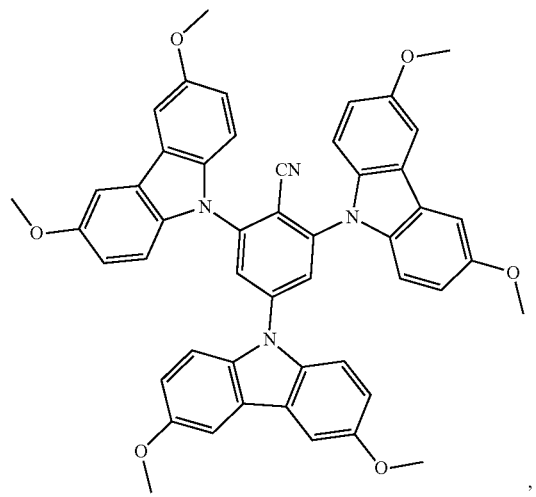
T-88
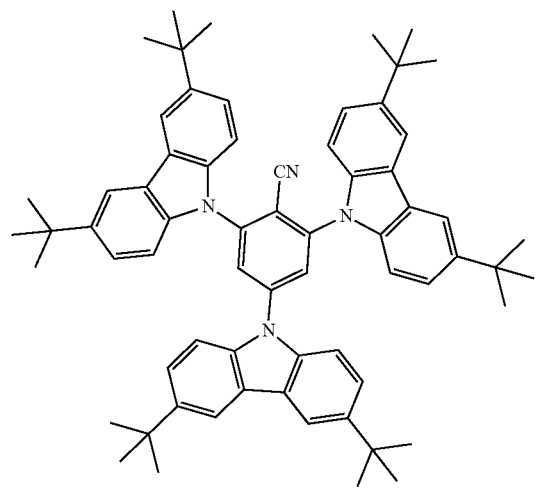
T-89
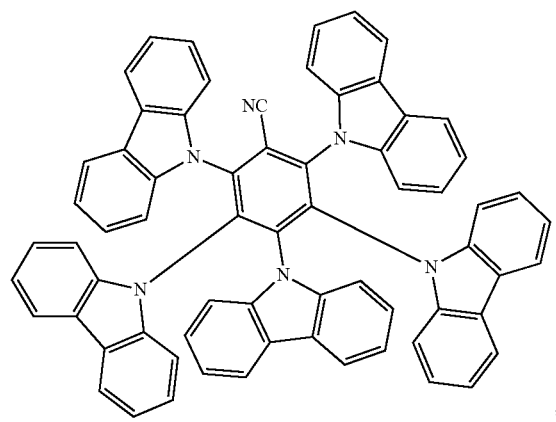
T-90
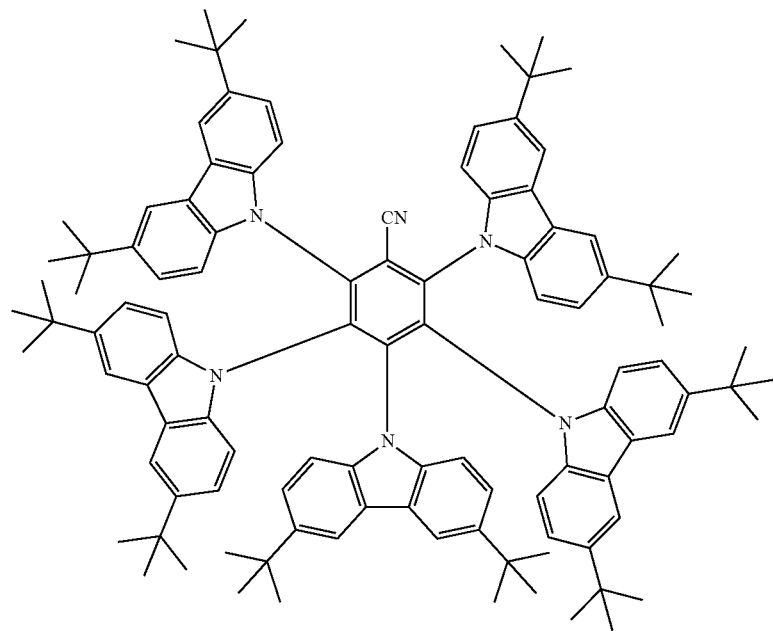

-continued
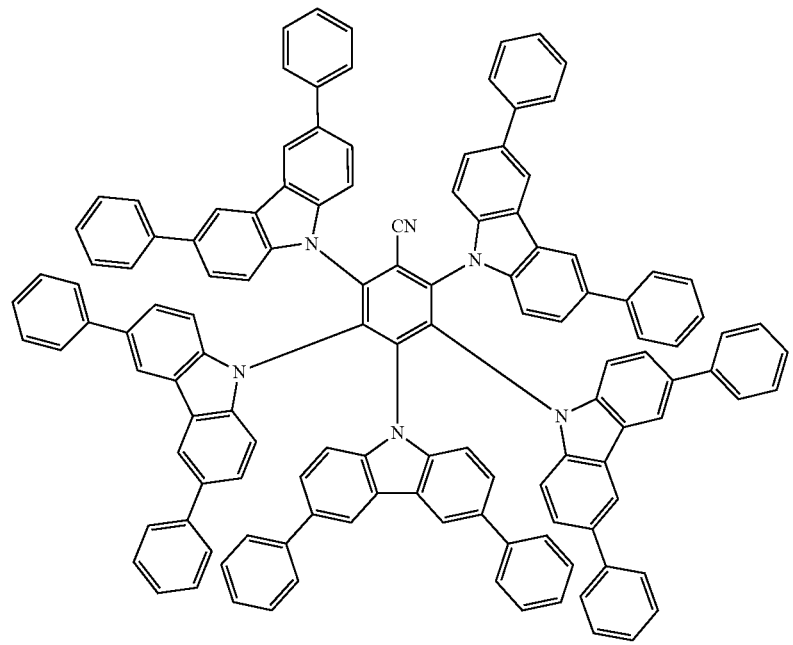
T-91
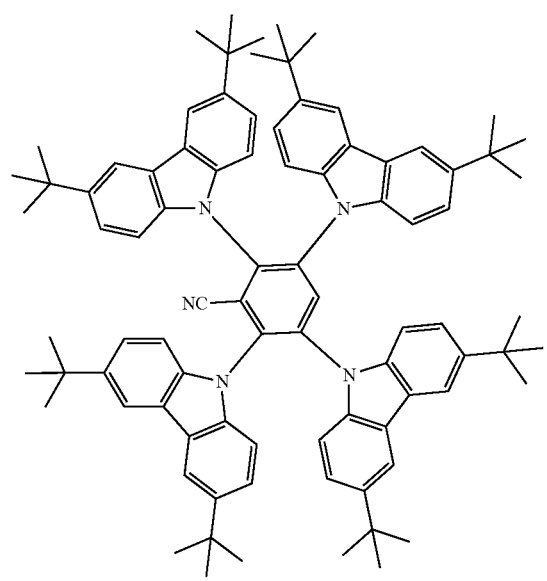
T-92
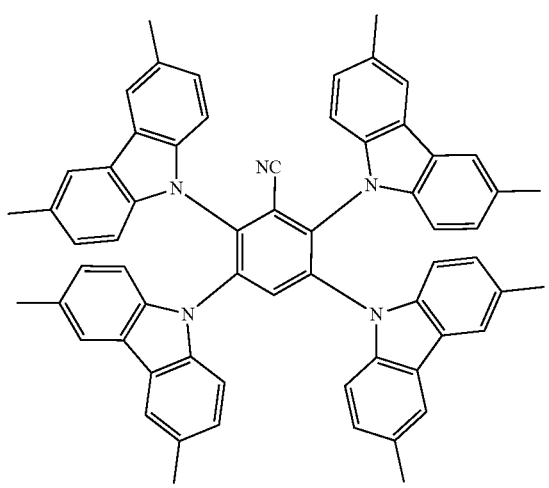
T-93

-continued
T-94
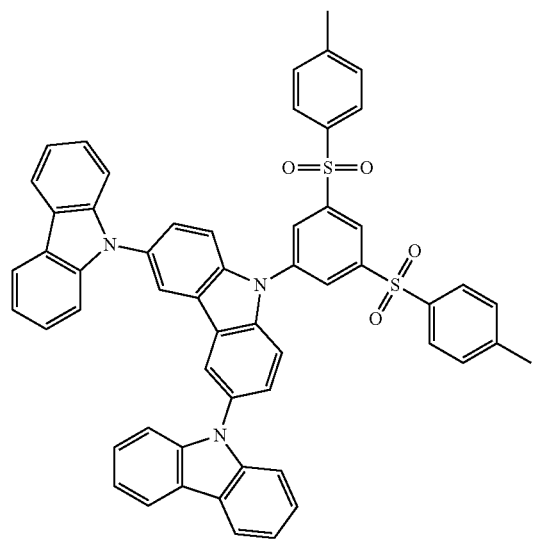
T-95
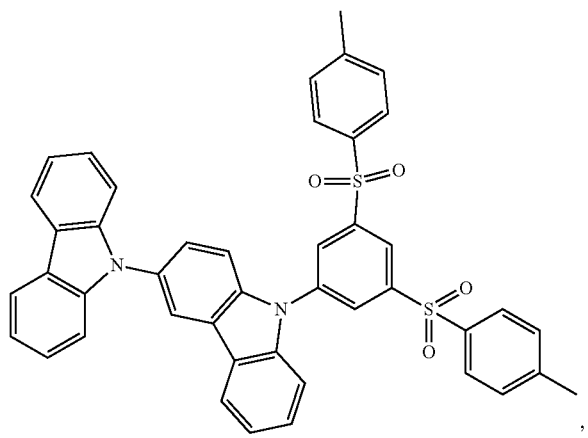
T-96
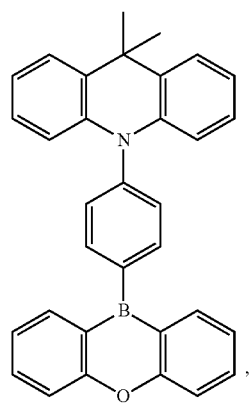
T-97
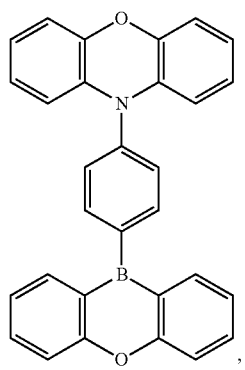
T-98
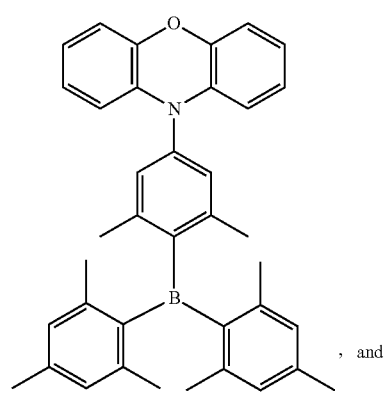, and
T-99
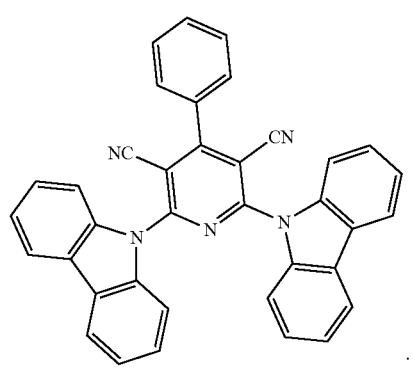.

8. The organic electroluminescent device of claim 1, wherein the fluorescent dye is selected from at least one of compounds of structures shown below:
F-1
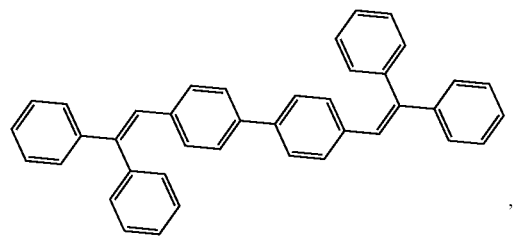
F-2
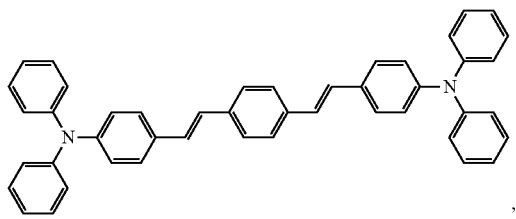
F-3
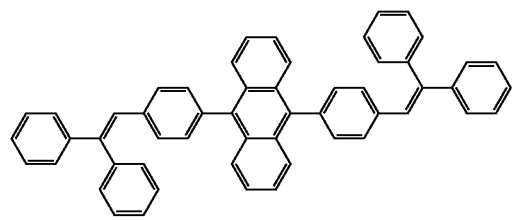
F-4
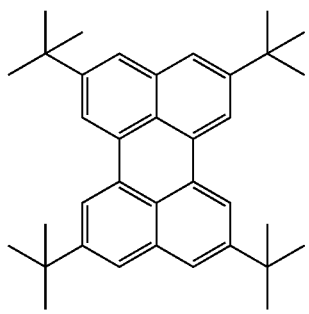
F-5
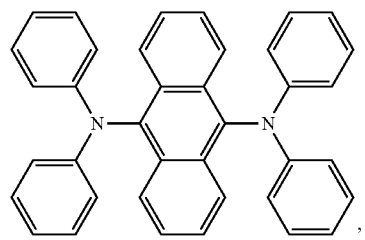
F-6
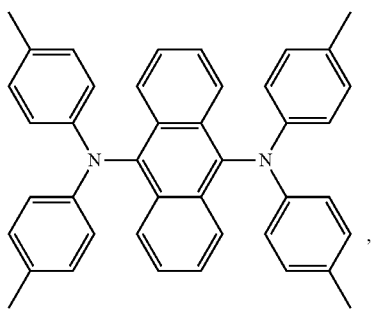
F-7
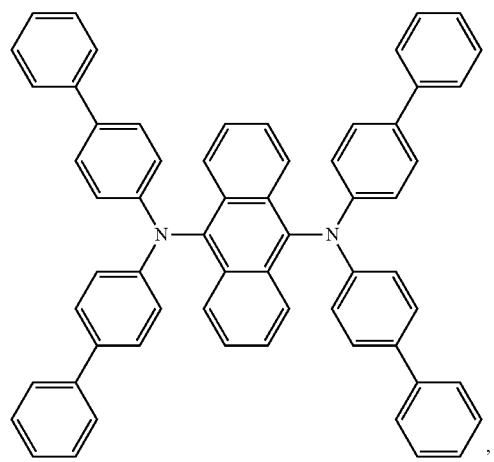
F-8
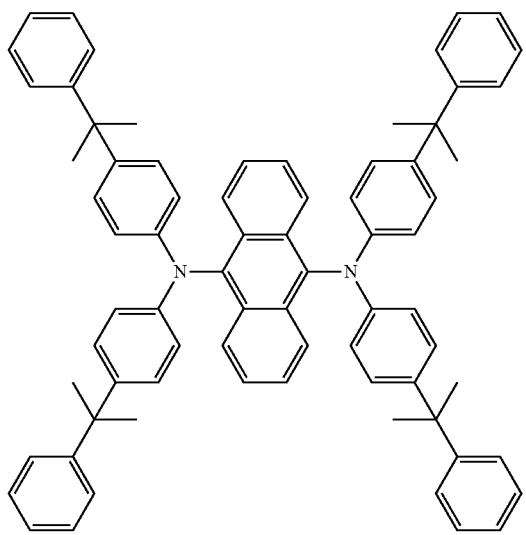

-continued
F-9
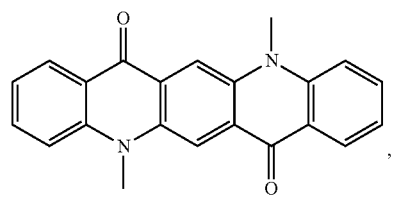
F-10
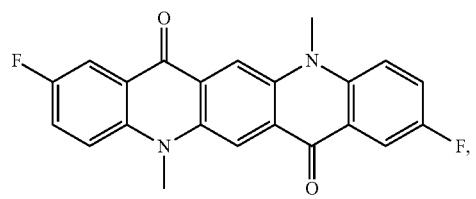
F-11
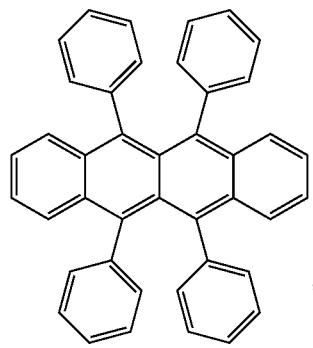
F-12
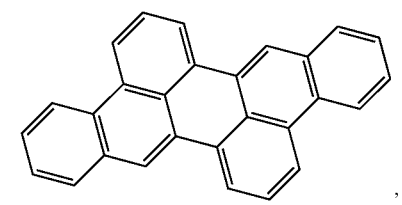
F-13
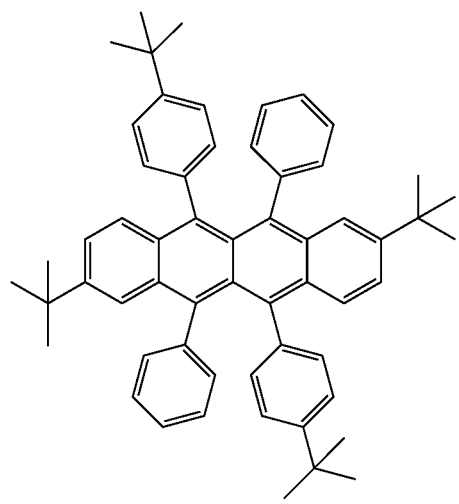
F-14
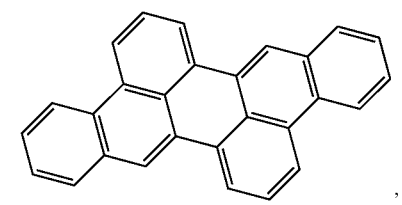
F-15
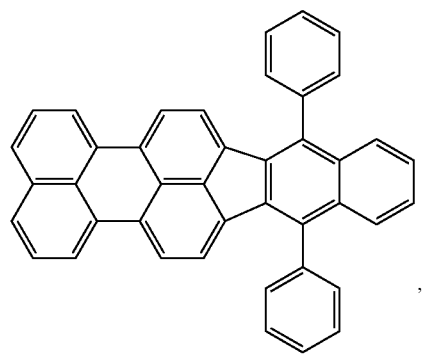
F-16
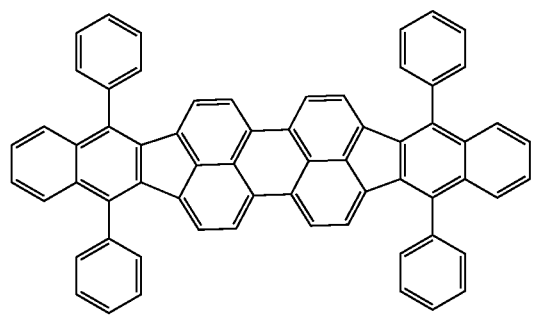
F-17
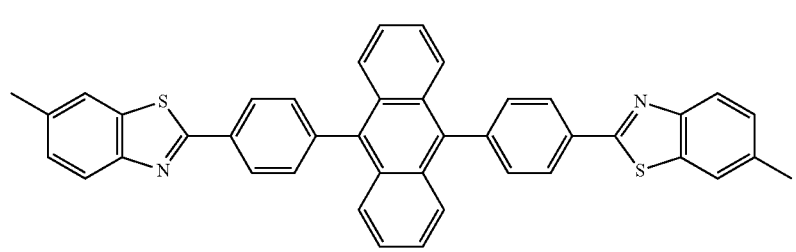

-continued
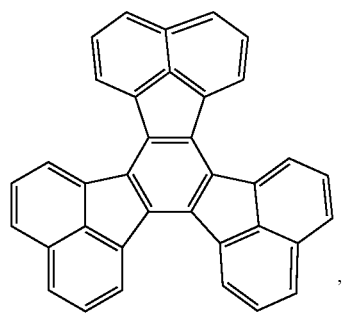
F-18
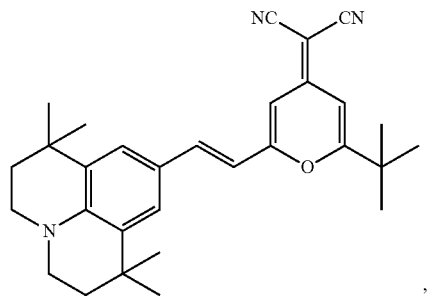
F-19
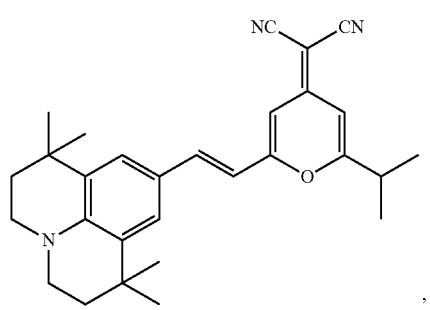
F-20
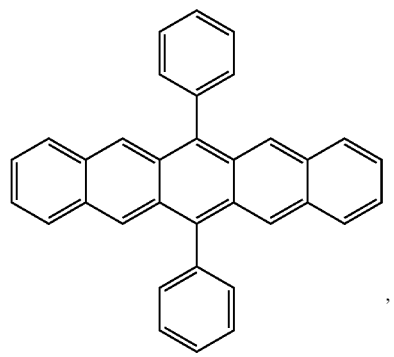
F-21
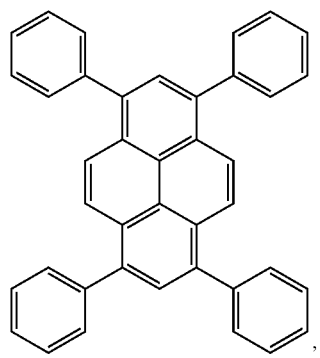
F-22
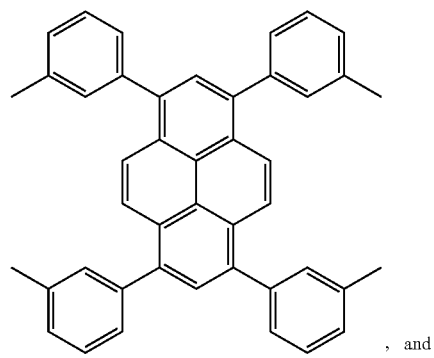
F-23
, and
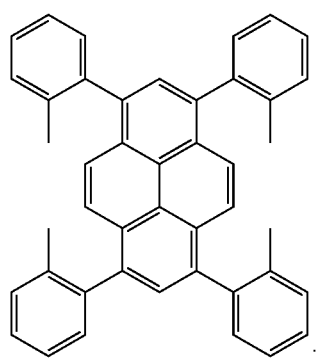
F-24

9. The organic electroluminescent device of claim 1, wherein the electron donor material further comprises one selected from the group consisting of:
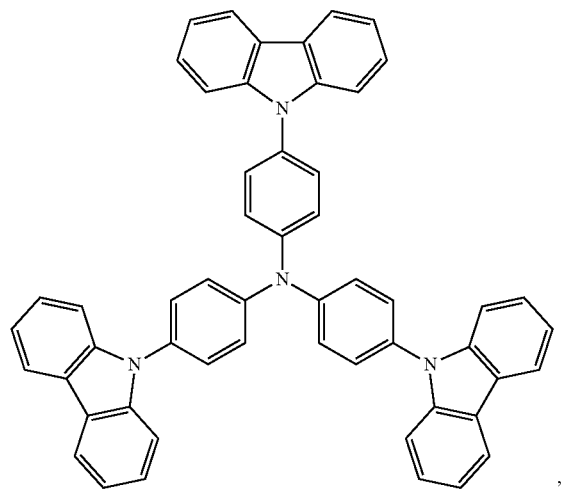
D-1
,
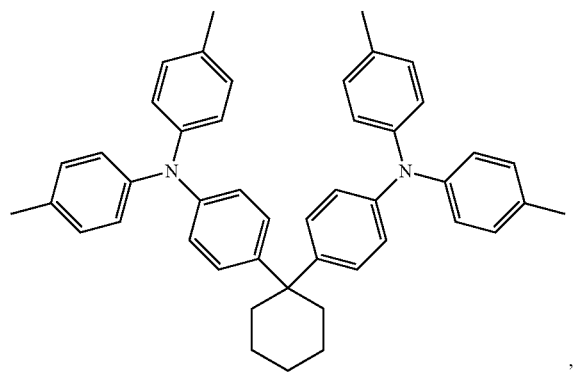
D-3
,
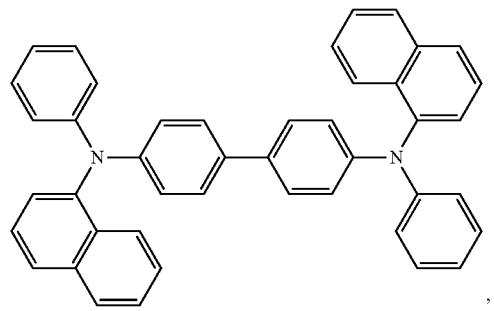
D-4
,
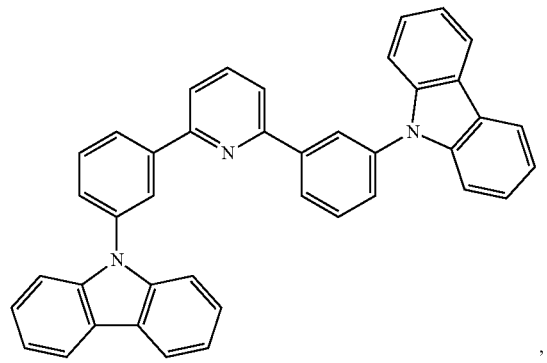
D-5
,

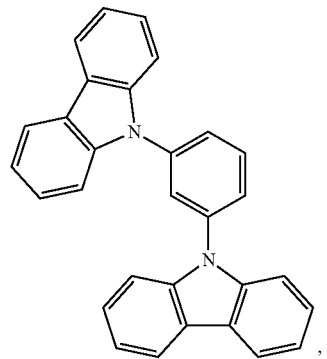
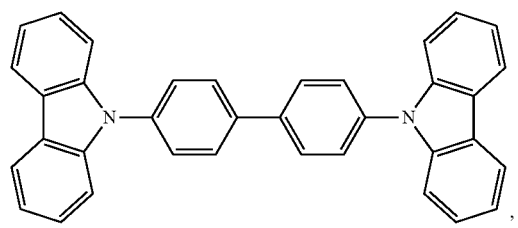
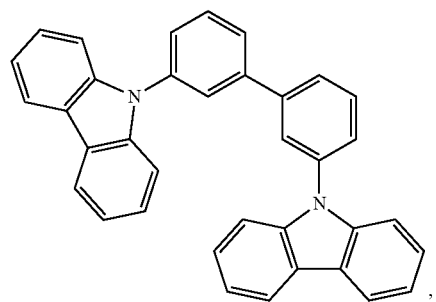
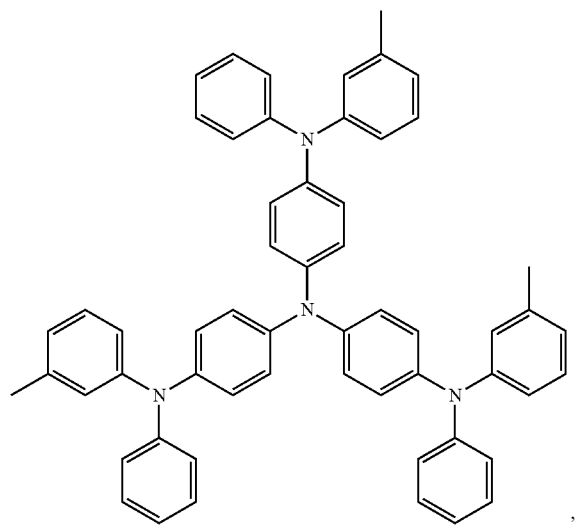
D-6
D-7
D-8
D-9

-continued
D-10
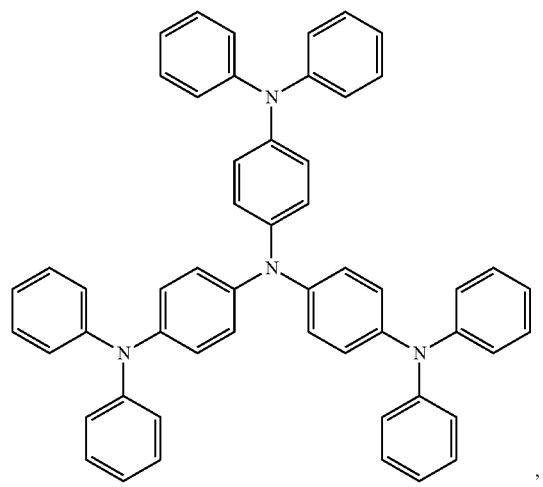
D-11
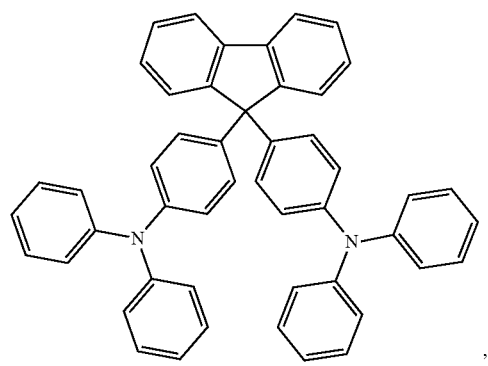
D-12
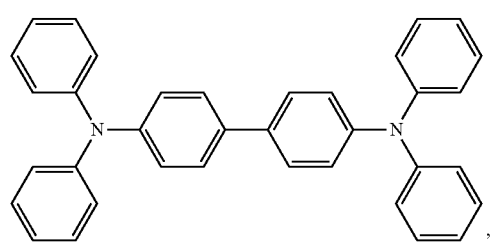
D-13
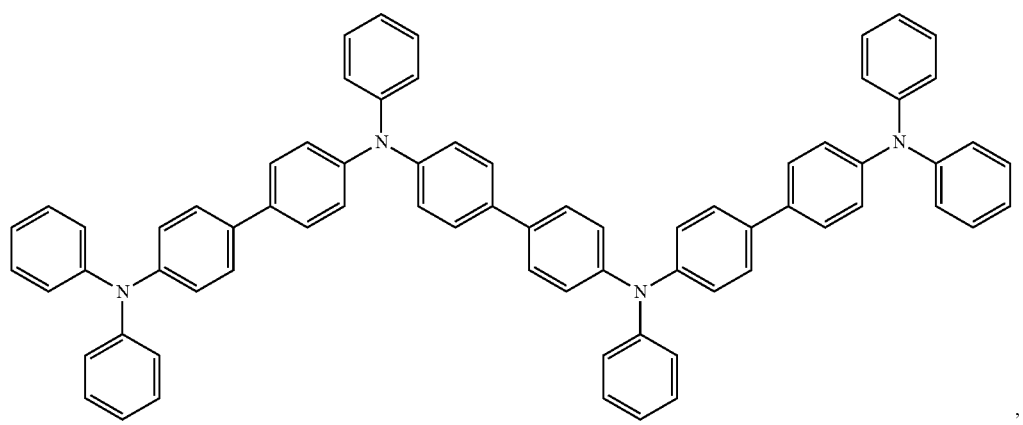

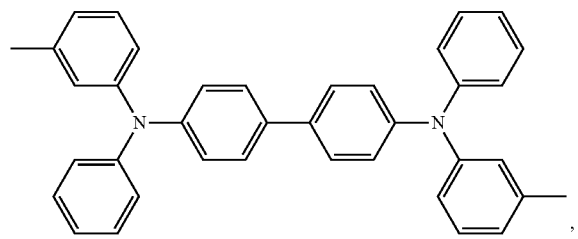
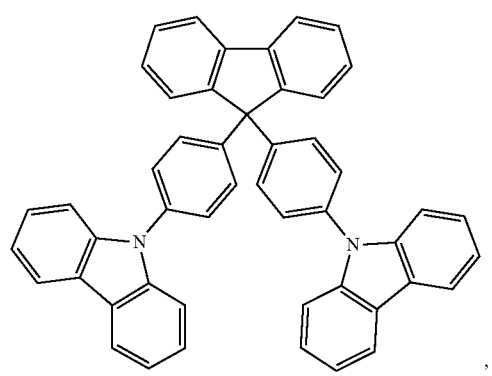
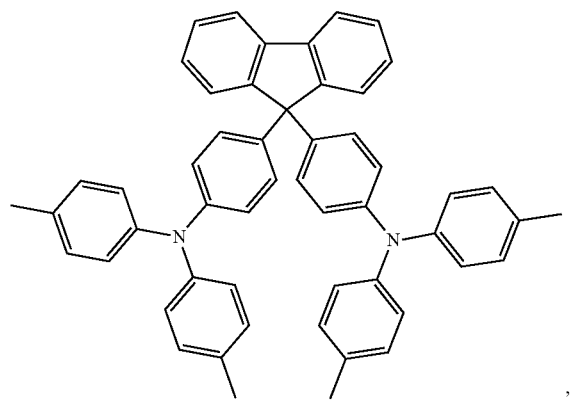
D-4
D-15
D-16

-continued
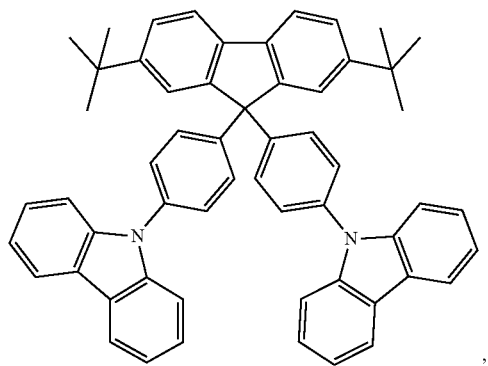
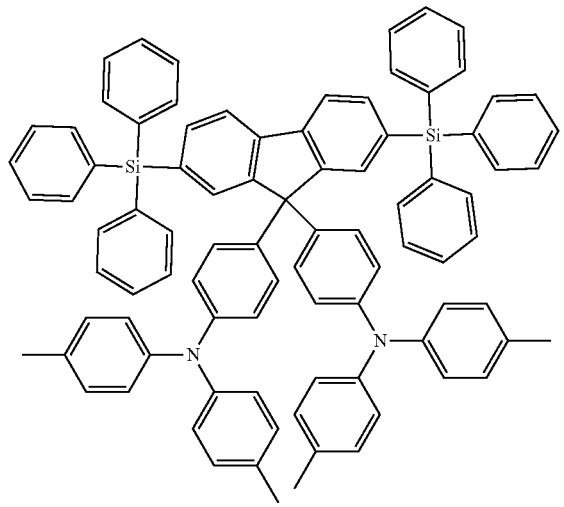
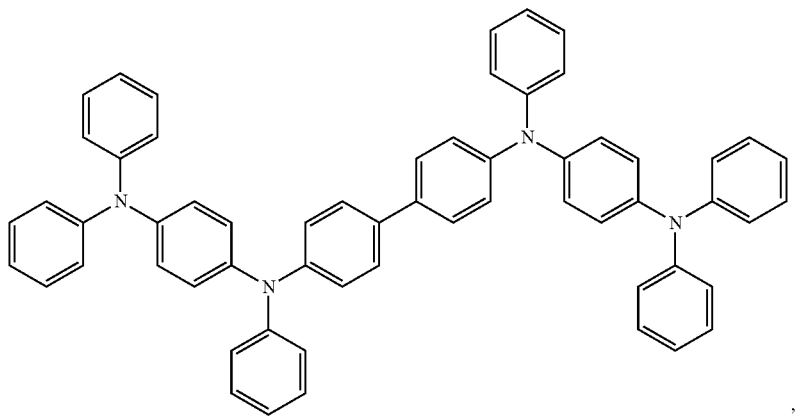
and any combinations thereof.
10. An organic electroluminescent device comprising:
a light-emitting layer, the light-emitting layer including:
a host material, wherein the host material is an exciplex comprising a mixture of an electron donor material and an electron acceptor material;

an auxiliary host material that is a thermally activated delayed fluorescence material; and a fluorescent dye;

wherein the electron donor material comprises:

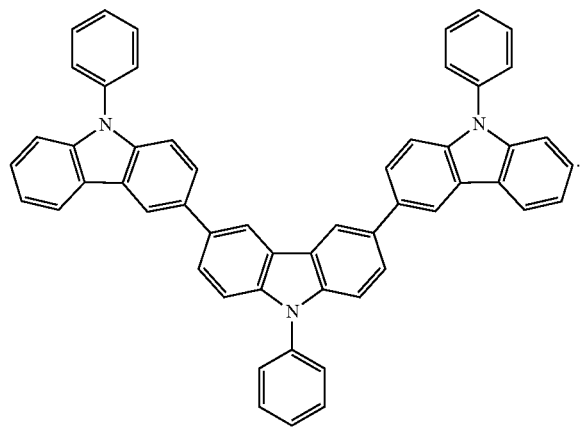 [SMILES: c1ccc(-n2c3ccccc3c3cc(-c4ccc5c(c4)c4cc(-c6ccc7c(c6)c6ccccc6n7-c6ccccc6)ccc4n5-c4ccccc4)ccc32)cc1]

wherein the electron acceptor material comprises at least one of:

A-19

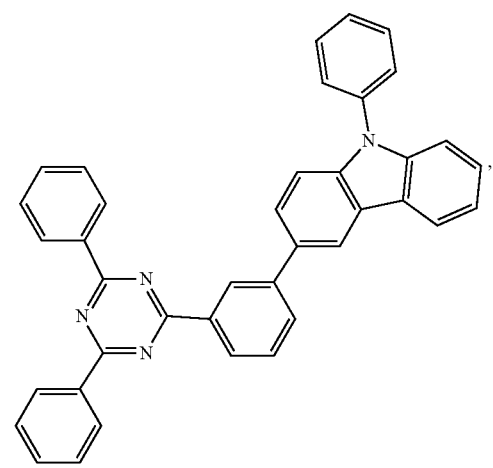

A-35

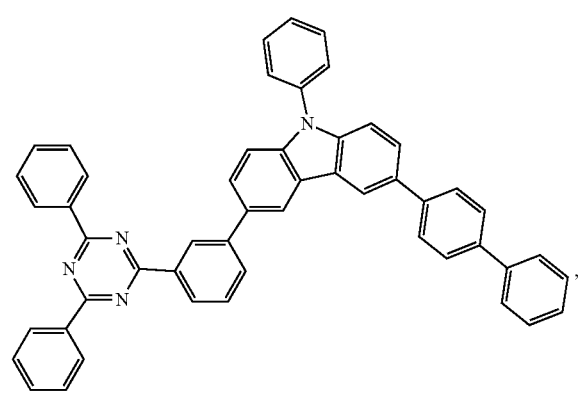

A-10

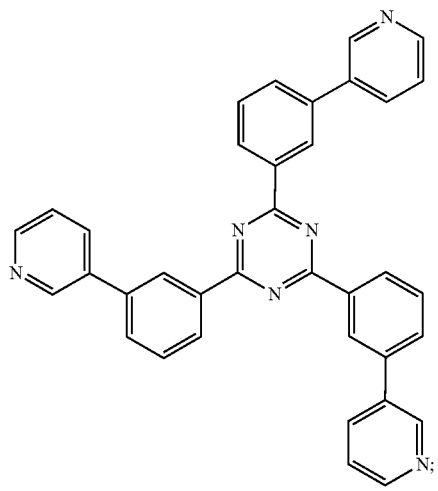

A-7

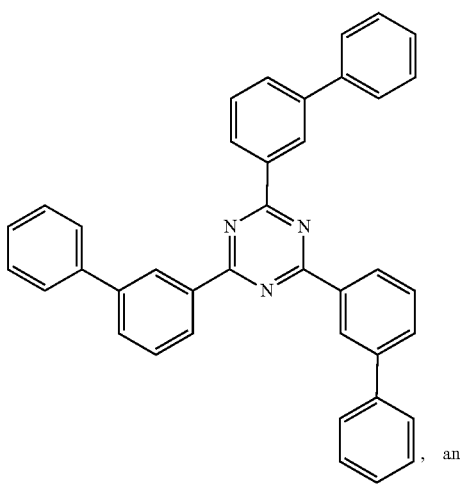

, and

A-26

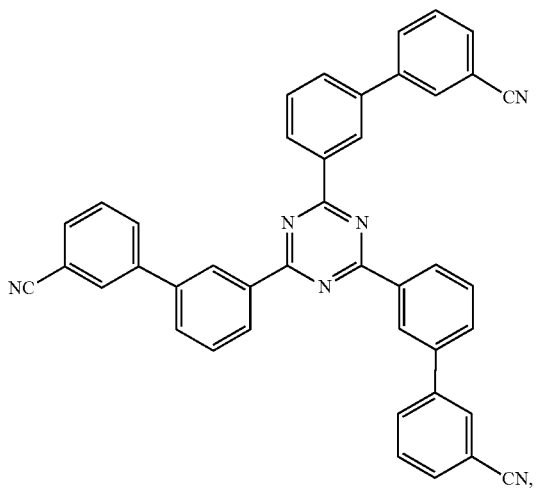

wherein the triplet energy level ($T_1$) of the exciplex is higher than the singlet energy level ($S_1$) of the auxiliary host material, wherein the triplet energy level ($T_1$) of the electron donor material and the triplet energy level ($T_1$) of the electron acceptor material are respectively higher than the triplet energy level (T$_1$) of the exciplex, and wherein the exciplex has a band gap narrower than the band gap of mCBP.

11. The organic electroluminescent device of claim 10, wherein the thermally activated delayed fluorescence material is selected from:

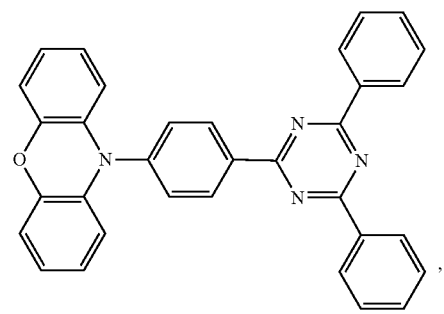

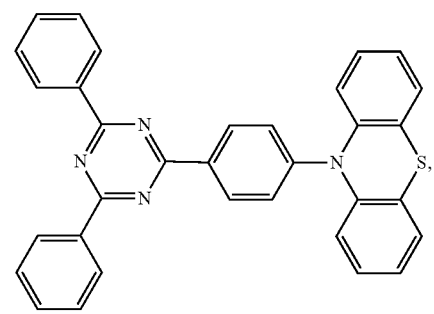

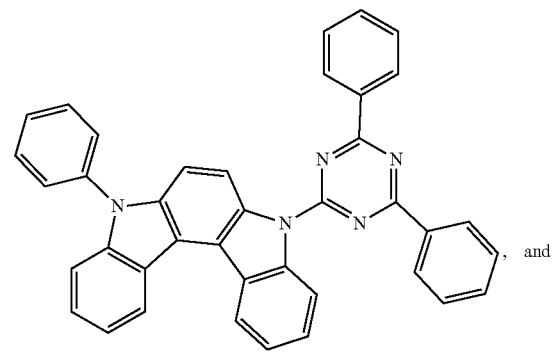, and

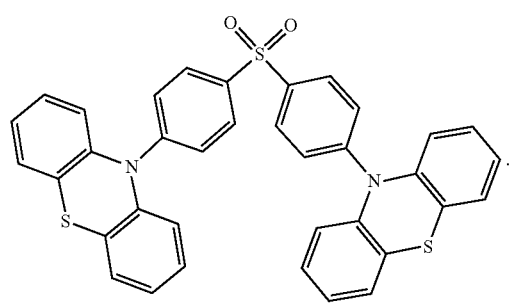

12. The organic electroluminescent device of claim 10, wherein the fluorescent dye comprises at least one of:

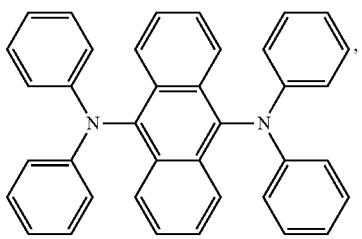
F-5

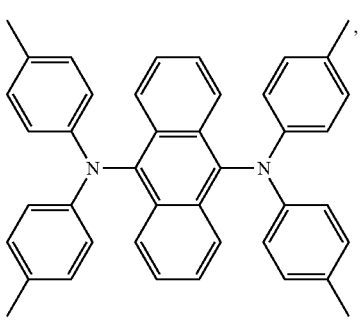
F-6

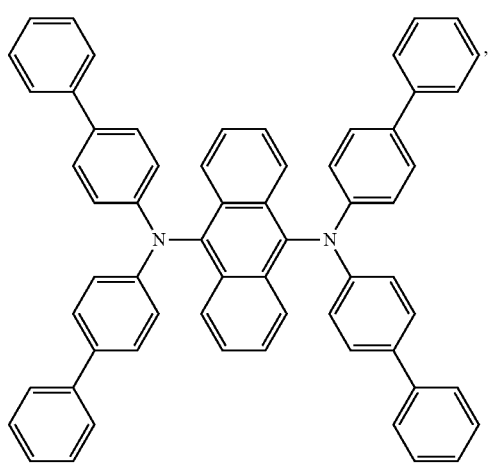
F-7

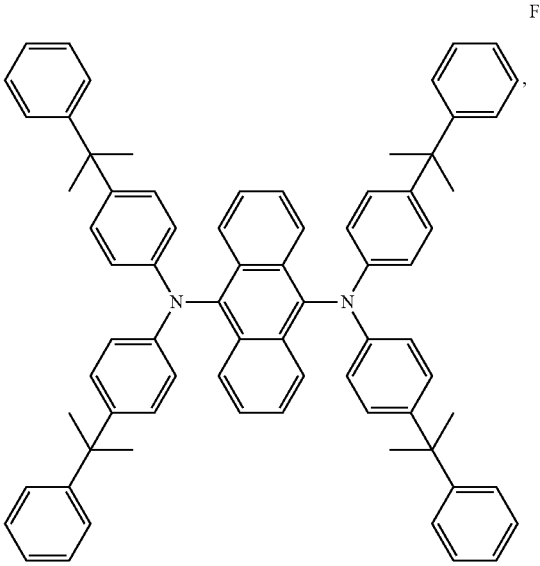
F-8

-continued
and

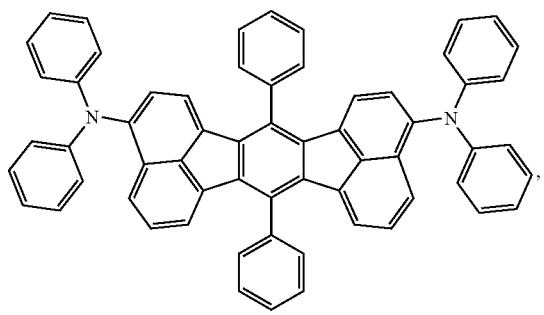

F-12

13. The organic electroluminescent device of claim 10, wherein the triplet energy level (T₁) of the auxiliary host material is higher than the singlet energy level (S₁) of the fluorescent dye.

14. The organic electroluminescent device of claim 10, wherein a mass ratio of the electron donor material to the electron acceptor material is between 1:9 and 9:1.

15. The organic electroluminescent device of claim 10, wherein a doping ratio of the auxiliary host material is between 5 wt % and 80 wt %, and wherein a doping ratio of the fluorescent dye is between 0.1 wt % and 10 wt %.

16. The organic electroluminescent device of claim 10, wherein an energy level difference between the singlet energy level (S₁) and the triplet energy level (T₁) of the auxiliary host material is less than 0.3 eV.

17. An organic electroluminescent device comprising:
a light-emitting layer, the light-emitting layer including:
a host material, wherein the host material is an exciplex comprising a mixture of an electron donor material and an electron acceptor material;
an auxiliary host material that is a thermally activated delayed fluorescence material; and
a fluorescent dye;
wherein the electron donor material comprises:

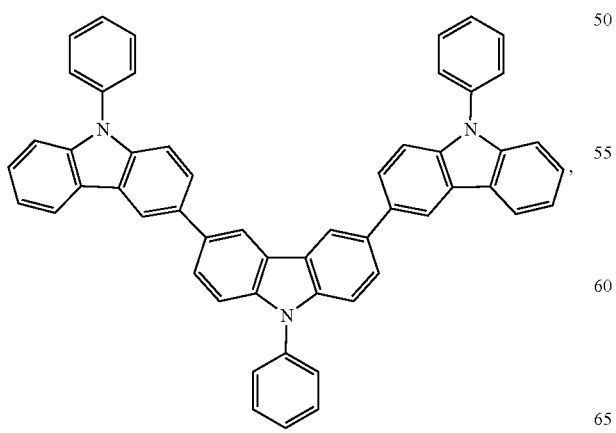

D-2 wherein the electron acceptor material comprises at least one of:

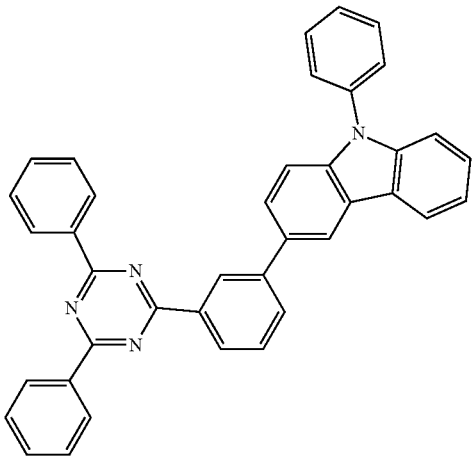

A-19 and

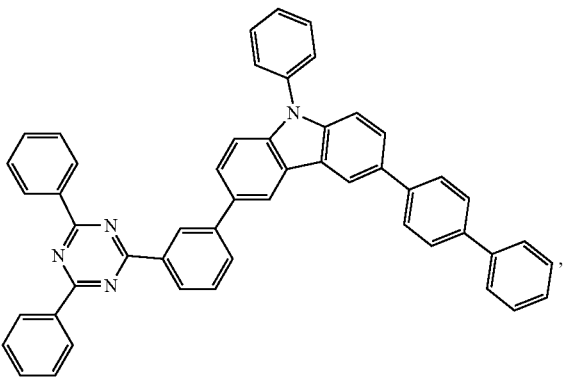

A-35 wherein the thermally activated delayed fluorescence material is

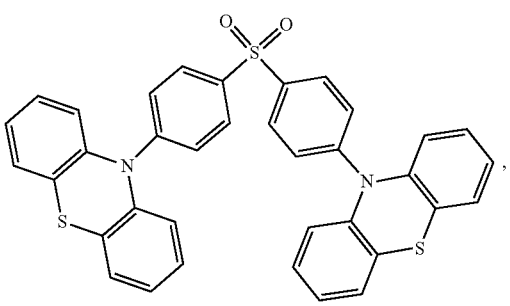

T-31 and wherein the fluorescent dye is:

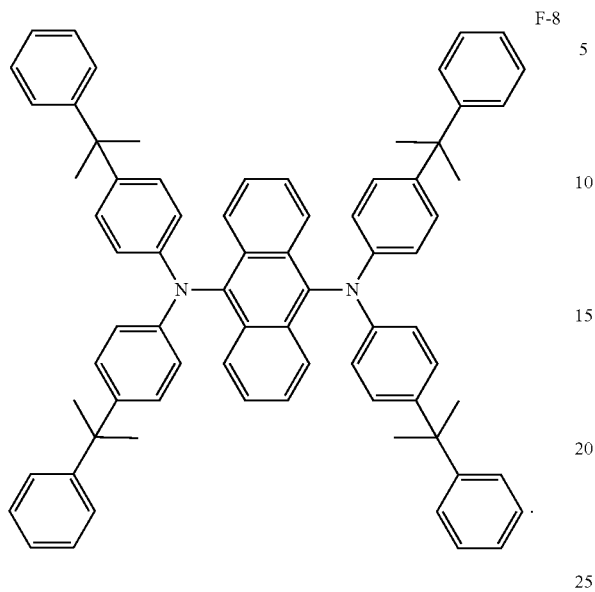

F-8

18. The organic electroluminescent device of claim 17, wherein an energy level difference between the singlet energy level ($S_1$) and the triplet energy level ($T_1$) of the exciplex is less than 0.15 eV.

19. The organic electroluminescent device of claim 17, wherein the electron donor material further comprises one selected from the group consisting of:

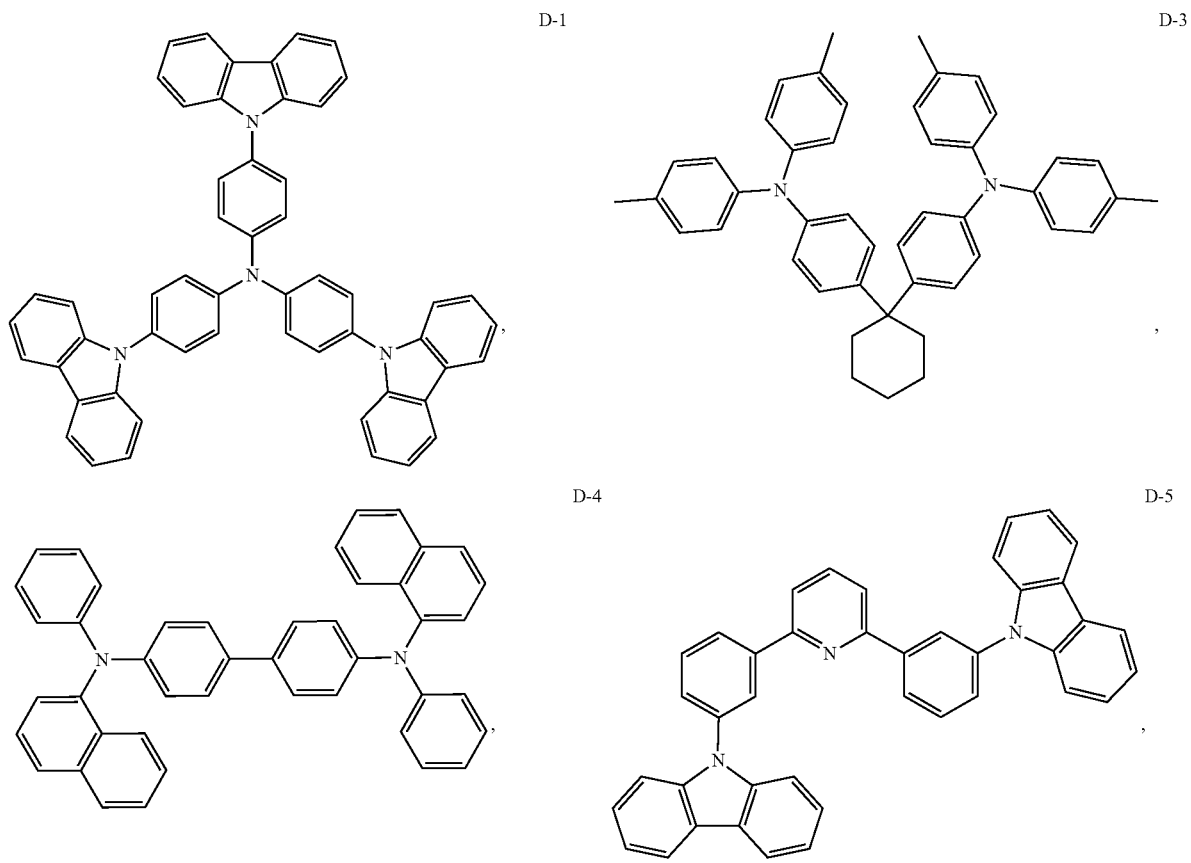

-continued
D-6
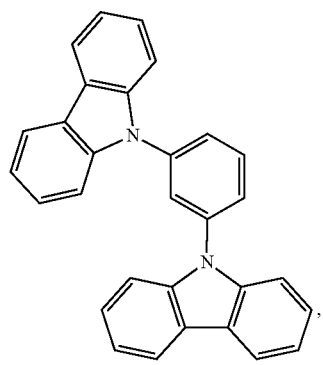
D-7
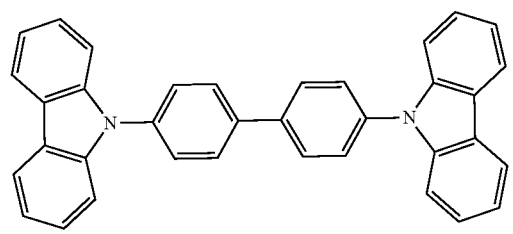
D-8
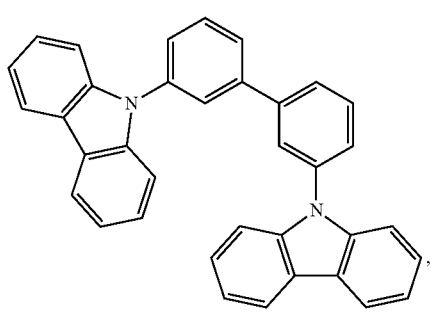
D-9
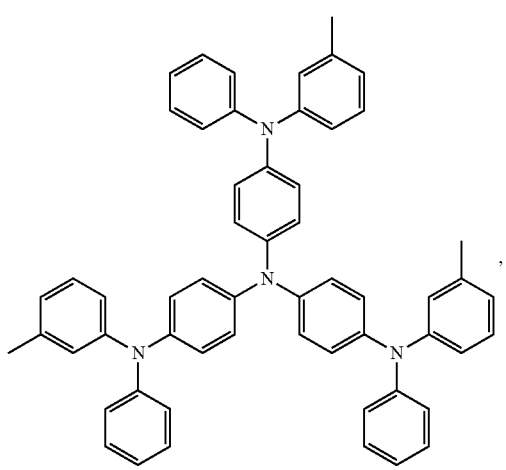
D-10
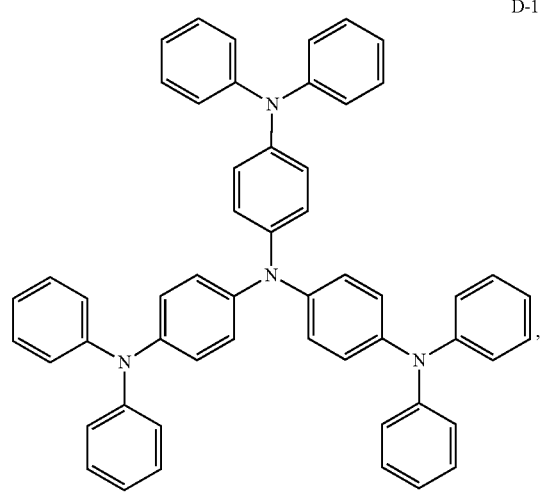
D-11
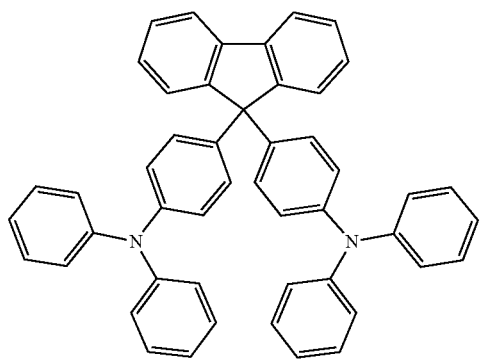
D-12
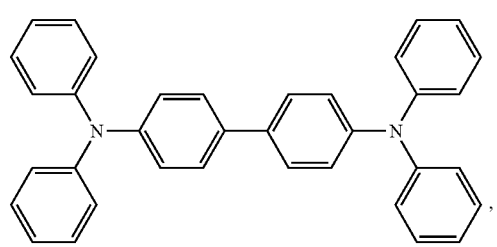

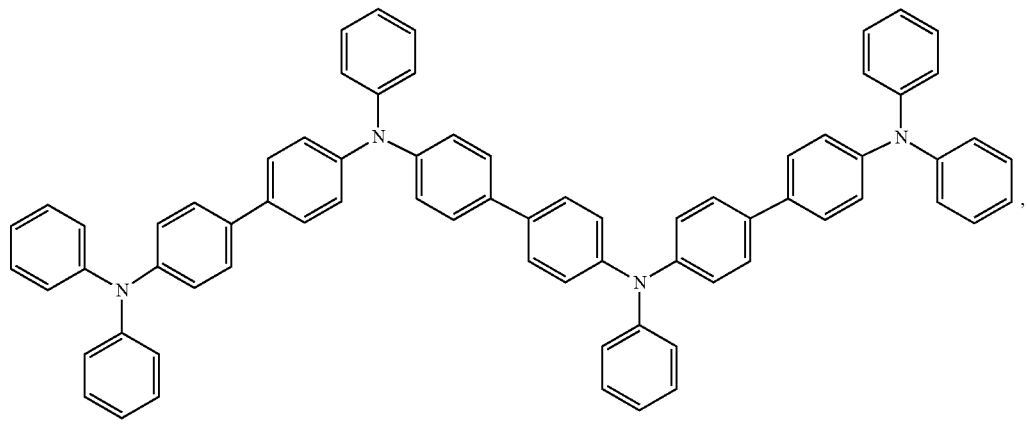
D-13
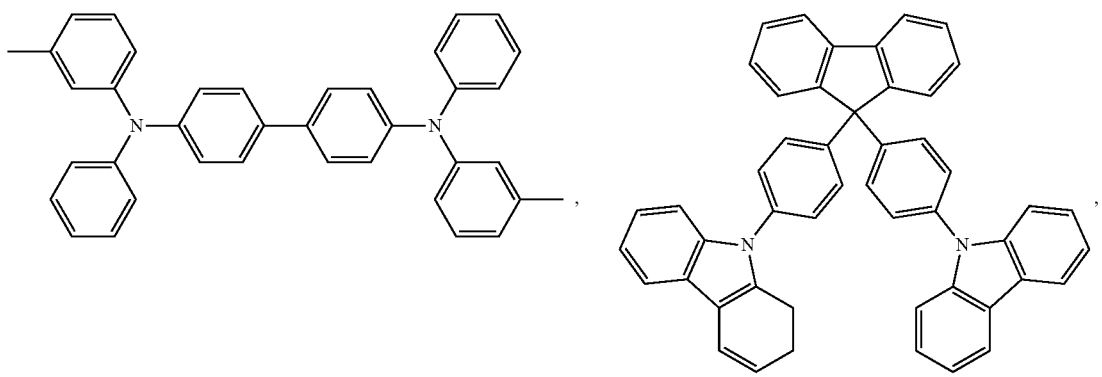
D-4
D-15
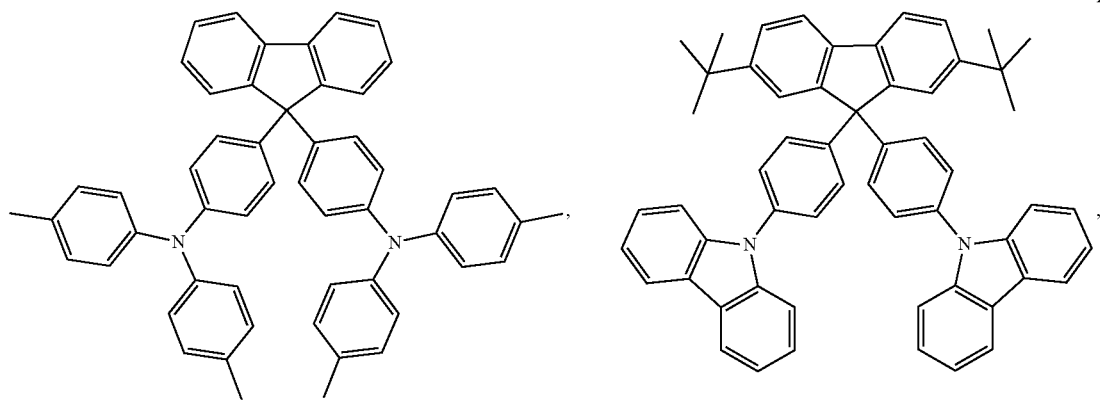
D-16
D-17

-continued
D-18
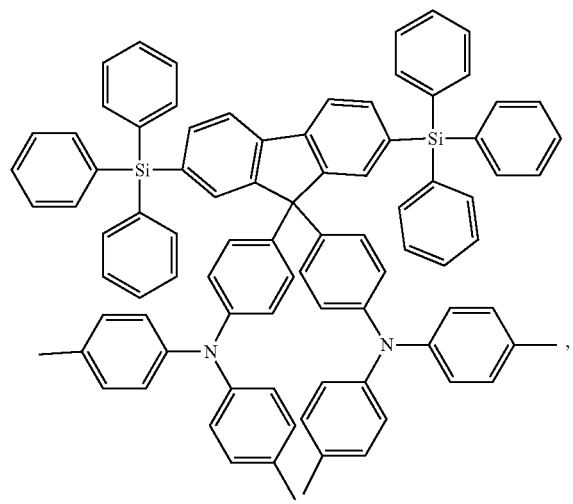
D-19
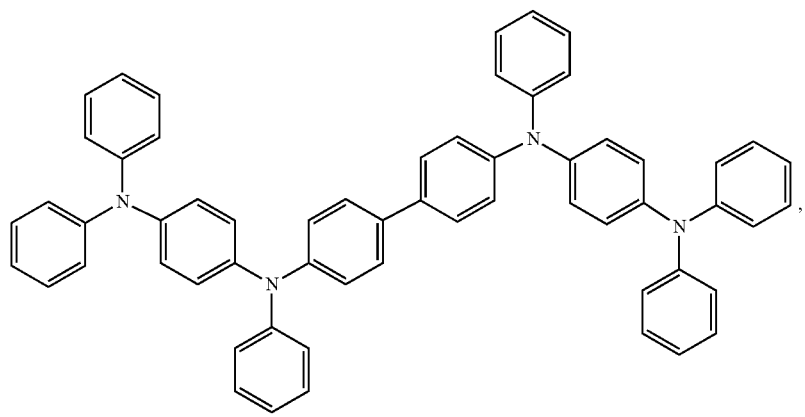
and any combinations thereof.
* * * * *